United States Patent
Hirano et al.

(10) Patent No.: US 9,469,712 B2
(45) Date of Patent: Oct. 18, 2016

(54) METHOD OF PRODUCING POLYMERIC COMPOUND, RESIST COMPOSITION AND METHOD OF FORMING RESIST PATTERN

(71) Applicant: Tokyo Ohka Kogyo Co., Ltd., Kawasaki (JP)

(72) Inventors: Tomoyuki Hirano, Kawasaki (JP); Yoshiyuki Utsumi, Kawasaki (JP); Junichi Tsuchiya, Kawasaki (JP); Yoichi Hori, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/205,986

(22) Filed: Mar. 12, 2014

(65) Prior Publication Data
US 2014/0272727 A1 Sep. 18, 2014

(30) Foreign Application Priority Data
Mar. 18, 2013 (JP) ................. 2013-055776

(51) Int. Cl.
| | |
|---|---|
| C08F 224/00 | (2006.01) |
| C08F 228/06 | (2006.01) |
| G03F 7/039 | (2006.01) |
| G03F 7/20 | (2006.01) |
| G03F 7/004 | (2006.01) |

(52) U.S. Cl.
CPC ........... *C08F 224/00* (2013.01); *G03F 7/0045* (2013.01); *G03F 7/0046* (2013.01); *G03F 7/0397* (2013.01); *G03F 7/2041* (2013.01); *C08F 228/06* (2013.01)

(58) Field of Classification Search
None
See application file for complete search history.

(56) References Cited

U.S. PATENT DOCUMENTS

| | | |
|---|---|---|
| 2004/0110085 A1 | 6/2004 | Iwai et al. |
| 2009/0068590 A1 | 3/2009 | Dazai et al. |
| 2009/0197204 A1 | 8/2009 | Shiono et al. |
| 2009/0317743 A1 | 12/2009 | Shiono et al. |
| 2010/0310985 A1 | 12/2010 | Mori et al. |
| 2011/0117499 A1 | 5/2011 | Matsumiya et al. |
| 2012/0009520 A1* | 1/2012 | Takeshita et al. ......... 430/270.1 |
| 2013/0137049 A1* | 5/2013 | Shiono et al. ........ G03F 7/0397 430/325 |

FOREIGN PATENT DOCUMENTS

| | | |
|---|---|---|
| JP | A-2003-241385 | 8/2003 |
| JP | A-2009-025707 | 2/2009 |
| JP | A-2009-062491 | 3/2009 |
| JP | A-2010-002870 | 1/2010 |
| JP | A-2010-032994 | 2/2010 |
| JP | A-2010-277043 | 12/2010 |
| JP | A-2011-013569 | 1/2011 |
| JP | A-2011-128226 | 6/2011 |

* cited by examiner

*Primary Examiner* — Cynthia Hamilton
(74) *Attorney, Agent, or Firm* — Knobbe Martens Olson & Bear LLP

(57) ABSTRACT

A method of producing a copolymer, including copolymerizing a monomer (am0) containing a partial structure represented by formula (am0-1) shown below, a monomer (am1) containing an acid decomposable group which exhibits increased polarity by the action of acid and a monomer (am5) containing an —SO$_2$— containing cyclic group in the presence of a nitrogen-containing compound (X) having a conjugated acid with an acid dissociation constant of less than 10 (in the formula, *0 to *4 each represents a valence bond).

(am0-1)

17 Claims, No Drawings

METHOD OF PRODUCING POLYMERIC COMPOUND, RESIST COMPOSITION AND METHOD OF FORMING RESIST PATTERN

TECHNICAL FIELD

The present invention relates to a method of producing a polymeric compound, a resist composition and a method of forming a resist pattern.

Priority is claimed on Japanese Patent Application No. 2013-055776, filed Mar. 18, 2013, the content of which is incorporated herein by reference.

RELATED ART

In lithography techniques, for example, a resist film composed of a resist material is formed on a substrate, and the resist film is subjected to selective exposure of radial rays such as light or electron beam through a mask having a predetermined pattern, followed by development, thereby forming a resist pattern having a predetermined shape on the resist film.

A resist material in which the exposed portions become soluble in a developing solution is called a positive-type, and a resist material in which the exposed portions become insoluble in a developing solution is called a negative-type.

In recent years, in the production of semiconductor elements and liquid crystal display elements, advances in lithography techniques have led to rapid progress in the field of pattern miniaturization.

Typically, these miniaturization techniques involve shortening the wavelength (increasing the energy) of the exposure light source. Conventionally, ultraviolet radiation typified by g-line and i-line radiation has been used, but nowadays KrF excimer lasers and ArF excimer lasers are starting to be introduced in mass production. Furthermore, research is also being conducted into lithography techniques that use an exposure light source having a wavelength shorter (energy higher) than these excimer lasers, such as electron beam, extreme ultraviolet radiation (EUV), and X ray.

Resist materials for use with these types of exposure light sources require lithography properties such as a high resolution capable of reproducing patterns of minute dimensions, and a high level of sensitivity to these types of exposure light sources.

Conventionally, as a resist material that satisfies these conditions, a chemically amplified composition is used, which includes an acid-generator component that generates acid upon exposure and a base material component that exhibits a changed solubility in a developing solution under the action of acid.

As the base component used in a chemically amplified resist composition, a resin (base resin) is generally used.

For example, in the case of forming a positive-tone resist pattern by an alkali developing process using an alkali developing solution as the developing solution, a chemically amplified resist which contains an acid generator and a resin composition that exhibits increased solubility in an alkali developing solution by the action of acid is generally used. If the resist film formed using the resist composition is selectively exposed during formation of a resist pattern, then within the exposed portions, acid is generated from the acid-generator component, and the action of this acid causes an increase in the solubility of the resin component in an alkali developing solution, making the exposed portions soluble in the alkali developing solution. Thus, by conducting alkali developing, the unexposed portions remain to form a positive resist pattern.

As the resin component, a resin that exhibits increased polarity by the action of acid is generally used. When the polarity increases, the solubility of the resin in an alkali developing solution is increased, whereas the solubility of the resin in an organic solvent decreases. Therefore, when such a base resin is applied to a solvent developing process using a developing solution containing an organic solvent (organic developing solution) instead of an alkali developing process, the solubility of the exposed portions in an organic developing solution is decreased. As a result, in the solvent developing process, the unexposed portions of the resist film are dissolved and removed by the organic developing solution, and a negative resist pattern in which the exposed portions are remaining is formed. Such a solvent developing process for forming a negative-tone resist composition is sometimes referred to as "negative-tone developing process" (for example, see Patent Document 1).

Currently, resins that contain structural units derived from (meth)acrylate esters within the main chain (acrylic resins) are now widely used as base resins for resist compositions that use ArF excimer laser lithography, as they exhibit excellent transparency in the vicinity of 193 nm (for example, see Patent Document 2).

Here, the term "(meth)acrylate ester" is a generic term that includes either or both of the acrylate ester having a hydrogen atom bonded to the α-position and the methacrylate ester having a methyl group bonded to the α-position. The term "(meth)acrylate" is a generic term that includes either or both of the acrylate having a hydrogen atom bonded to the α-position and the methacrylate having a methyl group bonded to the α-position. The term "(meth)acrylic acid" is a generic term that includes either or both of acrylic acid having a hydrogen atom bonded to the α-position and methacrylic acid having a methyl group bonded to the α-position.

The base resin contains a plurality of structural units for improving lithography properties and the like. For example, in the case of a positive-type resist, a base resin containing a structural unit having an acid decomposable group that is dissociated by the action of acid generated from the acid-generator component (e.g., a group that contains an acid dissociable group), a structural unit having a polar group such as a hydroxy group, a structural unit having a lactone-ring structure (—O—C(O)—), and the like is typically used. In recent years, instead of a structural unit containing a lactone-ring structure, a structural unit containing a sultone ring (—O—$SO_2$—) has been used. These structural units enhance the adhesion to a substrate, and contribute to suppressing pattern collapse, thereby attracting attention (see for example, Patent Document 3).

DOCUMENTS OF RELATED ART

Patent Literature

[Patent Document 1] Japanese Unexamined Patent Application, First Publication No. 2009-25707

[Patent Document 2] Japanese Unexamined Patent Application, First Publication No. 2003-241385

[Patent Document 3] Japanese Unexamined Patent Application, First Publication No. 2009-62491

SUMMARY OF THE INVENTION

As further progress is made in lithography techniques and miniaturization of resist patterns, further improvement in resist materials has been demanded in terms of not only various lithography properties, but also reducing defects. The term "defects" refers to general deficiencies within a resist film that are detected when observed from directly above the developed resist pattern using, for example, a surface defect detection apparatus (product name: "KLA") manufactured by KLA-TENCOR Corporation. Examples of these deficiencies include deficiencies caused by adhesion of foreign matters and precipitates on the surface of the resist pattern, such as post-developing scum (residual resist), foam and dust; deficiencies related to resist pattern shape, such as bridges formed between line patterns, and filling-up of holes of a contact hole pattern; and color irregularities of a pattern.

In the case where a resist composition containing a resin component having a sultone ring and an acid decomposable group as described in Patent Document 3 is used, it is preferable that the above effects in terms of adhesion to a substrate and suppression of pattern collapse can be achieved, thereby enabling miniaturization of resist patterns.

However, with respect to a resin component having a sultone ring and an acid decomposable group, decomposition of the side chain is sometimes observed in the production of the resin component. Due to the influence of such decomposition, there was still room for reducing defects and improving lithography properties in the formation of a resist pattern using a resist composition containing such resin component.

The present invention takes the above circumstances into consideration, with an object of providing a method of producing a polymeric compound useful as a base component for a resist composition which enables to reduce generation of defects and achieve excellent lithography properties, a resist composition including the polymeric compound, and a method of forming a resist pattern using the resist composition.

A method of producing a copolymer according to one aspect of the present invention includes copolymerizing a monomer (am0) containing a partial structure represented by formula (am0-1) shown below, a monomer (am1) containing an acid decomposable group which exhibits increased polarity by the action of acid and a monomer (am5) containing an —SO$_2$— containing cyclic group in the presence of a nitrogen-containing compound (X) having a conjugated acid with an acid dissociation constant of less than 10.

[Chemical Formula 1]

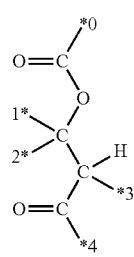

(am0-1)

In the formula, *0 to *4 each represents a valence bond.

In the above embodiment, the monomer (am0) is preferably a monomer containing a partial structure represented by general formula (am0-2) shown below.

[Chemical Formula 2]

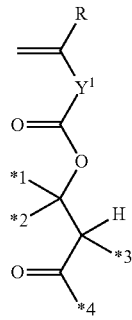

(am0-2)

In the formula, R represents a hydrogen atom, an alkyl group of 1 to 5 carbon atoms or a halogenated alkyl group of 1 to 5 carbon atoms; $Y^1$ represents a single bond or a divalent linking group; *1 to *4 each represents a valence bond.

In the above embodiment, the nitrogen-containing compound (X) is at least one compound selected from the group consisting of a compound represented by general formula (X1) shown below and a compound represented by general formula (X2) shown below.

[Chemical Formula 3]

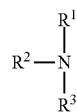

(X1)

(X2)

In the formulae, $R^1$ to $R^3$ each independently represents a hydrogen atom, an alkyl group of 1 to 15 carbon atoms which may have a substituent, a fluorinated alkyl group which may have a substituent or an aryl group, provided that two of $R^1$ to $R^3$ may be mutually bonded to form a ring, and at least one of $R^1$ to $R^3$ represents a fluorinated alkyl group, an aryl group or an aryl group containing a fluorine atom; $R^4$ is a group which forms an aromatic ring with the nitrogen atom bonded to the $R^4$ group; $R^5$ represents an alkyl group of 1 to 15 carbon atoms which may have a substituent, a halogen atom or an aryl group; and y represents an integer of 0 to 5.

In the above embodiment, the monomer (am5) containing an —SO$_2$— containing cyclic group is a monomer represented by general formula (am5-1) shown below.

[Chemical Formula 4]

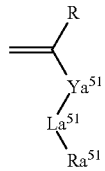

(am5-1)

In the formula, R is the same as defined above; $Ya^{51}$ represents a single bond or a divalent linking group; $La^{51}$ represents —O—, —COO—, —CON(R')—, —OCO—, —CONHCO— or —CONHCS—; R' represents a hydrogen atom or a methyl group; provided that, when $La^{51}$ represents —O—, $Ya^{51}$ does not represent —CO—; and $Ra^{51}$ represents an —$SO_2$— containing cyclic group.

Another aspect of the present invention is a resist composition including a polymeric compound produced by the method according to the above embodiment.

Still another aspect of the present invention is a method of forming a resist pattern using the resist composition of the above embodiment.

According to the present invention, there are provided a method of producing a polymeric compound useful as a base component for a resist composition which enables to reduce generation of defects and achieve excellent lithography properties, a resist composition including the polymeric compound, and a method of forming a resist pattern using the resist composition.

DETAILED DESCRIPTION OF THE
PREFERRED EMBODIMENTS

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified.

The term "alkylene group" includes linear, branched or cyclic, divalent saturated hydrocarbon, unless otherwise specified. The same applies for the alkyl group within an alkoxy group.

A "halogenated alkyl group" is a group in which part or all of the hydrogen atoms of an alkyl group is substituted with a halogen atom. Examples of the halogen atom include a fluorine atom, a chlorine atom, a bromine atom and an iodine atom.

A "fluorinated alkyl group" or a "fluorinated alkylene group" is a group in which part or all of the hydrogen atoms of an alkyl group or an alkylene group have been substituted with fluorine atom(s).

The term "structural unit" refers to a monomer unit that contributes to the formation of a polymeric compound (resin, polymer, copolymer).

A "structural unit derived from an acrylate ester" refers to a structural unit that is formed by the cleavage of the ethylenic double bond of an acrylate ester.

An "acrylate ester" refers to a compound in which the terminal hydrogen atom of the carboxy group of acrylic acid ($CH_2$=CH—COOH) has been substituted with an organic group.

The acrylate ester may have the hydrogen atom bonded to the carbon atom on the α-position substituted with a substituent. The substituent ($R^\alpha$) with which the hydrogen atom bonded to the carbon atom at the α-position is substituted is an atom other than the hydrogen atom or a group, and examples thereof include an alkyl group having from 1 to 5 carbon atoms, a halogenated alkyl group having from 1 to 5 carbon atoms, and a hydroxyalkyl group. A carbon atom on the α-position of an acrylate ester refers to the carbon atom bonded to the carbonyl group, unless specified otherwise.

Hereafter, an acrylate ester having the hydrogen atom bonded to the carbon atom on the α-position substituted with a substituent is sometimes referred to as "α-substituted acrylate ester". Further, acrylate esters and α-substituted acrylate esters are collectively referred to as "(α-substituted) acrylate ester".

A "structural unit derived from hydroxystyrene or a hydroxystyrene derivative" refers to a structural unit that is formed by the cleavage of the ethylenic double bond of hydroxystyrene or a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof. Examples of the derivatives thereof include hydroxystyrene in which the hydrogen atom of the hydroxy group has been substituted with an organic group and may have the hydrogen atom on the α-position substituted with a substituent; and hydroxystyrene which has a substituent other than a hydroxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

As the substituent which substitutes the hydrogen atom on the α-position of hydroxystyrene, the same substituents as those described above for the substituent on the α-position of the aforementioned α-substituted acrylate ester can be mentioned.

A "structural unit derived from vinylbenzoic acid or a vinylbenzoic acid derivative" refers to a structural unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include benzoic acid in which the hydrogen atom of the carboxy group has been substituted with an organic group and may have the hydrogen atom on the α-position substituted with a substituent; and benzoic acid which has a substituent other than a hydroxy group and a carboxy group bonded to the benzene ring and may have the hydrogen atom on the α-position substituted with a substituent. Here, the α-position (carbon atom on the α-position) refers to the carbon atom having the benzene ring bonded thereto, unless specified otherwise.

The term "styrene" is a concept including styrene and compounds in which the hydrogen atom at the α-position of styrene is substituted with other substituent such as an alkyl group and a halogenated alkyl group.

A "structural unit derived from styrene" or "structural unit derived from a styrene derivative" refers to a structural unit that is formed by the cleavage of the ethylenic double bond of styrene or a styrene derivative.

As the alkyl group as a substituent on the α-position, a linear or branched alkyl group is preferable, and specific examples include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group and a neopentyl group.

Specific examples of the halogenated alkyl group as the substituent on the α-position include groups in which part or all of the hydrogen atoms of the aforementioned "alkyl group as the substituent on the α-position" are substituted with halogen atoms. Examples of the halogen atom include a fluorine atom, a chlorine atom, a bromine atom and an iodine atom, and a fluorine atom is particularly desirable.

Specific examples of the hydroxyalkyl group of 1 to 5 carbon atoms as the substituent on the α-position include groups in which part or all of the hydrogen atoms of the aforementioned "alkyl group as the substituent on the α-position" are substituted with a hydroxy group. The number of hydroxy groups within the hydroxyalkyl group is preferably 1 to 5, and most preferably 1.

The case of describing "may have a substituent" includes both of the case where the hydrogen atom (—H) is substituted with a monovalent group and the case where the methylene group (—$CH_2$—) is substituted with a divalent group.

The term "exposure" is used as a general concept that includes irradiation with any form of radiation.

<<Production Method of Polymeric Compound>>

A method of producing a copolymer according to one aspect of the present invention includes copolymerizing a monomer (am0) containing a partial structure represented by formula (am0-1) shown below, a monomer (am1) containing an acid decomposable group which exhibits increased polarity by the action of acid and a monomer (am5) containing an —$SO_2$— containing cyclic group in the presence of a nitrogen-containing compound (X) in which a conjugated acid thereof has an acid dissociation constant of less than 10.

In the present specification, a "polymeric compound" refers to a polymer having a molecular weight of 1,000 or more. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

In the present specification, a "monomer" referred to in the explanation of the method of producing a polymeric compound contains a polymerizable group, even though not particularly specified. In the present specification, the polymerizable group preferably has an ethylenic double bond.

Specifically, the polymeric compound can be produced by copolymerizing a monomer (am0) containing a partial structure represented by formula (am0-1), a monomer (am1) containing an acid decomposable group which exhibits increased polarity by the action of acid and a monomer (am5) containing an —$SO_2$— containing cyclic group in the presence of a nitrogen-containing compound (X) in which a conjugated acid thereof has an acid dissociation constant of less than 10.

In the polymerization, by using a chain transfer agent such as HS—$CH_2$—$CH_2$—$CH_2$—$C(CF_3)_2$—OH, a —$C(CF_3)_2$—OH group can be introduced.

Such a copolymer having introduced a hydroxyalkyl group in which some of the hydrogen atoms of the alkyl group are substituted with fluorine atoms is effective in reducing developing defects and LER (line edge roughness: unevenness of the side walls of a line pattern).

The monomer (am0) containing a partial structure represented by formula (am0-1), the monomer (am1) containing an acid decomposable group which exhibits increased polarity by the action of acid and the monomer (am5) containing an —$SO_2$— containing cyclic group will be described later.

In the present invention, in addition to the monomer (am0) containing a partial structure represented by formula (am0-1), the monomer (am1) containing an acid decomposable group which exhibits increased polarity by the action of acid and the monomer (am5) containing an —$SO_2$— containing cyclic group, a monomer for deriving a structural unit to be introduced to the polymeric compound may be used if desired. However, in the production method of the present invention, a monomer which generates acid upon exposure is not used. By virtue of not using a monomer which generates acid upon exposure, in the production of a polymeric compound, no acid is generated from the monomers, which may decompose the acid decomposable group during the production of the polymeric compound. Therefore, in the present invention, by using 0.001 to 1.0 mol % of a basic compound, based on the monomer containing an —$SO_2$— containing cyclic group, a polymeric compound preferable as a base component of a resist composition can be produced.

The monomer for deriving a structural unit to be introduced to the polymeric compound if desired is not particularly limited, as long as it is copolymerizable with the monomer (am0) containing a partial structure represented by formula (am0-1), the monomer (am1) containing an acid decomposable group which exhibits increased polarity by the action of acid and the monomer (am5) containing an —$SO_2$— containing cyclic group. Specific examples of such monomer include monomers for deriving structural units (a2) to (a4) described later. As the monomer, a commercially available monomer may be used, or the monomer may be synthesized by a conventional method.

The amount of each monomer (the monomer (am0) containing a partial structure represented by formula (am0-1), the monomer (am1) containing an acid decomposable group which exhibits increased polarity by the action of acid and the monomer (am5) containing an —$SO_2$— containing cyclic group and monomer(s) for deriving structural unit(s) to be introduced to the polymeric compound if desired) can be appropriately selected depending on the copolymer compositional ratio, i.e., the ratio of the structural units in the polymeric compound. The copolymer compositional ratio of the polymeric compound to be used as a base component of a resist composition will be described later in the explanation of the second aspect.

The polymerization initiator is not particularly limited, and examples thereof include azobisisobutyronitrile (AIBN) and dimethyl 2,2'-azobis(isobutyrate).

The polymerization solvent is capable of dissolving raw materials, i.e., the monomer (am0) containing a partial structure represented by formula (am0-1), the monomer (am1) containing an acid decomposable group which exhibits increased polarity by the action of acid, the monomer (am5) containing an —$SO_2$— containing cyclic group and monomer(s) for deriving structural unit(s) to be introduced to the polymeric compound if desired, and examples thereof include ethyl lactate, γ-butyrolactone, methyl ethyl ketone, propylene glycol monomethylether acetate, tetrahydrofuran, and a mixed solvent containing any of these solvents.

Specific examples of the nitrogen-containing compound (X) having a conjugated acid with an acid dissociation constant (pKa) of 10 or less will be described later.

The nitrogen-containing compound (X) may be further added to the polymerization solvent having the monomers and the polymerization initiator added thereto; the basic compound may be added to the polymerization solvent together with the monomers and the polymerization initiator; or the basic compound may be added to a monomer solution of any of the monomers in advance. It is preferable that the nitrogen-containing compound (X) be present when the monomer (am0) containing a partial structure represented by formula (am0-1), the monomer (am1) containing an acid decomposable group which exhibits increased polarity by the action of acid and the monomer (am5) containing an —$SO_2$— containing cyclic group come into contact with each other, and it is more preferable that the nitrogen-containing compound (X) be added to a solution having the monomer containing an —SO$_2$— containing cyclic group dissolved therein in advance.

The amount of the nitrogen-containing compound (X) used, based on the monomer containing an —SO$_2$— containing cyclic group is preferably 0.001 to 1.0 mol %, more preferably 0.001 to 0.5 mol %, still more preferably 0.005 to 0.3 mol %, and most preferably 0.01 to 0.3 mol %. When the amount of the basic compound is at least as large as 0.001 mol %, decomposition of the acid decomposable group caused by the influence of the monomer containing an —SO$_2$— containing cyclic group can be suppressed. On the other hand, when the amount of the nitrogen-containing compound (X) is no more than 1.0 mol %, decomposition of bonds within the monomers used (e.g., ester bond and the like) caused by excess nitrogen-containing compound (X) can be suppressed, and retention of the nitrogen-containing compound (X) after the synthesis of the polymeric compound can be suppressed.

The reaction temperature is preferably within the range of 50 to 100° C., and more preferably 65 to 85° C.

The reaction time varies, depending on the reactivity of the monomers, the reaction temperature, and the like. However, in general, the reaction time is preferably 60 to 480 minutes, and more preferably 120 to 420 minutes.

After polymerizing the monomers, for example, the reacted polymer solution is dropwise added to excess water or organic solvent (isopropanol, hexane, heptane, methanol or the like) so as to precipitate a polymeric compound, followed by filtration, thereby obtaining the polymeric compound.

Further, it is also preferable to wash the thus obtained polymeric compound with an organic solvent. Specifically, after allowing an organic solvent or the like to come into contact with the polymeric compound, filtration, drying and the like are conducted, thereby conducting the washing. Depending on the organic solvent used, unreacted monomers can be removed, or the basic compound can be removed. For example, in the case where triethylamine or aniline is used as the basic compound, an alcohol solvent such as ethanol can be used as the washing solvent, so as to remove the basic compound after the production of the polymeric compound.

Furthermore, if desired, the synthesized, washed polymeric compound can be separated and purified. The separation and purification can be conducted by a conventional method. For example, any one of concentration, solvent extraction, distillation, crystallization, recrystallization and chromatography can be used alone, or two or more of these methods may be used in combination.

[Monomer (am0)]

In the present invention, the monomer (am0) contains a partial structure represented by formula (am0-1) shown below.

[Chemical Formula 5]

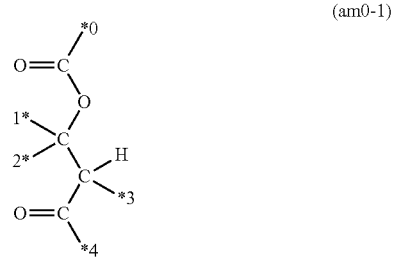

(am0-1)

In the formula, *0 to *4 each represents a valence bond.

In formula (am0-1), *0 to *4 each represents a valence bond. In the present invention, the monomer (am0) is not particularly limited, as long as the monomer (am0) contains a partial structure represented by formula (am0-1) shown below.

In formula (am0-1), at least one of the valence bonds *0 to *4 is bonded to a polymerizable group. The other valence bonds may be bonded to a carbon atom constituting the monomer (am0), or bonded to a hydrogen atom or an arbitrary substituent.

In formula (am0-1), the valence bond *0 is preferably bonded to a group containing a polymerizable group.

In formula (am0-1), each of the valence bonds *1 to *3 is preferably bonded to a hydrogen atom, a halogen atom or an alkyl group. As the alkyl group, a linear or branched alkyl group is preferable, and specific examples include a methyl group, an ethyl group, a propyl group, an isopropyl group, a butyl group, an isobutyl group, a sec-butyl group, a tert-butyl group, a pentyl group, an isopentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group and a norbornyl group. The above alkyl groups may have, as a substituent, a halogen atom, a halogenated alkyl group (having 1 to 4 carbon atoms), a hydroxy group, an alkoxy group (having 1 to 4 carbon atoms), a carbonyl group, a carboxyl group and/or an alkoxycarbonyl group (having 2 to 6 carbon atoms).

In the present invention, in formula (am0-1), each of the valence bonds *1 and *3 is preferably bonded to a hydrogen atom.

In formula (am0-1), the valence bond *4 may be bonded to a hydrogen atom or the aforementioned alkyl group, or an acid dissociable group (acid decomposable group) within the structural unit (a1) described later, a lactone-containing cyclic group or a carbonate-containing cyclic group within the structural unit (a2) described later, the polar group-containing aliphatic hydrocarbon group with the structural unit (a3) described later or an acid non-dissociable cyclic group within the structural unit (a4) described later. The above functional substituents may be appropriately selected depending on the objective use of the polymeric compound to be produced.

Alternatively, the valence bond *4 may be bonded to a substituent containing the —O—C—CH—(C=O)— bond (wherein the valence bonds *1 to *3 are omitted) within formula (am0-1).

Alternatively, the valence bond *4 may be bonded to the valence bond *2 or *3 and a specific group (e.g., an alkylene group which may have a substituent) to form a ring, preferably bonded to the valence bond *2 and a specific group (e.g., an alkylene group which may have a substituent) to form a ring.

Examples of the alkylene group include linear or branched alkylene groups, and linear alkylene groups are preferable. Examples of linear alkylene groups include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—], and an ethylene group [—(CH$_2$)$_2$—] or a trimethylene group [—(CH$_2$)$_3$—] is preferable.

Examples of branched alkylene groups include alkylethylene groups such as —CH(CH$_3$)CH$_2$—, —CH(CH$_3$)CH (CH$_3$)—, —C(CH$_3$)$_2$CH$_2$—, —CH(CH$_2$CH$_3$)CH$_2$— and —C(CH$_2$CH$_3$)$_2$—CH$_2$—; and alkyltrimethylene groups such as —CH(CH$_3$)CH$_2$CH$_2$— and —CH$_2$CH(CH$_3$)CH$_2$—.

Examples of substituents for the aforementioned alkylene groups include an oxygen atom, an alkyl group (having 1 to 4 carbon atoms), a halogen atom, a hydroxy group, an alkoxy group (having 1 to 4 carbon atoms), a carbonyl group, a carboxyl group and an alkoxycarbonyl group (having 2 to 6 carbon atoms). Examples of the substituent for the alkyl group, the alkoxy group, the alkoxycarbonyl group and the like include a hydroxy group, a halogen atom and an alkoxy group.

In the present invention, in formula (am0-1), the hydrogen atom bonded to the carbon atom having the valence bond *3 is capable of becoming an active proton.

In the present invention, the monomer (am0) may contain one partial structure represented by formula (am0-1), or two partial structures represented by formula (am0-1).

In the present invention, the monomer (am0) preferably contains a partial structure represented by general formula (am0-2) shown below.

[Chemical Formula 6]

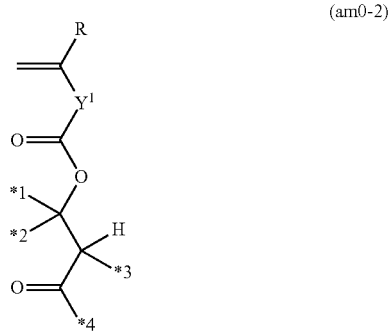

(am0-2)

In the formula, R represents a hydrogen atom, an alkyl group of 1 to 5 carbon atoms or a halogenated alkyl group of 1 to 5 carbon atoms; Y$^1$ represents a single bond or a divalent linking group; *1 to *4 each represents a valence bond.

In general formula (am0-2), R represents a hydrogen atom, an alkyl group of 1 to 5 carbon atoms or a halogenated alkyl group of 1 to 5 carbon atoms.

As the alkyl group of 1 to 5 carbon atoms for R, a linear or branched alkyl group is preferable, and specific examples thereof include a methyl group, an ethyl group, a propyl group, an isopropyl group, an n-butyl group, an isobutyl group, a tert-butyl group, a pentyl group, an isopentyl group and a neopentyl group.

Examples of the halogenated alkyl group of 1 to 5 carbon atoms for R include groups in which part or all of the hydrogen atoms within the aforementioned alkyl groups of 1 to 5 carbon atoms have been substituted with a halogen atom. Examples of the halogen atom include a fluorine atom, a chlorine atom, a bromine atom and an iodine atom, and a fluorine atom is particularly desirable.

In formula (am0-2), Y$^1$ represents a single bond or a divalent linking group.

The divalent linking group for Y$^1$ is not particularly limited, and preferable examples thereof include a divalent hydrocarbon group which may have a substituent and a divalent linking group containing a hetero atom. Further, the divalent linking group represented by Y$^1$ may contain a partial structure represented by the aforementioned formula (am0-1).

(Divalent Hydrocarbon Group which May have a Substituent)

The hydrocarbon group as a divalent linking group may be either an aliphatic hydrocarbon group or an aromatic hydrocarbon group.

An "aliphatic hydrocarbon group" refers to a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof. Specifically, groups exemplified below for Va$^1$ in formula (a1-1) described later can be mentioned.

The linear or branched aliphatic hydrocarbon group may or may not have a substituent. Examples of the substituent include a fluorine atom, a fluorinated alkyl group of 1 to 5 carbon atoms, and a carbonyl group.

As examples of the hydrocarbon group containing a ring in the structure thereof, a cyclic aliphatic hydrocarbon group containing a hetero atom in the ring structure thereof and may have a substituent (a group in which two hydrogen atoms have been removed from an aliphatic hydrocarbon ring), a group in which the cyclic aliphatic hydrocarbon group is bonded to the terminal of the aforementioned chain-like aliphatic hydrocarbon group, and a group in which the cyclic aliphatic group is interposed within the aforementioned linear or branched aliphatic hydrocarbon group, can be given. As the linear or branched aliphatic hydrocarbon group, the same groups as those described above can be used.

The cyclic aliphatic hydrocarbon group preferably has 3 to 20 carbon atoms, and more preferably 3 to 12 carbon atoms.

Specific examples of the cyclic aliphatic hydrocarbon group include the same group as exemplified for Va$^1$ in formula (a1-1) described later.

The cyclic aliphatic hydrocarbon group may or may not have a substituent. Examples of the substituent include an alkyl group, an alkoxy group, a halogen atom, a halogenated alkyl group, a hydroxyl group and a carbonyl group.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Examples of the halogenated alkyl group for the substituent include groups in which part or all of the hydrogen atoms within the aforementioned alkyl groups has been substituted with the aforementioned halogen atoms.

The cyclic aliphatic hydrocarbon group may have part of the carbon atoms constituting the ring structure thereof substituted with a substituent containing a hetero atom. As the substituent containing a hetero atom, —O—, —C(=O)—O—, —S—, —S(=O)$_2$— or —S(=O)$_2$—O— is preferable.

Specific examples of the aromatic hydrocarbon group as a divalent hydrocarbon group include the same group as exemplified for Va$^1$ in formula (a1-1) described later.

With respect to the aromatic hydrocarbon group, the hydrogen atom within the aromatic hydrocarbon group may be substituted with a substituent. For example, the hydrogen atom bonded to the aromatic ring within the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group of 1 to 5 carbon atoms, and a methyl group, an ethyl group, a propyl group, an n-butyl group or a tert-butyl group is particularly desirable.

As the alkoxy group, the halogen atom and the halogenated alkyl group for the substituent, the same groups as the aforementioned substituent groups for substituting a hydrogen atom within the cyclic aliphatic hydrocarbon group can be used.

(Divalent Linking Group Containing a Hetero Atom)

With respect to a divalent linking group containing a hetero atom, a hetero atom is an atom other than carbon and hydrogen, and examples thereof include an oxygen atom, a nitrogen atom, a sulfur atom and a halogen atom.

In the case where Y$^1$ represents a divalent linking group containing a hetero atom, preferable examples of the linking group include —O—, —C(=O)—O—, —C(=O)—, —O—C(=O)—O—, —C(=O)—NH—, —NH—, —NH—C(=NH)— (wherein H may be substituted with a substituent such as an alkyl group or an acyl group), —S—, —S(=O)$_2$—, —S(=O)$_2$—O—, a group represented by general formula —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— or —Y$^{21}$—O—X(=O)—Y$^{22}$— [in the formulae, Y$^{21}$ and Y$^{22}$ each independently represents a divalent hydrocarbon group which may have a substituent, and O represents an oxygen atom; and m' represents an integer of 0 to 3.

The divalent linking group containing a hetero atom represents —C(=O)—NH—, —NH—, or —NH—C(=NH)—, H may be substituted with a substituent such as an alkyl group, an acyl group or the like. The substituent (an alkyl group, an acyl group or the like) preferably has 1 to 10 carbon atoms, more preferably 1 to 8, and most preferably 1 to 5.

In formulae —Y$^{21}$—O—Y$^{22}$—, —Y$^{21}$—O—, —Y$^{21}$—C(=O)—O—, —C(=O)—O—Y$^{21}$, —[Y$^{21}$—C(=O)—O]$_{m'}$—Y$^{22}$— and —Y$^{21}$—O—C(=)—Y$^{22}$—, Y$^{21}$ and Y$^{22}$ each independently represents a divalent hydrocarbon group which may have a substituent. Examples of the divalent hydrocarbon group include the same groups as those described above as the "divalent hydrocarbon group which may have a substituent" in the explanation of the aforementioned divalent linking group.

As Y$^{21}$, a linear aliphatic hydrocarbon group is preferable, more preferably a linear alkylene group, still more preferably a linear alkylene group of 1 to 5 carbon atoms, and a methylene group or an ethylene group is particularly desirable.

As Y$^{22}$, a linear or branched aliphatic hydrocarbon group is preferable, and a methylene group, an ethylene group or an alkylmethylene group is more preferable. The alkyl group within the alkylmethylene group is preferably a linear alkyl group of 1 to 5 carbon atoms, more preferably a linear alkyl group of 1 to 3 carbon atoms, and most preferably a methyl group.

In the group represented by the formula —[Y$^{21}$—C(=O)—O]$_{m'}$—Y$^{22}$—, m' represents an integer of 0 to 3, preferably an integer of 0 to 2, more preferably 0 or 1, and most preferably 1. Namely, it is particularly desirable that the group represented by the formula —[Y$^{21}$—C(=O)—O]$_{m'}$—Y$^{22}$— is a group represented by the formula —Y$^{21}$—C(=O)—O—Y$^{22}$—. Among these, a group represented by the formula —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, Y$^1$ preferably represents an ester bond [—C(=O)—O—], an ether bond (—O—), a linear or branched alkylene group, an aromatic hydrocarbon group, a combination of these, or a single bond.

In formula (am0-2), each of *1 to *4 represents a valence bond, provided that two of the valence bonds *2 to *4 may be mutually bonded to form a ring. The valence bonds *1 to *4 are the same as explained above.

In the present invention, in formula (am0-2), the hydrogen atom bonded to the carbon atom having the valence bond *3 is capable of becoming an active proton.

In the present invention, the monomer represented by general formula (am0-2) is preferably a monomer represented by general formula (am0-2-1) or (am0-2-2) shown below.

[Chemical Formula 7]

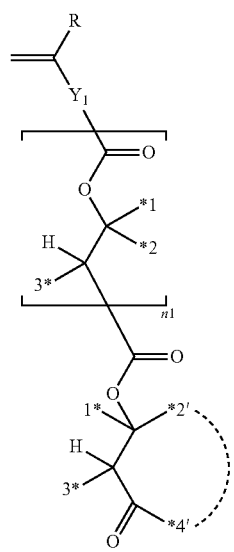

(am0-2-1)

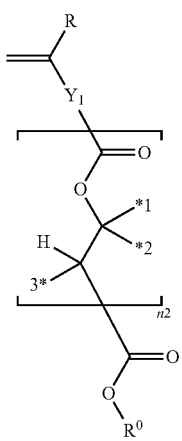

(am0-2-2)

In the formulae, R and $Y^1$ are the same as defined above; each of *1 to *3 represents a valence bond; *2' and *4' represent valence bonds which are mutually bonded to form a ring; $R^0$ represents a hydrogen atom, the aforementioned alkyl group or the aforementioned functional substituent; n1 represents 0 or 1; and n2 represents 1 or 2.

In formula (am0-2-1) or (am0-2-2), R, $Y^1$ and *1 to *3 are the same as explained above.

*2' and *4' are the same as defined above for the case where the valence bond *4 is bonded to the valence bond *2 and a specific group (e.g., an alkylene group which may have a substituent) to form a ring. The ring formed by the bonding of *2' and *4' is preferably monocyclic, and the ring skeleton of the monocyclic group preferably has 4 to 8 atoms, and more preferably 5 or 6 atoms.

The alkyl group for $R^0$ is the same as defined for the aforementioned alkyl group to which the valence bonds *1 to *3 may be bonded.

The functional substituent for $R^0$ is the same as defined for the aforementioned functional substituent to which the valence bond *4 may be bonded. That is, the functional substituent is an acid dissociable group (acid decomposable group) within the structural unit (a1) described later, a lactone-containing cyclic group or a carbonate-containing cyclic group within the structural unit (a2) described later, the polar group-containing aliphatic hydrocarbon group with the structural unit (a3) described later or an acid non-dissociable cyclic group within the structural unit (a4) described later.

Specific examples of the monomer (am0) are shown below. R is the same as defined above.

[Chemical Formula 8]

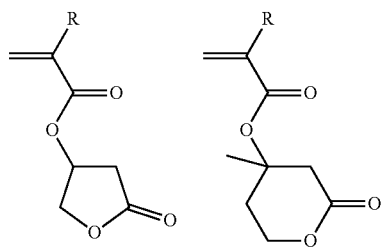

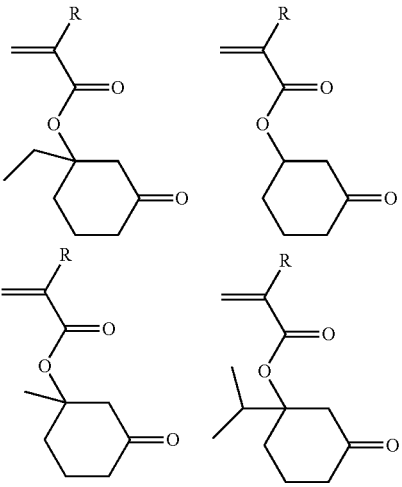

[Chemical Formula 9]

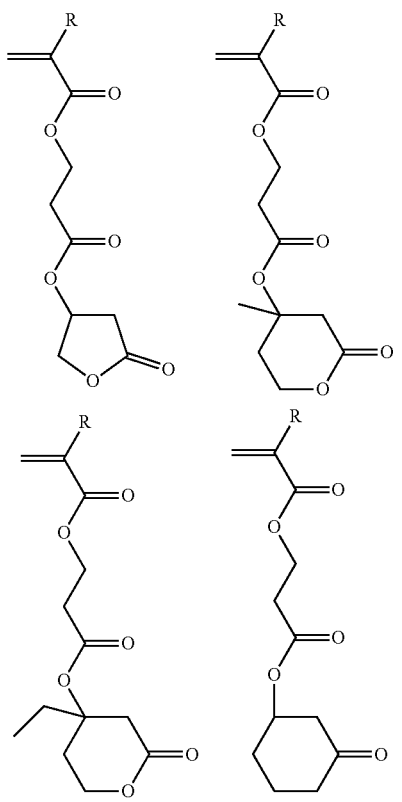

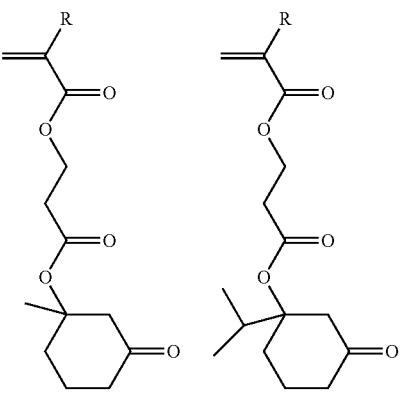

[Chemical Formula 10]

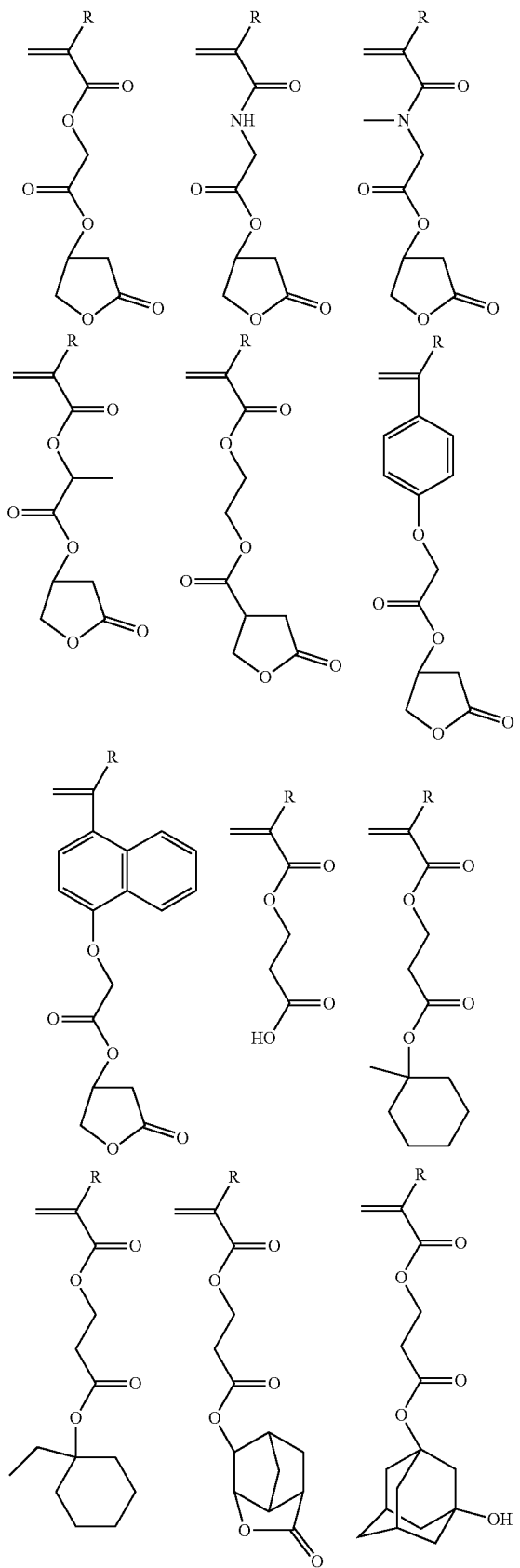

[Monomer (am1)]

The monomer (am1) is a monomer containing an acid decomposable group that exhibits increased polarity by the action of acid. The term "acid decomposable group" refers to a group in which at least a part of the bond within the structure thereof is cleaved by the action of an acid.

Examples of acid decomposable groups which exhibit increased polarity by the action of an acid include groups which are decomposed by the action of an acid to form a polar group.

Examples of the polar group include a carboxy group, a hydroxy group, an amino group and a sulfo group (—$SO_3H$). Among these, a polar group containing —OH in the structure thereof (hereafter, referred to as "OH-containing polar group") is preferable, a carboxy group or a hydroxy group is more preferable, and a carboxy group is particularly desirable.

More specifically, as an example of an acid decomposable group, a group in which the aforementioned polar group has been protected with an acid dissociable group (such as a group in which the hydrogen atom of the OH-containing polar group has been protected with an acid dissociable group) can be given.

The "acid dissociable group" refers to both (i) a group in which the bond between the acid dissociable group and the adjacent atom is cleaved by the action of acid; and (ii) a group in which one of the bonds is cleaved by the action of acid, and then a decarboxylation reaction occurs, thereby cleaving the bond between the acid dissociable group and the adjacent atom.

It is necessary that the acid dissociable group that constitutes the acid decomposable group is a group which exhibits a lower polarity than the polar group generated by the dissociation of the acid dissociable group. Thus, when the acid dissociable group is dissociated by the action of acid, a polar group exhibiting a higher polarity than that of the acid dissociable group is generated, thereby increasing the polarity.

The acid dissociable group is not particularly limited, and any of the groups that have been conventionally proposed as acid dissociable groups for the base resins of chemically amplified resists can be used.

Examples of the acid dissociable group for protecting the carboxy group or hydroxy group as a polar group include the acid dissociable group represented by general formula (a1-r-1) shown below (hereafter, for the sake of convenience, sometimes referred to as "acetal-type acid dissociable group").

[Chemical Formula 11]

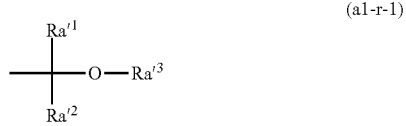

(a1-r-1)

In the formula, $Ra'^1$ and $Ra'^2$ each independently represents a hydrogen atom or an alkyl group; and $Ra'^3$ represents a hydrocarbon group, provided that $Ra'^3$ may be bonded to $Ra'^1$ or $Ra'^2$ to form a ring.

In formula (a1-r-1), as the lower alkyl group for $Ra'^1$ and $Ra'^2$, the same lower alkyl groups as those described above the alkyl groups as the substituent which may be bonded to the carbon atom on the α-position of the aforementioned α-substituted alkylester can be used, although a methyl group or ethyl group is preferable, and a methyl group is particularly desirable.

The hydrocarbon group for $Ra'^3$ is preferably an alkyl group of 1 to 20 carbon atoms, more preferably an alkyl group of 1 to 10 carbon atoms, and still more preferably a linear or branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group and a 2,2-dimethylbutyl group.

In the case where $Ra'^3$ represents a cyclic hydrocarbon group, the cyclic hydrocarbon group may be aliphatic or aromatic, and may be polycyclic or monocyclic. As the monocyclic aliphatic hydrocarbon group, a group in which 1 hydrogen atom has been removed from a monocycloalkane is preferable. The monocycloalkane preferably has 3 to 8 carbon atoms, and specific examples thereof include cyclopentane, cyclohexane and cyclooctane. As the polycyclic group, a group in which 1 hydrogen atom has been removed from a polycycloalkane is preferable, and the polycyclic group preferably has 7 to 12 carbon atoms. Examples of the polycycloalkane include adamantane, norbornane, isobornane, tricyclodecane and tetracyclododecane.

In the case where the hydrocarbon group is an aromatic hydrocarbon group, examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which 1 hydrogen atom has been removed from the aforementioned aromatic hydrocarbon ring (aryl group); and a group in which 1 hydrogen atom of the aforementioned aryl group has been substituted with an alkylene group (an arylalkyl group such as a benzyl group, a phenethyl group, a 1-naphthylmethyl group, a 2-naphthylmethyl group, a 1-naphthylethyl group or a 2-naphthylethyl group). The alkylene group (alkyl chain within the arylalkyl group) preferably has 1 to 4 carbon atom, more preferably 1 or 2, and most preferably 1.

In the case where $Ra'^3$ is bonded to $Ra'^1$ or $Ra'^2$ to form a ring, the cyclic group is preferably a 4 to 7-membered ring, and more preferably a 4 to 6-membered ring. Specific examples of the cyclic group include tetrahydropyranyl group and tetrahydrofuranyl group.

Examples of the acid dissociable group for protecting the carboxy group as a polar group include the acid dissociable group represented by general formula (a1-r-2) shown below (hereafter, with respect to the acid dissociable group represented by the following formula (a1-r-2), the acid dissociable group constituted of alkyl groups is referred to as "tertiary ester-type acid dissociable group").

[Chemical Formula 12]

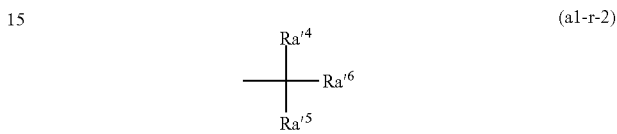

(a1-r-2)

In the formula, $Ra'^4$ to $Ra'^6$ each independently represents a hydrocarbon group, provided that $Ra'^5$ and $Ra'^6$ may be mutually bonded to form a ring.

As the hydrocarbon group for $Ra'^4$ to $Ra'^6$, the same groups as those described above for $Ra'^3$ can be mentioned. $Ra'^4$ is preferably an alkyl group having from 1 to 5 carbon atoms. In the case where $Ra'^5$ and $Ra'^6$ are mutually bonded to form a ring, a group represented by general formula (a1-r2-1) shown below can be mentioned.

On the other hand, in the case where $Ra'^4$ to $Ra'^6$ are not mutually bonded and independently represent a hydrocarbon group, the group represented by general formula (a1-r2-2) shown below can be mentioned.

[Chemical Formula 13]

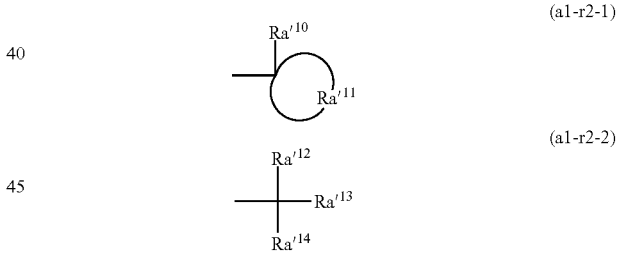

(a1-r2-1)

(a1-r2-2)

In the formulae, $Ra'^{10}$ represents an alkyl group of 1 to 10 carbon atoms; $Ra'^{11}$ is a group which forms an aliphatic cyclic group together with a carbon atom having $Ra'^{10}$ bonded thereto; and $Ra'^{12}$ to $Ra'^{14}$ each independently represents a hydrocarbon group.

In the formula (a1-r2-1), as the alkyl group of 1 to 10 carbon atoms for $Ra'^{10}$, the same groups as described above for the linear or branched alkyl group for $Ra'^3$ in the formula (a1-r-1) are preferable. In the formula (a1-r2-1), as the aliphatic cyclic group which is formed by $Ra'^{11}$, the same groups as those described above for the cyclic alkyl group for $Ra'^3$ in the formula (a1-r-1) are preferable.

In the formula (a1-r2-2), it is preferable that $Ra'^{12}$ and $Ra'^{14}$ each independently represents an alkyl group or 1 to 10 carbon atoms, and it is more preferable that the alkyl group is the same group as the described above for the linear or branched alkyl group for $Ra'^3$ in the formula (a1-r-1), it is still more preferable that the alkyl group is a linear alkyl group of 1 to 5 carbon atoms, and it is particularly preferable that the alkyl group is a methyl group or an ethyl group.

In the formula (a1-r2-2), it is preferable that $Ra'^{13}$ is the same group as described above for the linear, branched or cyclic alkyl group for $Ra'^3$ in the formula (a1-r-1).

Among these, the same cyclic alkyl group as those describe above for $Ra'^3$ is more preferable.

Specific examples of the formula (a1-r2-1) are shown below. In the formulae shown below, "*" represents a valence bond.

[Chemical Formula 14]

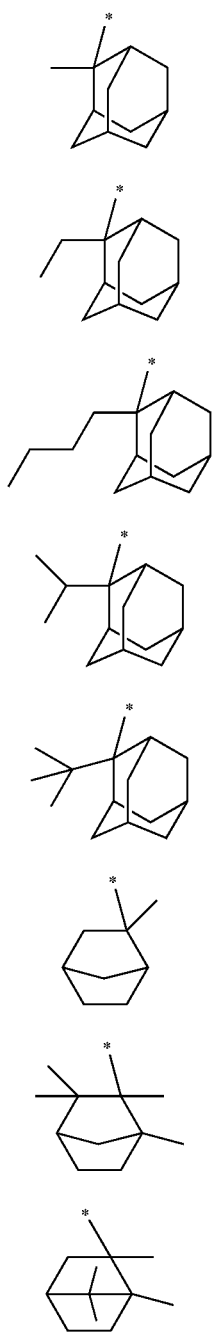

(r-pr-m1)

(r-pr-m2)

(r-pr-m3)

(r-pr-m4)

(r-pr-m5)

(r-pr-m6)

(r-pr-m7)

(r-pr-m8)

-continued

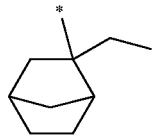

(r-pr-m9)

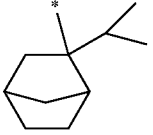

(r-pr-m10)

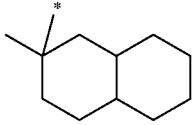

(r-pr-m11)

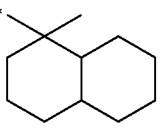

(r-pr-m12)

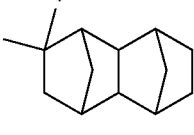

(r-pr-m13)

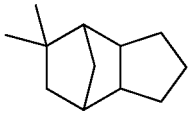

(r-pr-m14)

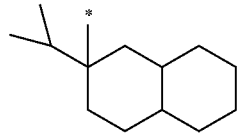

(r-pr-m15)

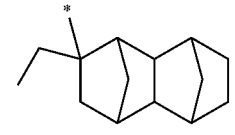

(r-pr-m16)

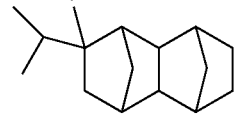

(r-pr-m17)

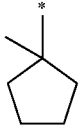

(r-pr-s1)

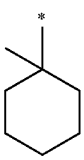

(r-pr-s2)

(r-pr-s3) 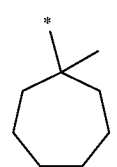
(r-pr-s4) 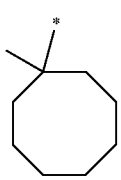
(r-pr-s5) 
(r-pr-s6) 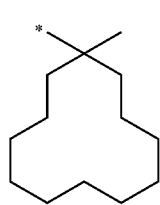
(r-pr-s7) 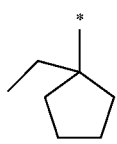
(r-pr-s8) 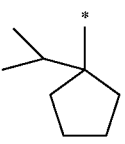
(r-pr-s9) 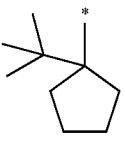
(r-pr-s10) 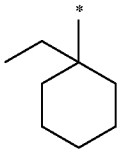
(r-pr-s11) 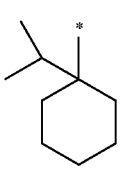
(r-pr-s12) 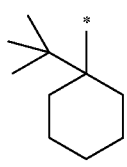
(r-pr-s13) 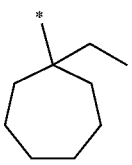
(r-pr-s14) 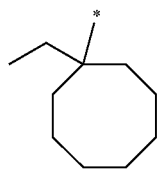
(r-pr-s15) 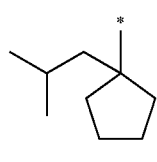
(r-pr-s16) 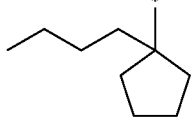
(r-pr-s17) 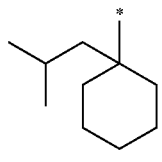
(r-pr-s18) 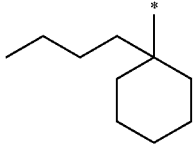
Specific examples of the formula (a1-r2-2) are shown below.
[Chemical Formula 15]
(r-pr-cm1) 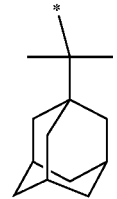

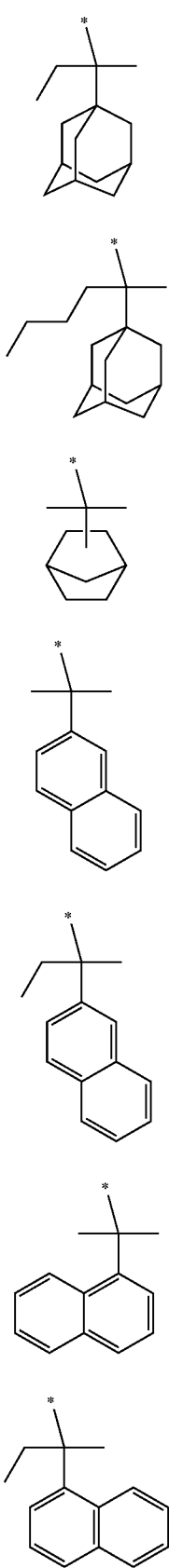
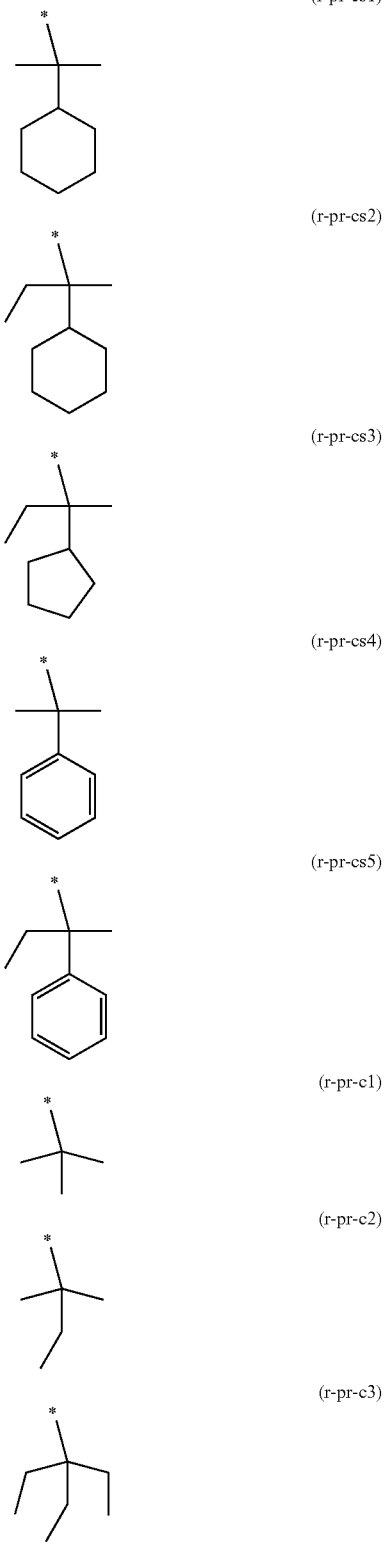
Examples of the acid dissociable group for protecting a hydroxy group as a polar group include the acid dissociable group represented by general formula (a1-r-3) shown below (hereafter, referred to as "tertiary alkyloxycarbonyl-type acid dissociable group").

[Chemical Formula 16]

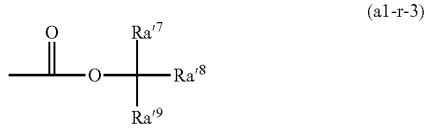

(a1-r-3)

In the formula, $Ra'^7$ to $Ra'^9$ each independently represents an alkyl group.

In the formula (a1-r-3), $Ra'^7$ to $Ra'^9$ is preferably an alkyl group of 1 to 5 carbon atoms, and more preferably an alkyl group of 1 to 3 carbon atoms.

Further, the total number of carbon atoms within the alkyl group is preferably 3 to 7, more preferably 3 to 5, and most preferably 3 or 4.

The monomer (am1) is not particularly limited as long as it is a monomer containing the aforementioned acid decomposable group and having an ethylenic double bond. Examples of the monomer (am1) include an acrylate ester which may have the hydrogen atom bonded to the carbon atom on the α-position substituted with a substituent and contains an acid decomposable group which exhibits increased polarity by the action of acid; hydroxystyrene or a hydroxystyrene derivative in which at least part of the hydrogen atom of the hydroxy group is protected with a substituent containing an acid decomposable group; and vinylbenzoic acid or a vinylbenzoic acid derivative in which at least part of the hydrogen atom within —C(=O)—OH is protected with a substituent containing an acid decomposable group.

Among these examples, monomers represented by general formulae (am1-1) or (am1-2) shown below are preferable.

[Chemical Formula 17]

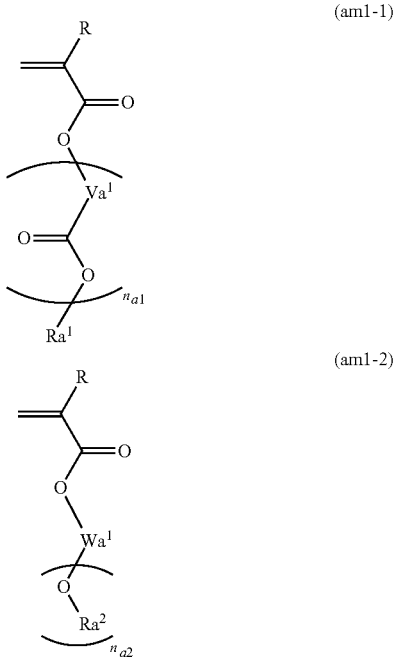

(am1-1)

(am1-2)

In the formulae, R represents a hydrogen atom, an alkyl group of 1 to 5 carbon atoms or a halogenated alkyl group of 1 to 5 carbon atoms; $Va^1$ represents a divalent hydrocarbon group which may contain an ether bond, an urethane bond or an amide bond; each $n_{a1}$ represents an integer of 0 to 2; $Ra^1$ represents an acid dissociable group represented by the aforementioned formula (a1-r-1) or (a1-r-2); $Wa^1$ represents a hydrocarbon group having a valency of $n_{a2}+1$; $n_{a2}$ represents an integer of 1 to 3; and $Ra^2$ represents an acid dissociable group represented by the aforementioned formula (a1-r-1) or (a1-r-3).

In general formula (a1-1), as the alkyl group of 1 to 5 carbon atoms for R, a linear or branched alkyl group of 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group and a neopentyl group. The halogenated alkyl group of 1 to 5 carbon atoms represented by R is a group in which part or all of the hydrogen atoms of the aforementioned alkyl group of 1 to 5 carbon atoms have been substituted with halogen atoms. Examples of the halogen atom include a fluorine atom, a chlorine atom, a bromine atom and an iodine atom, and a fluorine atom is particularly desirable.

As R, a hydrogen atom, an alkyl group of 1 to 5 carbon atoms or a fluorinated alkyl group of 1 to 5 carbon atoms is preferable, and a hydrogen atom or a methyl group is particularly desirable in terms of industrial availability.

The hydrocarbon group for $Va^1$ may be either an aliphatic hydrocarbon group or an aromatic hydrocarbon group. An "aliphatic hydrocarbon group" refers to a hydrocarbon group that has no aromaticity. The aliphatic hydrocarbon group as the divalent hydrocarbon group for $Va^1$ may be either saturated or unsaturated. In general, the aliphatic hydrocarbon group is preferably saturated.

As specific examples of the aliphatic hydrocarbon group, a linear or branched aliphatic hydrocarbon group, and an aliphatic hydrocarbon group containing a ring in the structure thereof can be given.

Further, as the group for $Va^1$, a group in which the aforementioned divalent hydrocarbon group has been bonded via an ether bond, urethane bond or amide bond can be mentioned.

The linear or branched aliphatic hydrocarbon group preferably has 1 to 10 carbon atoms, more preferably 1 to 6, still more preferably 1 to 4, and most preferably 1 to 3.

As the linear aliphatic hydrocarbon group, a linear alkylene group is preferable. Specific examples thereof include a methylene group [—CH$_2$—], an ethylene group [—(CH$_2$)$_2$—], a trimethylene group [—(CH$_2$)$_3$—], a tetramethylene group [—(CH$_2$)$_4$—] and a pentamethylene group [—(CH$_2$)$_5$—].

As the branched aliphatic hydrocarbon group, branched alkylene groups are preferred, and specific examples include various alkylalkylene groups, including alkylmethylene groups such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)—, and —C(CH$_2$CH$_3$)$_2$—; alkylethylene groups such as —CH(CH$_3$)CH$_2$—, —CH(CH$_3$)CH(CH$_3$)—, —C(CH$_3$)$_2$CH$_2$—, —CH(CH$_2$CH$_3$)CH$_2$—, and —C(CH$_2$CH$_3$)$_2$—CH$_2$—; alkyltrimethylene groups such as —CH(CH$_3$)CH$_2$CH$_2$—, and —CH$_2$CH(CH$_3$)CH$_2$—; and alkyltetramethylene groups such as —CH(CH$_3$)CH$_2$CH$_2$CH$_2$—, and —CH$_2$CH(CH$_3$)CH$_2$CH$_2$—. As the alkyl group within the alkylalkylene group, a linear alkyl group of 1 to 5 carbon atoms is preferable.

As examples of the hydrocarbon group containing a ring in the structure thereof, an alicyclic hydrocarbon group (a group in which two hydrogen atoms have been removed from an aliphatic hydrocarbon ring), a group in which the alicyclic hydrocarbon group is bonded to the terminal of the aforementioned chain-like aliphatic hydrocarbon group, and a group in which the alicyclic group is interposed within the aforementioned linear or branched aliphatic hydrocarbon group, can be given. As the linear or branched aliphatic hydrocarbon group, the same groups as those described above can be used.

The alicyclic hydrocarbon group preferably has 3 to 20 carbon atoms, and more preferably 3 to 12 carbon atoms.

The alicyclic hydrocarbon group may be either a monocyclic group or a polycyclic group. As the monocyclic aliphatic hydrocarbon group, a group in which 2 hydrogen atoms have been removed from a monocycloalkane is preferable. The monocycloalkane preferably has 3 to 6 carbon atoms, and specific examples thereof include cyclopentane and cyclohexane. As the polycyclic group, a group in which two hydrogen atoms have been removed from a polycycloalkane is preferable, and the polycyclic group preferably has 7 to 12 carbon atoms. Examples of the polycycloalkane include adamantane, norbornane, isobornane, tricyclodecane and tetracyclododecane.

The aromatic hydrocarbon group is a hydrocarbon group having an aromatic ring.

The aromatic hydrocarbon group as the divalent hydrocarbon group for $Va^1$ preferably has 3 to 30 carbon atoms, more preferably 5 to 30, still more preferably 5 to 20, still more preferably 6 to 15, and most preferably 6 to 10. Here, the number of carbon atoms within a substituent(s) is not included in the number of carbon atoms of the aromatic hydrocarbon group.

Examples of the aromatic ring contained in the aromatic hydrocarbon group include aromatic hydrocarbon rings, such as benzene, biphenyl, fluorene, naphthalene, anthracene and phenanthrene; and aromatic hetero rings in which part of the carbon atoms constituting the aforementioned aromatic hydrocarbon rings has been substituted with a hetero atom. Examples of the hetero atom within the aromatic hetero rings include an oxygen atom, a sulfur atom and a nitrogen atom.

Specific examples of the aromatic hydrocarbon group include a group in which two hydrogen atoms have been removed from the aforementioned aromatic hydrocarbon ring (arylene group); and a group in which one hydrogen atom has been removed from the aforementioned aromatic hydrocarbon ring (aryl group) and one hydrogen atom has been substituted with an alkylene group (such as a benzyl group, a phenethyl group, a 1-naphthylmethyl group, a 2-naphthylmethyl group, a 1-naphthylethyl group, or a 2-naphthylethyl group). The alkylene group (alkyl chain within the arylalkyl group) preferably has 1 to 4 carbon atom, more preferably 1 or 2, and most preferably 1.

In the aforementioned formula (am1-2), the hydrocarbon group for $Wa^1$ having a valency of $n_{a2}+1$ may be either an aliphatic hydrocarbon group or an aromatic hydrocarbon group. The aliphatic cyclic group refers to a hydrocarbon group that has no aromaticity, and may be either saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. As the specific examples thereof, the same groups as those described above for $Va^1$ in the aforementioned formula (am1-1) can be mentioned.

The valency of $n_{a2}+1$ is preferably divalent, trivalent or tetravalent, and divalent or trivalent is more preferable.

As the structural unit (am1-2), a structural unit represented by general formula (am1-2-01) shown below is particularly desirable.

[Chemical Formula 18]

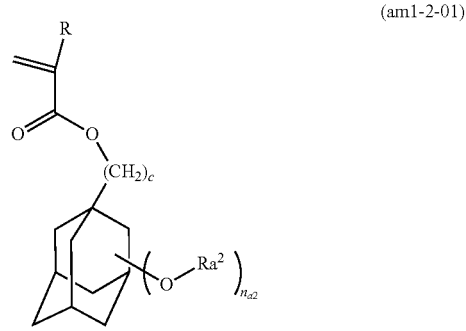

(am1-2-01)

In the formula (am1-2-01), $Ra^2$ represents an acid dissociable group represented by the aforementioned formula (a1-r-1) or (a1-r-3); $n_{a2}$ is an integer of 1 to 3, preferably 1 or 2, and more preferably 1; c is an integer of 0 to 3, preferably 0 or 1, and more preferably 1; R is the same as defined above.

Specific examples of the formulae (am1-1) and (am1-2) are shown below.

[Chemical Formula 19]

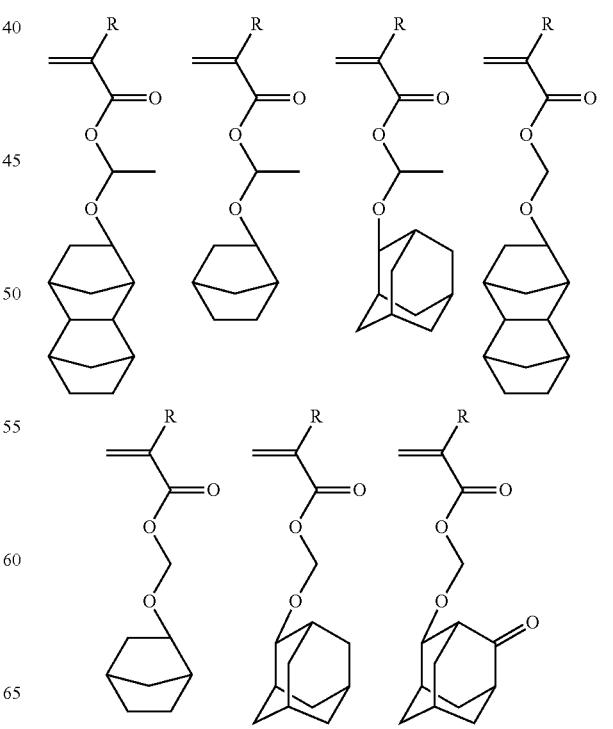

-continued
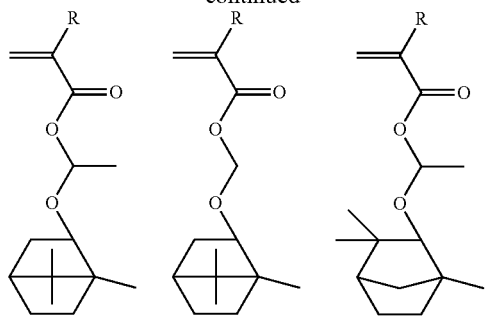
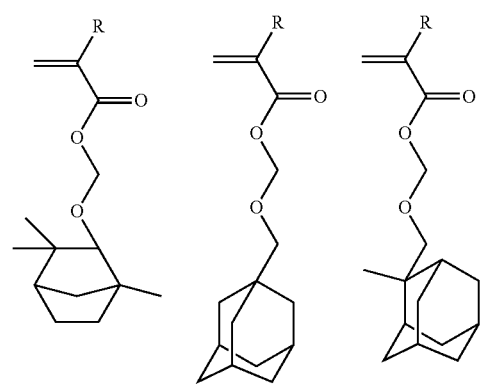
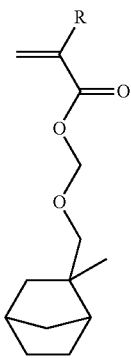
[Chemical Formula 20]
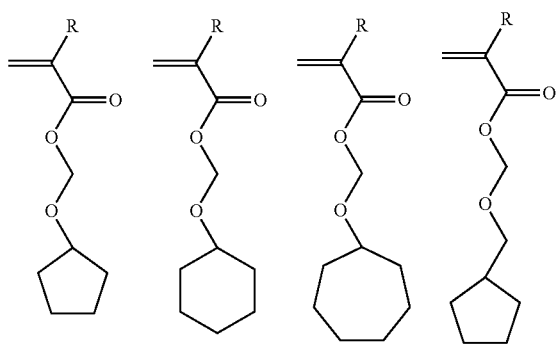
-continued
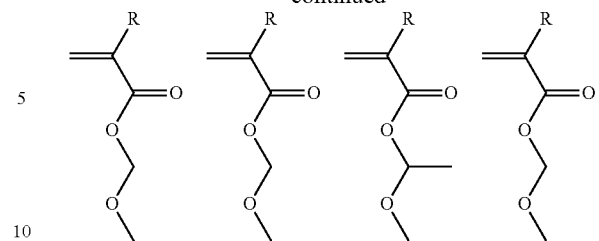
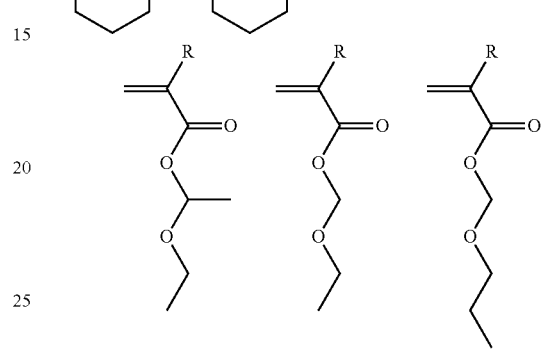
[Chemical Formula 21]
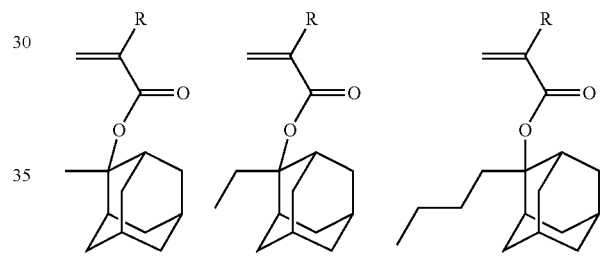
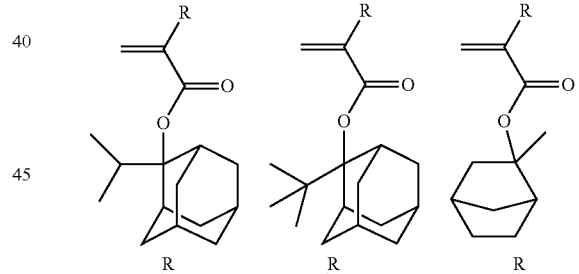
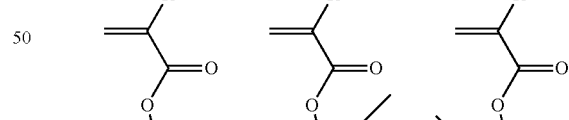
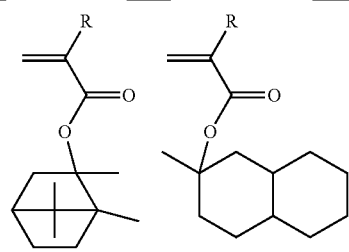

[Chemical Formula 22]
[Chemical Formula 23]
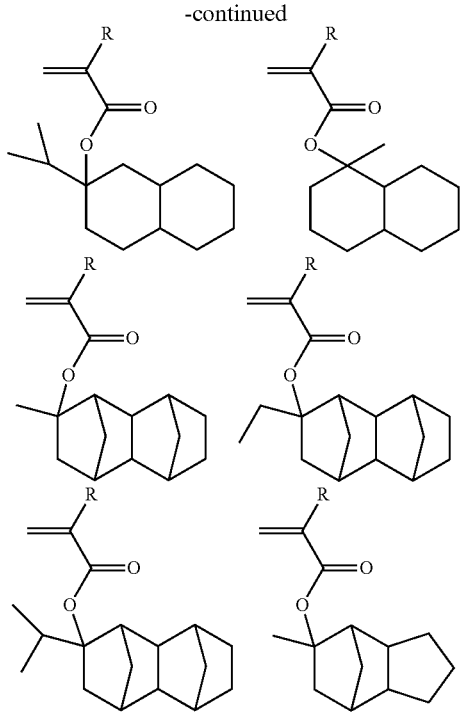
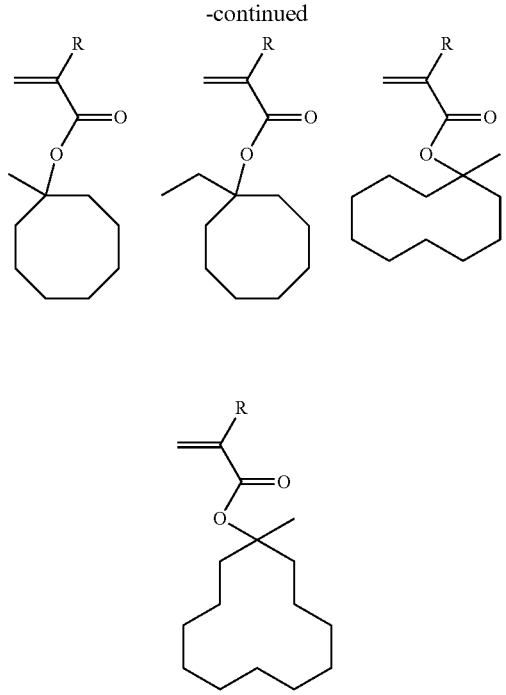
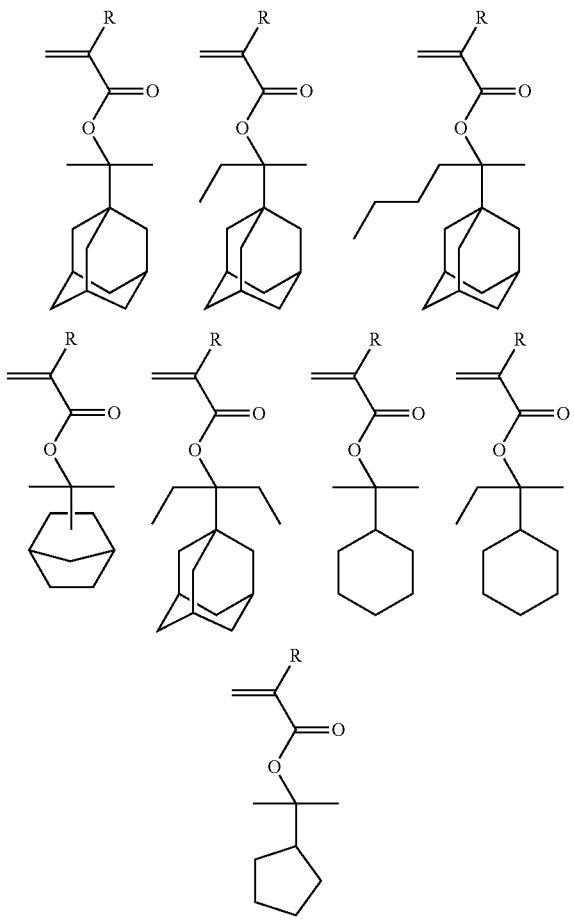

[Chemical Formula 24]

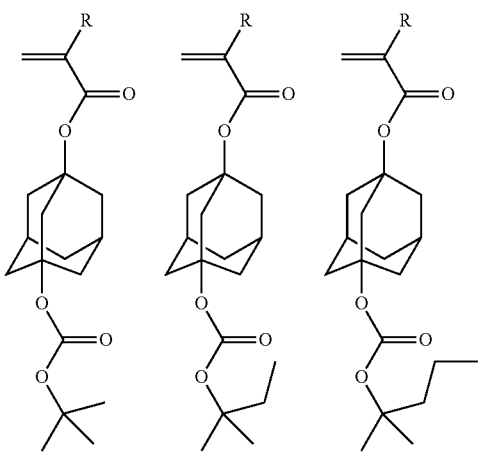

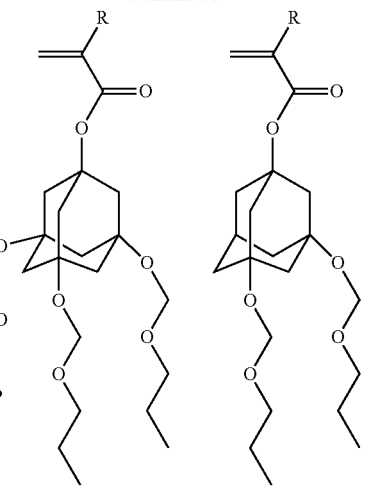

[Monomer (am5)]

In the present invention, the monomer (am5) is a monomer containing an —SO$_2$— containing cyclic group.

An "—SO$_2$— containing cyclic group" refers to a cyclic group having a ring containing —SO$_2$— within the ring structure thereof, i.e., a cyclic group in which the sulfur atom (S) within —SO$_2$— forms part of the ring skeleton of the cyclic group. The ring containing —SO$_2$— within the ring skeleton thereof is counted as the first ring. A cyclic group in which the only ring structure is the ring that contains —SO$_2$— in the ring skeleton thereof is referred to as a monocyclic group, and a group containing other ring structures is described as a polycyclic group regardless of the structure of the other rings. The —SO$_2$— containing cyclic group may be either a monocyclic group or a polycyclic group.

As the —SO$_2$— containing cyclic group for the cyclic hydrocarbon group represented by R$^1$, a cyclic group containing —O—SO$_2$— within the ring skeleton thereof, i.e., a cyclic group containing a sultone ring in which —O—S— within the —O—SO$_2$— group forms part of the ring skeleton thereof is particularly desirable. Specific examples of the —SO$_2$— containing cyclic group include groups represented by general formulae (a5-r-1) to (a5-r-4) shown below.

[Chemical Formula 25]

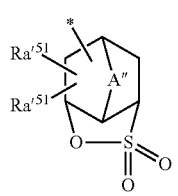
(a5-r-1)

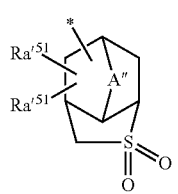
(a5-r-2)

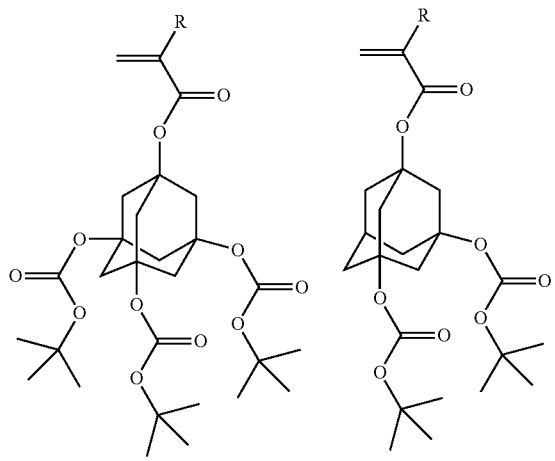

-continued

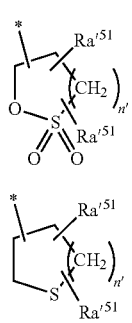
(a5-r-3)

(a5-r-4)

In the formulae, each $Ra'^{51}$ independently represents a hydrogen atom, an alkyl group, an alkoxy group, a halogen atom, a halogenated alkyl group, a hydroxy group, —COOR", —OC(═O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and n' represents an integer of 0 to 2.

In general formulae (a5-r-1) to (a5-r-4) above, A" represents an oxygen atom (—O—), a sulfur atom (—S—) or an alkylene group of 1 to 5 carbon atoms which may contain an oxygen atom or a sulfur atom. As the alkylene group of 1 to 5 carbon atoms for A", a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A", an alkylene group of 1 to 5 carbon atoms or —O— is preferable, more preferably an alkylene group of 1 to 5 carbon atoms, and most preferably a methylene group. Each $Ra'^{51}$ independently represents an alkyl group, an alkoxy group, a halogen atom, a halogenated alkyl group, —COOR", —OC(═O)R", a hydroxyalkyl group or a cyano group.

The alkyl group for $Ra'^{51}$ is preferably an alkyl group of 1 to 5 carbon atoms.

The alkoxy group for $Ra'^{51}$ is preferably an alkoxy group of 1 to 6 carbon atoms.

The alkoxy group is preferably a linear or branched alkoxy group. Specific examples of the alkoxy groups include the aforementioned alkyl groups for $Ra'^{21}$ having an oxygen atom (—O—) bonded thereto.

As examples of the halogen atom for $Ra'^{51}$, a fluorine atom, chlorine atom, bromine atom and iodine atom can be given. Among these, a fluorine atom is preferable.

Examples of the halogenated alkyl group for $Ra'^{51}$ include groups in which part or all of the hydrogen atoms within the aforementioned alkyl group for $Ra'^{21}$ has been substituted with the aforementioned halogen atoms. As the halogenated alkyl group, a fluorinated alkyl group is preferable, and a perfluoroalkyl group is particularly desirable.

With respect to —COOR" and —OC(═O)R" for $Ra'^{51}$, R" represents a hydrogen atom or an alkyl group.

Specific examples of the groups represented by the aforementioned general formulas (a5-r-1) to (a5-r-4) are shown below. In the formulae shown below, "Ac" represents an acetyl group.

[Chemical Formula 26]

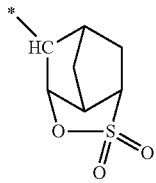
(r-sI-1-1)

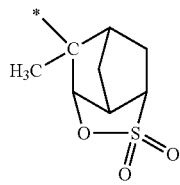
(r-sI-1-2)

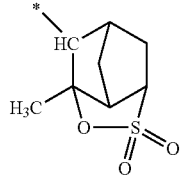
(r-sI-1-3)

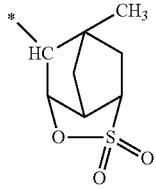
(r-sI-1-4)

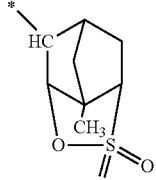
(r-sI-1-5)

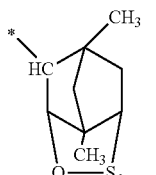
(r-sI-1-6)

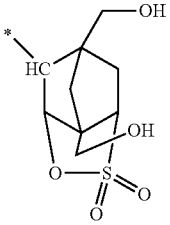
(r-sI-1-7)

-continued
(r-sI-1-8)
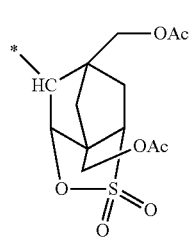
(r-sI-1-9)
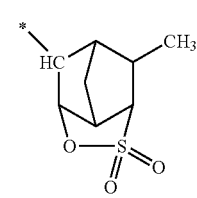
(r-sI-1-10)
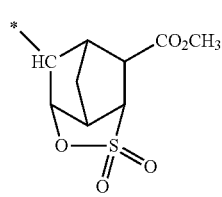
(r-sI-1-11)
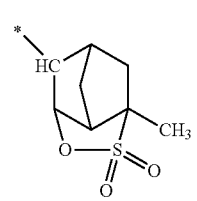
(r-sI-1-12)
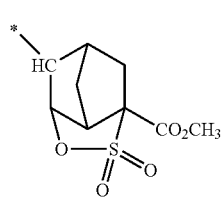
(r-sI-1-13)
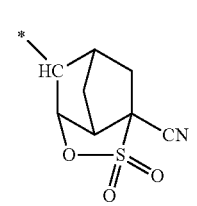
(r-sI-1-14)
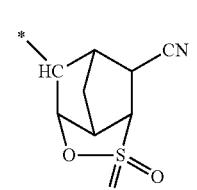
(r-sI-15)
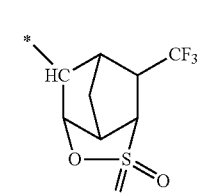
(r-sI-1-16)
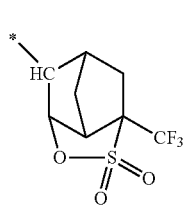
(r-sI-1-17)
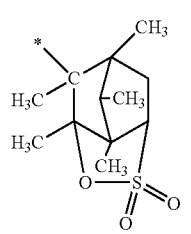
(r-sI-1-18)
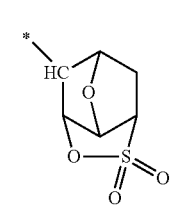
(r-sI-1-19)
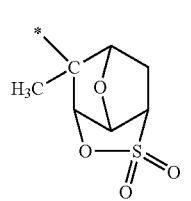
(r-sI-1-20)
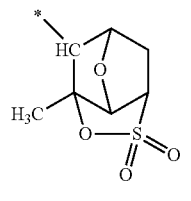
(r-sI-1-21)
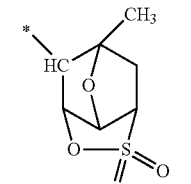
[Chemical Formula 27]
(r-sI-1-22)
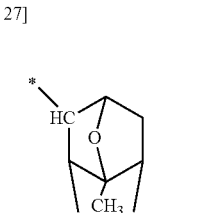

[Chemical Formula 28]

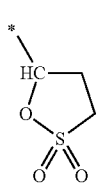
(r-sI-4-1)

In the present invention, the monomer (am5) containing an —$SO_2$— containing cyclic group is preferably a monomer represented by general formula (am5-1) shown below.

[Chemical Formuls 29]

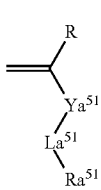
(am5-1)

In the formula, R is the same as defined above; $Ya^{51}$ represents a single bond or a divalent linking group; $La^{51}$ represents —O—, —COO—, —CON(R')—, —OCO—, —CONHCO— or —CONHCS—; R' represents a hydrogen atom or a methyl group; provided that, when $La^{51}$ represents —O—, $Ya^{51}$ does not represent —CO—; and $Ra^{51}$ represents an —$SO_2$— containing cyclic group.

In formula (am5-1), $Ya^{51}$ represents a divalent linking group, and is the same as defined for $Y^1$. In the present invention, $Ya^{51}$ preferably represents an ester bond [—C(=O)—O— or —O—C(=O)—], an amide bond [—C(=O)NH—], an ether bond (—O—), a linear or branched alkylene group, a combination of these, or a single bond.

In the present invention, the monomer represented by general formula (am5-1) is preferably a monomer represented by general formula (a5-1-1) shown below.

[Chemical Formula 30]

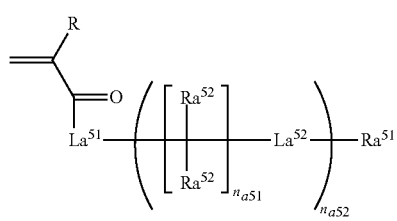
(am5-1-1)

In the formula, R and $Ra^{51}$ are the same as defined for R and $Ra^{51}$ in the aforementioned formula (am5-1), respectively; $Ra^{52}$ and $Ra^{53}$ each independently represents a hydrogen atom or an alkyl group of 1 to 5 carbon atoms; $na_{51}$ represents an integer of 1 to 3; $na_{52}$ represents an integer of 0 to 2; $La^{51}$ represents an oxygen atom or —NH—; and each $La^{52}$ independently represents an ester bond (—C(=O)O— or は —O—C(=O)—) or an amide bond (—C(=O)NH—).

The alkyl group for $Ra^{52}$ and $Ra^{53}$ is the same as defined for R. It is preferable that both $Ra^{52}$ and $Ra^{53}$ represent a hydrogen atom, or either one of $Ra^{52}$ and $Ra^{53}$ represents an alkyl group (most preferably a methyl group).

$na_{51}$ is preferably 1 or 2.

$La^{51}$ is preferably an oxygen atom.

$na_{52}$ represents an integer of 0 to 2. In the case where $na_{52}$ represents 2, $La^{52}$ on the polymerizable group-side is preferably (—O—C(=O)—), and $La^{52}$ on the terminal side is preferably (—C(=O)O—).

Specific examples of the monomer (am5) are shown below. R is the same as defined above.

[Chemical Formula 31]

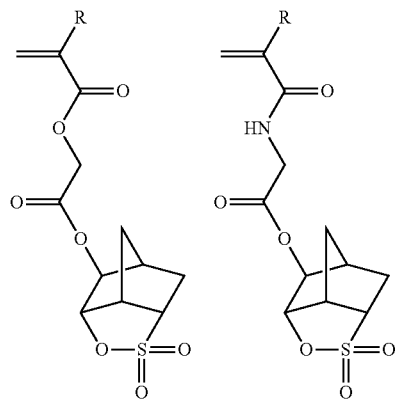

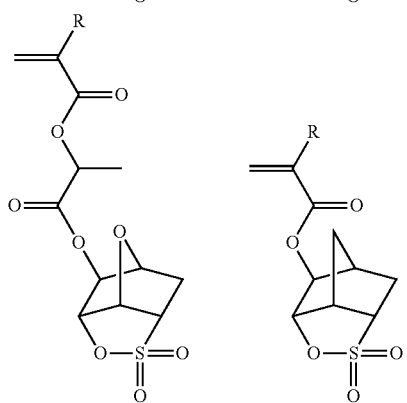

-continued

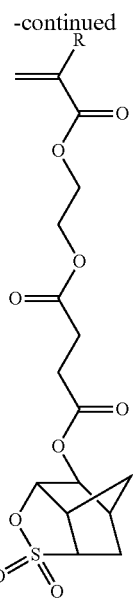

[Other Monomers]

In the method of producing a polymeric compound according to the present invention, any other monomer having an ethylenic double bond may be used, and examples of such monomer include monomers for deriving structural units (a2) to (a4) described later.

The method of producing a polymeric compound according to the present invention includes copolymerizing the aforementioned monomers (am0), (am1) and (am5) in the presence of a nitrogen-containing compound (X) having a conjugated acid with an acid dissociation constant of less than 10.

[Nitrogen-Containing Compound (X)]

The method of producing a polymeric compound according to the present invention includes copolymerizing the aforementioned monomers (am0), (am1) and (am5) in the presence of a nitrogen-containing compound (X) having a conjugated acid with an acid dissociation constant of less than 10.

In the present invention, "pKa" refers to an acid dissociation constant generally used as a parameter which shows the acid strength of an objective substance. The pKa value of the conjugated acid of the nitrogen-containing compound (X) can be determined by a conventional method. Alternatively, the pKa value can be calculated by simulation using a conventional software such as "ACD/Labs" (trade name; manufactured by Advanced Chemistry Development, Inc.).

The pKa (calculated value using the software "ACD/Labs") of the conjugated acid of the nitrogen-containing compound (X) is less than 10, preferably 0.5 to 7, and more preferably 1 to 7.

When the pKa of the conjugated acid of the nitrogen-containing compound (X) is within the above range, the size variation of the resist pattern formed before and after storage becomes small, and it is considered that the storage stability is excellent.

In addition, when the pKa of the conjugated acid of the nitrogen-containing compound (X) is less than the lower limit of the above range, it is considered that the effect of suppressing the change with time of the size variation of the resist pattern becomes hard to be achieved. On the other hand, when the pKa of the conjugated acid of the nitrogen-containing compound (X) exceeds the upper limit of the above range, there is a possibility that decomposition of any compound unstable under basic conditions proceeds.

In the present invention, the nitrogen-containing compound (X) is at least one compound selected from the group consisting of a compound represented by general formula (X1) shown below and a compound represented by general formula (X2) shown below.

[Chemical Formula 32]

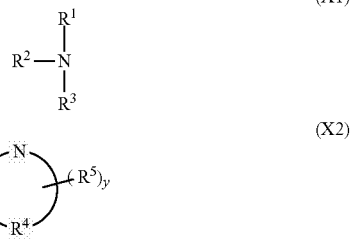

In the formulae, $R^1$ to $R^3$ each independently represents a hydrogen atom, an alkyl group of 1 to 15 carbon atoms which may have a substituent, a fluorinated alkyl group which may have a substituent or an aryl group, provided that two of $R^1$ to $R^3$ may be mutually bonded to form a ring, and at least one of $R^1$ to $R^3$ represents a fluorinated alkyl group, an aryl group or an aryl group containing a fluorine atom; $R^4$ is a group which forms an aromatic ring with the nitrogen atom bonded to the $R^4$ group; $R^5$ represents an alkyl group of 1 to 15 carbon atoms which may have a substituent, a halogen atom or an aryl group; and y represents an integer of 0 to 5.

[Compound Represented by General Formula (X1): Component (X1)]

In formula (X1), $R^1$ to $R^3$ each independently represents a hydrogen atom, an alkyl group of 1 to 15 carbon atoms which may have a substituent, a fluorinated alkyl group which may have a substituent or an aryl group.

Examples of the alkyl group for $R^1$~$R^3$ include linear, branched or cyclic alkyl groups. The alkyl group for $R^1$ to $R^3$ has 1 to 15 carbon atoms, preferably 1 to 10 carbon atoms, and more preferably 1 to 5 carbon atoms.

The alkyl group for $R^1$ to $R^3$ is the same as defined for the linear, branched or cyclic alkyl groups mentioned above as examples of the alkyl group for $Ra'^3$ in formula (a1-r-1).

Among these examples, as the alkyl group for $R^1$ to $R^3$, a linear or branched alkyl group is preferable, and a linear alkyl group is more preferable. Specific examples of the alkyl group for $R^1$ to $R^3$ include a methyl group, an ethyl group, a propyl group, an isopropyl group, an n-butyl group, an isobutyl group, a tert-butyl group, a pentyl group, an isopentyl group, and a neopentyl group.

The fluorinated alkyl group for $R^1$ to $R^3$ is preferably a group in which part or all of the hydrogen atoms within the aforementioned alkyl group for $R^1$ to $R^3$ have been substituted with a fluorine atom. The fluorination ratio (number of hydrogen atoms substituted with fluorine atom/total number of hydrogen atoms within the alkyl group prior to substitution) of the fluorinated alkyl group for $R^1$ to $R^3$ is preferably 50% or more, and more preferably 75% or more.

Examples of the aryl group for $R^1$ to $R^3$ include groups in which one hydrogen atom has been removed from an aromatic hydrocarbon ring such as benzene, fluorene, naphthalene, anthracene or phenanthrene, and a phenyl group or a naphthyl group is preferable.

The alkyl group, the fluorinated alkyl group and the aryl group for $R^1$ to $R^3$ may have a substituent. Examples of the substituent include an alkoxy group, a hydroxy group, a carbonyl group and —O—.

Two of $R^1$ to $R^3$ may be mutually bonded to form a ring. Examples of the ring formed include a pyrrolidine ring, a piperidine ring and a hexamethylene imine ring.

However, at least one of $R^1$ to $R^3$ represents a fluorinated alkyl group, an aryl group or an aryl group containing a fluorine atom, preferably a fluorinated alkyl group, and more preferably a fluorinated alkyl group of 1 to 5 carbon atoms. As a result, the nitrogen-containing compound (X) tends to exhibit weak basicity, and the storage stability of the resist composition is improved.

In the case where one of $R^1$ to $R^3$ represents a fluorinated alkyl group, an aryl group or an aryl group containing a fluorine atom, the remaining two are preferably a hydrogen atom or an alkyl group, more preferably a hydrogen atom, and it is still more preferable that both of the remaining two represent a hydrogen atom.

[Compound Represented by General Formula (X2): Component (X2)]

In formula (X2), $R^4$ is a group which forms an aromatic ring with the nitrogen atom bonded to the $R^4$ group. Examples of the formed ring include a pyridine ring, a pyrimidine ring, an azepine ring, a pyrazine ring, a quinoline ring and a benzoquinoline ring. Further, the ring may contain an oxygen atom in the ring skeleton thereof, and specific examples of preferable rings which contain an oxygen atom include an oxazole ring and an isooxazole ring. The aromatic ring is preferably a 4- to 7-membered ring, more preferably a 4- to 6-membered ring, and still more preferably a 6-membered ring.

$R^5$ represents an alkyl group of 1 to 15 carbon atoms which may have a substituent, a halogen atom or an aryl group The alkyl group of 1 to 15 carbon atoms represented by $R^5$ which may have a substituent is the same as defined for the alkyl group of 1 to 15 carbon atoms (which may have a substituent) represented by $R^1$ to $R^3$ in the aforementioned formula (X1). Among these examples, an alkyl group of 1 to 5 carbon atoms is preferable.

Examples of the halogen atom for $R^5$ include a fluorine atom, chlorine atom, bromine atom and iodine atom, and a fluorine atom is preferable.

Examples of the aryl group for $R^5$ include an aryl group of 6 to 20 carbon atoms and a substituted aryl group of 6 to 20 carbon atoms.

Specific examples of the aryl group of 6 to 20 carbon atoms include a phenyl group, a benzyl group, a tolyl group, an o-xylyl group, a naphthyl group and a biphenyl group.

Specific examples of the substituted aryl group of 6 to 20 carbon atoms include groups in which part of a phenyl group, a benzyl group, a tolyl group, an o-xylyl group, a naphthyl group or a biphenyl group has been substituted with a halogen atom.

y represents an integer of 0 to 5, preferably an integer of 0 to 2, and most preferably 2.

Specific examples of preferable nitrogen-containing compounds in the present invention are shown in Tables 1 to 7 below.

TABLE 1

| No | Nitrogen-containing compound | pKa |
|---|---|---|
| 1 | 4-hydroxypiperidine-1-carboxylic acid tert-butyl ester | −2.04 |
| 2 | $CF_3CF_2CF_2NH_2$ | −1.23 |
| 3 | $H_3C-C(=O)-NH_2$ (acetamide) | −0.47 |
| 4 | 2-fluoropyridine | −0.43 |
| 5 | 2-(trifluoromethyl)-4-(trifluoromethyl)aniline | −0.37 |
| 6 | pyrrole (NH) | −0.27 |

TABLE 2

| No | Nitrogen-containing compound | pKa |
|---|---|---|
| 7 | pentafluoroaniline ($NH_2$ on pentafluorophenyl) | −0.16 |
| 8 | 3,5-difluoropyridine | 0.39 |
| 9 | 2-(trifluoromethyl)pyridine | 0.6 |
| 10 | benzothiazole | 0.85 |

TABLE 2-continued

| No | Nitrogen-containing compound | pKa |
|---|---|---|
| 11 | PhNH-C(CF$_3$)$_2$-NH$_2$ | 1.07 |
| 12 | 2-(CF$_3$)-C$_6$H$_4$-NH$_2$ | 1.1 |
| 13 | HO-C(CF$_3$)$_2$-NH$_2$ | 1.15 |

TABLE 3

| No | Nitrogen-containing compound | pKa |
|---|---|---|
| 14 | pyrazine | 1.22 |
| 15 | pyrimidine | 1.78 |
| 16 | 3-cyanopyridine | 1.78 |
| 17 | CH$_3$NH-C(CF$_3$)$_2$-NH$_2$ | 2.03 |
| 18 | HN(-)-C(CF$_3$)$_2$-NH$_2$ | 2.05 |
| 19 | 1,3,5-triazine | 2.07 |
| 20 | H$_2$N-C(CF$_3$)$_2$-NH$_2$ | 2.32 |

TABLE 4

| No | Nitrogen-containing compound | pKa |
|---|---|---|
| 21 | 3-fluoropyridine | 2.81 |
| 22 | 4-(trifluoromethyl)pyridine | 2.92 |
| 23 | aniline | 4.61 |
| 24 | pyridine | 5.25 |
| 25 | pyridazine | 3.12 |
| 26 | 2-fluoroaniline | 3.2 |
| 27 | 7-(diethylamino)coumarin | 3.4 |

TABLE 5

| No | Nitrogen-containing compound | pKa |
|---|---|---|
| 28 | 3-fluoroaniline | 3.58 |
| 29 | 4-fluoro-N-phenylaniline (or 4-fluorodiphenylamine) | 4.15 |

TABLE 5-continued

| No | Nitrogen-containing compound | pKa |
|---|---|---|
| 30 | 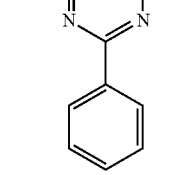 | 4.22 |
| 31 | 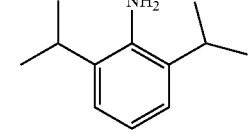 | 4.25 |
| 32 | 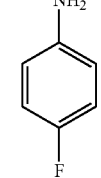 | 4.66 |
| 33 | 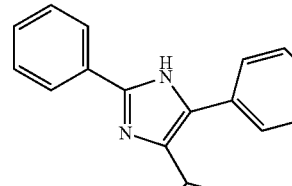 | 5.14 |
| 34 | 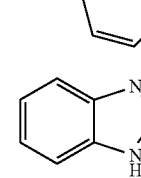 | 5.26 |

TABLE 6

| No | Nitrogen-containing compound | pKa |
|---|---|---|
| 35 | $H_2N\sim CF_3$ | 5.47 |
| 36 |  | 5.67 |
| 37 | 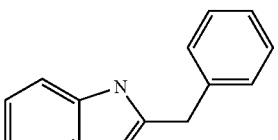 | 5.8 |
| 38 | $H_2NCH(CH_3)CF_3$ | 5.82 |
| 39 | $H_2N\sim CF_2CF_3$ | 5.89 |

TABLE 6-continued

| No | Nitrogen-containing compound | pKa |
|---|---|---|
| 40 | $H_2N\sim CF_2CF_2CF_3$ | 5.89 |
| 41 | $H_2N\sim CF_2CF_2CF_3$ | 5.92 |

TABLE 7

| No | Nitrogen-containing compound | pKa |
|---|---|---|
| 42 | $H_2N\sim CF_2(CF_2)_5CF_3$ | 6.05 |
| 43 | 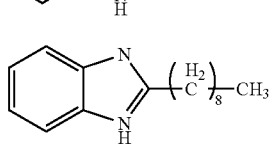 | 6.67 |
| 44 |  | 8.33 |
| 45 | (piperidine-CH₂CH₂OH) | 8.96 |
| 46 | (methyl piperidine-4-carboxylate) | 9.78 |
| 47 | Triethanolamine | 7.77 |

In the present invention, as the nitrogen-containing compound, the nitrogen-containing compound nos. 14, 19, 23, 24, 31 and 43 in Tables 1 to 7 are most preferable.

In the method of producing a polymeric compound according to the present invention, since the acid decomposable group within the "monomer containing an acid decomposable group which exhibits increased polarity by the action of acid" is not decomposed, the yield of the polymeric compound can be improved in the production method. Further, by adding a nitrogen-containing compound (X) having a conjugated acid with an acid dissociation constant (pKa) of 10 or less, decomposition of the monomer (am0) can also be suppressed. As a result, it is presumed that lithography properties can be improved.

<<Resist Composition>>

Another aspect of the present invention is a resist composition including a polymeric compound produced by the method according to the above embodiment.

That is, the resist composition of the present invention includes a polymeric compound having a structural unit (a0) containing a partial structure represented by formula (am0-1), a structural unit (a1) containing an acid decomposable group which exhibits increased polarity by the action of acid and a structural unit (a5) containing an —SO₂— containing cyclic group.

The resist composition of the present invention preferably includes a base component (A) (hereafter, referred to as "component (A)") which exhibits changed solubility in a developing solution under action of acid, and an acid-generator component (B) (hereafter, referred to as "component (B)") which generates acid upon exposure. When a resist film is formed using the resist composition and the formed resist film is subjected to a selective exposure, acid is generated from the component (B) at exposed portions, and the generated acid acts on the component (A) to change the solubility of the component (A) in a developing solution, whereas the solubility of the component (A) in a developing solution is not changed at unexposed portions, thereby generating difference in solubility in a developing solution between exposed portions and unexposed portions. Therefore, by subjecting the resist film to development, the exposed portions are dissolved and removed to form a positive-tone resist pattern in the case of a positive resist, whereas the unexposed portions are dissolved and removed to form a negative-tone resist pattern in the case of a negative resist.

In the present specification, a resist composition which forms a positive resist pattern by dissolving and removing the exposed portions is called a positive resist composition, and a resist composition which forms a negative resist pattern by dissolving and removing the unexposed portions is called a negative resist composition.

The resist composition of the present invention may be either a positive resist composition or a negative resist composition.

Further, in the formation of a resist pattern, the resist composition of the present invention can be applied to an alkali developing process using an alkali developing solution in the developing treatment, or a solvent developing process using a developing solution containing an organic solvent (organic developing solution) in the developing treatment.

<Component (A)>

The component (A) used in the resist composition of the present invention is a base component which exhibits changed solubility in a developing solution by the action of acid, and preferably includes a polymeric compound (A1) (hereafter, referred to as "component (A1)") having a structural unit (a0) containing a partial structure represented by formula (am0-1), a structural unit (a1) containing an acid decomposable group which exhibits increased polarity by the action of acid and a structural unit (a5) containing an —$SO_2$— containing cyclic group.

Here, the term "base component" refers to an organic compound capable of forming a film, and is preferably an organic compound having a molecular weight of 500 or more. When the organic compound has a molecular weight of 500 or more, the film-forming ability is improved, and a resist pattern of nano level can be easily formed. The "organic compound having a molecular weight of 500 or more" which can be used as a base component is broadly classified into non-polymers and polymers.

In general, as a non-polymer, any of those which have a molecular weight in the range of 500 to less than 4,000 is used. Hereafter, a non-polymer having a molecular weight in the range of 500 to less than 4,000 is referred to as a low molecular weight compound.

As a polymer, any of those which have a molecular weight of 1,000 or more is generally used. Hereafter, a polymer having a molecular weight of 1,000 or more is referred to as a polymeric compound. With respect to a polymeric compound, the "molecular weight" is the weight average molecular weight in terms of the polystyrene equivalent value determined by gel permeation chromatography (GPC). Hereafter, a polymeric compound is frequently referred to simply as a "resin".

As the component (A), a low-molecular weight compound may be used in combination with the component (A1).

The component (A) containing the component (A1) may be a resin that exhibits increased solubility in a developing solution under action of acid or a resin that exhibits decreased solubility in a developing solution under action of acid.

[Component (A1)]

The component (A1) is a polymeric compound having a structural unit (a0) containing a partial structure represented by formula (am0-1), a structural unit (a1) containing an acid decomposable group which exhibits increased polarity by the action of acid and a structural unit (a5) containing an —$SO_2$— containing cyclic group.

When a resist film formed using the resist composition of the present invention is exposed, at least part of the structure within the structural units is cleaved by the action of acid, and the polarity is increased. As a result, the resist composition of the present invention becomes a positive-type in an alkali developing process, and a negative-type in a solvent developing process. Since the polarity of the component (A1) is changed prior to and after exposure, by using the component (A1), an excellent development contrast can be achieved not only in an alkali developing process, but also in a solvent developing process.

More specifically, in the case of applying an alkali developing process, the component (A1) is substantially insoluble in an alkali developing solution prior to exposure, but when acid is generated from the acid generator component (described later) upon exposure, the action of this acid causes an increase in the polarity of the base component, thereby increasing the solubility of the component (A1) in an alkali developing solution. Therefore, in the formation of a resist pattern, by conducting selective exposure of a resist film formed by applying the resist composition to a substrate, the exposed portions change from an insoluble state to a soluble state in an alkali developing solution, whereas the unexposed portions remain insoluble in an alkali developing solution, and hence, a positive resist pattern can be formed by alkali developing.

On the other hand, in the case of a solvent developing process, the component (A1) exhibits high solubility in an organic developing solution prior to exposure, and when acid is generated from the acid generator component upon exposure, the polarity of the component (A1) is increased by the action of the generated acid, thereby decreasing the solubility of the component (A1) in an organic developing solution. Therefore, in the formation of a resist pattern, by conducting selective exposure of a resist film formed by applying the resist composition to a substrate, the exposed portions changes from an soluble state to an insoluble state in an organic developing solution, whereas the unexposed portions remain soluble in an organic developing solution. As a result, by conducting development using an organic developing solution, a contrast can be made between the exposed portions and unexposed portions, thereby enabling the formation of a negative resist pattern.

(Structural Unit (a0))

The structural unit (a0) is a structural unit derived from a monomer containing a partial structure represented by formula (am0-1).

Formulae (am0-1) and (am0-2) (a preferred embodiment of formula (am0-1)) are the same as defined above.

As described above, the monomer from which the structural unit (a0) is derived may have various kinds of substituents on the terminal (on the valence bond *[4]-side). Thus, the amount of the structural unit (a0) within the component (A) is not particularly limited, and can be appropriately determined taking into consideration of the balance with other structural units. For example, the amount of the structural unit (a0) based on the combined total of all structural units constituting the component (A) is preferably 5 to 90 mol %, more preferably 10 to 80 mol %, and still more preferably 15 to 70 mol %.

(Structural Unit (a1))

The structural unit (a1) is a structural unit containing an acid decomposable group that exhibits increased polarity by the action of acid.

The "acid decomposable group that exhibits increased polarity by the action of acid" is the same as defined for the acid decomposable group described above in relation to the aforementioned (am1).

As the structural unit (a1), a structural unit in which the ethylenic double bond of the monomer (am1) has been cleaved can be mentioned, and a structural unit derived from a monomer represented by the aforementioned general formula (am1-1) or (am1-2) is preferable.

In the component (A), the amount of the structural unit (a1) based on the combined total of all structural units constituting the component (A) is preferably 5 to 80 mol %, more preferably 10 to 75 mol %, and still more preferably 10 to 70 mol %. By ensuring the lower limit, various lithography properties such as sensitivity, resolution and roughness are improved. On the other hand, when the amount of the structural unit (a1) is no more than the upper limit of the above-mentioned range, a good balance can be achieved with the other structural units.

(Structural Unit (a5))

The structural unit (a5) is a structural unit containing an —$SO_2$— containing cyclic group, and examples thereof include a structural unit in which the ethylenic double bond of the monomer (am5) has been cleaved. The structural unit (a5) is preferably a structural unit derived from a monomer represented by the aforementioned general formula (am5-1), and more preferably a structural unit derived from a monomer represented by the aforementioned general formula (a1-1-1).

When the component (A1) is used for forming a resist film, the —$SO_2$— containing cyclic group of the structural unit (a5) is effective in improving the adhesion between the resist film and the substrate. As a result of the adhesion to a substrate being enhanced, the heat stability is improved. Therefore, in a high-temperature bake treatment after the developing, the pattern can be prevented from being dissipated.

In the present invention, the component (A1) has a structural unit (a5).

The aforementioned structural unit (a1) which contains an —$SO_2$— containing cyclic group falls under the definition of the structural unit (a5); however, such a structural unit is regarded as a structural unit (a1), and does not fall under the definition of the structural unit (a5).

As the structural unit (a5) contained in the component (A1), 1 type of structural unit may be used, or 2 or more types may be used.

When the component (A1) contains the structural unit (a5), the amount of the structural unit (a5) based on the combined total of all structural units constituting the component (A1) is preferably 1 to 80 mol %, more preferably 5 to 70 mol %, still more preferably 10 to 65 mol %, and most preferably 10 to 60 mol %. When the amount of the structural unit (a5) is at least as large as the lower limit of the above-mentioned range, the effect of using the structural unit (a5) can be satisfactorily achieved. On the other hand, when the amount of the structural unit (a5) is no more than the upper limit of the above-mentioned range, a good balance can be achieved with the other structural units, and the pattern shape can be improved.

(Other Structural Units)

In the present invention, the component (A) may further include a structural unit containing a polar group-containing aliphatic hydrocarbon group (hereafter, referred to as "structural unit (a3)"), a structural unit containing an acid non-dissociable cyclic group (hereafter, referred to as "structural unit (a4)") and a structural unit containing a lactone-containing cyclic group or a carbonate-containing cyclic group (hereafter, referred to as "structural unit (a2)").

(Structural Unit (a3))

The structural unit (a3) is a structural unit containing a polar group-containing aliphatic hydrocarbon group (provided that the structural units that fall under the definition of structural units (a1) and (a5) are excluded).

When the component (A1) includes the structural unit (a3), it is presumed that the hydrophilicity of the component (A) is enhanced, thereby contributing to improvement in resolution.

Examples of the polar group include a hydroxyl group, cyano group, carboxyl group, or hydroxyalkyl group in which part of the hydrogen atoms of the alkyl group have been substituted with fluorine atoms, although a hydroxyl group is particularly desirable.

Examples of the aliphatic hydrocarbon group include linear or branched hydrocarbon groups (preferably alkylene groups) of 1 to 10 carbon atoms, and cyclic aliphatic hydrocarbon groups (cyclic groups). These cyclic groups can be selected appropriately from the multitude of groups that have been proposed for the resins of resist compositions designed for use with ArF excimer lasers. The cyclic group is preferably a polycyclic group, more preferably a polycyclic group of 7 to 30 carbon atoms.

Of the various possibilities, structural units derived from an acrylate ester that include an aliphatic polycyclic group that contains a hydroxyl group, cyano group, carboxyl group or a hydroxyalkyl group in which part of the hydrogen atoms of the alkyl group have been substituted with fluorine atoms are particularly desirable. Examples of the polycyclic group include groups in which two or more hydrogen atoms have been removed from a bicycloalkane, tricycloalkane, tetracycloalkane or the like. Specific examples include groups in which two or more hydrogen atoms have been removed from a polycycloalkane such as adamantane, norbornane, isobornane, tricyclodecane or tetracyclododecane. Of these polycyclic groups, groups in which two or more hydrogen atoms have been removed from adamantane, norbornane or tetracyclododecane are preferred industrially.

As the structural unit (a3), there is no particular limitation as long as it is a structural unit containing a polar group-containing aliphatic hydrocarbon group, and an arbitrary structural unit may be used.

The structural unit (a3) is preferably a structural unit derived from an acrylate ester which may have the hydrogen atom bonded to the carbon atom on the α-position substituted with a substituent and contains a polar group-containing aliphatic hydrocarbon group.

When the aliphatic hydrocarbon group within the polar group-containing aliphatic hydrocarbon group is a linear or branched hydrocarbon group of 1 to 10 carbon atoms, the structural unit (a3) is preferably a structural unit derived from a hydroxyethyl ester of acrylic acid. On the other hand, when the hydrocarbon group is a polycyclic group, structural units represented by formulas (a3-1), (a3-2) and (a3-3) shown below are preferable.

[Chemical Formula 33]

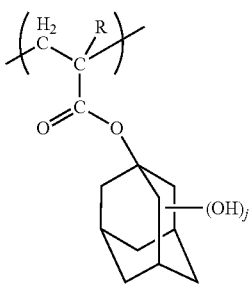
(a3-1)

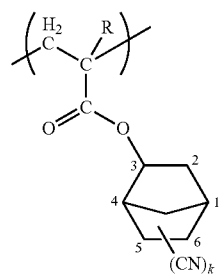
(a3-2)

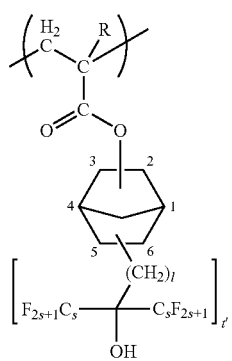
(a3-3)

In the formulas, R is the same as defined above; j is an integer of 1 to 3; k is an integer of 1 to 3; t' is an integer of 1 to 3; l is an integer of 1 to 5; and s is an integer of 1 to 3.

In formula (a3-1), j is preferably 1 or 2, and more preferably 1. When j is 2, it is preferable that the hydroxyl groups be bonded to the 3rd and 5th positions of the adamantyl group. When j is 1, it is preferable that the hydroxyl group be bonded to the 3rd position of the adamantyl group.

j is preferably 1, and it is particularly desirable that the hydroxyl group be bonded to the 3rd position of the adamantyl group.

In formula (a3-2), k is preferably 1. The cyano group is preferably bonded to the 5th or 6th position of the norbornyl group.

In formula (a3-3), t' is preferably 1. l is preferably 1. s is preferably 1. Further, it is preferable that a 2-norbornyl group or 3-norbornyl group be bonded to the terminal of the carboxy group of the acrylic acid. The fluorinated alkyl alcohol is preferably bonded to the 5th or 6th position of the norbornyl group.

As the structural unit (a3) contained in the component (A1), 1 type of structural unit may be used, or 2 or more types may be used.

The amount of the structural unit (a3) within the component (A1) based on the combined total of all structural units constituting the component (A1) is preferably 5 to 50 mol %, more preferably 5 to 40 mol %, and still more preferably 5 to 25 mol %.

When the amount of the structural unit (a3) is at least as large as the lower limit of the above-mentioned range, the effect of using the structural unit (a3) can be satisfactorily achieved. On the other hand, when the amount of the structural unit (a3) is no more than the upper limit of the above-mentioned range, a good balance can be achieved with the other structural units.

(Structural Unit (a4))

The structural unit (a4) is a structural unit containing an acid non-dissociable cyclic group. When the component (A1) includes the structural unit (a4), dry etching resistance of the resist pattern to be formed is improved. Further, the hydrophobicity of the component (A1) is further improved. Increase in the hydrophobicity contributes to improvement in terms of resolution, shape of the resist pattern and the like, particularly in an organic solvent developing process.

An "acid non-dissociable, aliphatic cyclic group" in the structural unit (a4) refers to a cyclic group which is not dissociated by the action of acid generated from the component (B) described later upon exposure, and remains in the structural unit.

As the structural unit (a4), a structural unit which contains a non-acid-dissociable aliphatic cyclic group, and is also derived from an acrylate ester is preferable. Examples of this cyclic group include the same groups as those described above in relation to the aforementioned structural unit (a1), and any of the multitude of conventional groups used within the resin component of resist compositions for ArF excimer lasers or KrF excimer lasers (and particularly for ArF excimer lasers) can be used.

In consideration of industrial availability and the like, at least one polycyclic group selected from amongst a tricyclodecyl group, adamantyl group, tetracyclododecyl group, isobornyl group, and norbornyl group is particularly desirable. These polycyclic groups may be substituted with a linear or branched alkyl group of 1 to 5 carbon atoms.

Specific examples of the structural unit (a4) include units with structures represented by general formulas (a4-1) to (a-4-7) shown below.

[Chemical Formula 34]

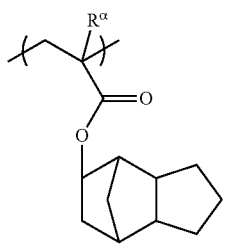
(a4-1)

(a4-2)

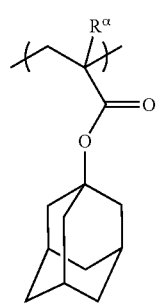

(a4-3)

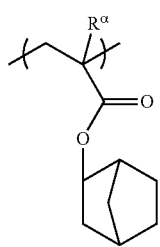

(a4-4)

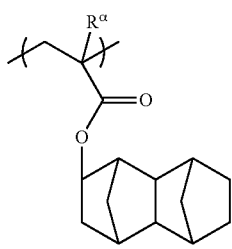

(a4-5)

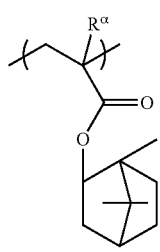

(a4-6)

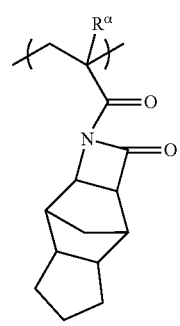

(a4-7)

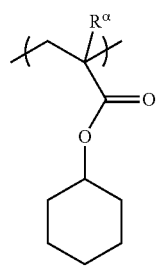

In the formulae, $R^\alpha$ represents a hydrogen atom, a methyl group or a trifluoromethyl group.

As the structural unit (a4) contained in the component (A1), 1 type of structural unit may be used, or 2 or more types may be used.

When the structural unit (a4) is included in the component (A1), the amount of the structural unit (a4) based on the combined total of all the structural units that constitute the component (A1) is preferably within the range from 1 to 30 mol %, and more preferably from 10 to 20 mol %.

(Structural Unit (a2))

The structural unit (a2) is a structural unit containing a lactone-containing cyclic group or a carbonate-containing cyclic group.

When the component (A1) is used for forming a resist film, the structural unit (a2) containing a lactone-containing cyclic group or a carbonate-containing cyclic group is effective in improving the adhesion between the resist film and the substrate.

The aforementioned structural unit (a1) which contains a lactone-containing cyclic group or a carbonate-containing cyclic group falls under the definition of the structural unit (a2); however, such a structural unit is regarded as a structural unit (a1), and does not fall under the definition of the structural unit (a2).

The structural unit (a2) is preferably a structural unit derived from a monomer represented by formula (am5-1) or (am5-1-1) in which $Ra^{51}$ is a lactone-containing cyclic group or a carbonate-containing cyclic group.

The term "lactone-containing cyclic group" refers to a cyclic group including a ring containing a —O—C(=O)— structure (lactone ring). The term "lactone ring" refers to a single ring containing a —O—C(O)— structure, and this ring is counted as the first ring. A lactone-containing cyclic group in which the only ring structure is the lactone ring is referred to as a monocyclic group, and groups containing other ring structures are described as polycyclic groups regardless of the structure of the other rings. The lactone-containing cyclic group may be either a monocyclic group or a polycyclic group.

The lactone-containing cyclic group as the cyclic hydrocarbon group for $R^1$ is not particularly limited, and an arbitrary group may be used. Specific examples include groups represented by general formulas (a2-r-1) to (a2-r-7) shown below. Hereinbelow, "*" represents a valence bond.

[Chemical Formula 35]

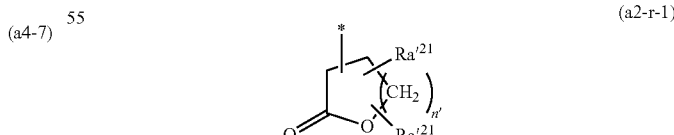
(a2-r-1)

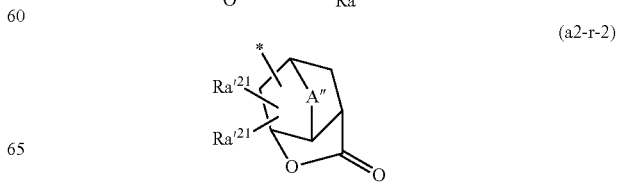
(a2-r-2)

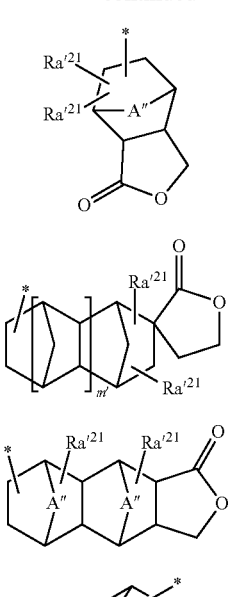

(a2-r-3)

(a2-r-4)

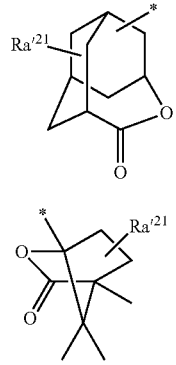

(a2-r-5)

(a2-r-6)

(a2-r-7)

In the formulae, each Ra'$^{21}$ independently represents a hydrogen atom, an alkyl group, an alkoxy group, a halogen atom, a halogenated alkyl group, a hydroxy group, —COOR″, —OC(=O)R″, a hydroxyalkyl group or a cyano group; R″ represents a hydrogen atom or an alkyl group; A″ represents an oxygen atom, a sulfur atom or an alkylene group of 1 to 5 carbon atoms which may contain an oxygen atom or a sulfur atom; n' represents an integer of 0 to 2; and m' represents 0 or 1.

In general formulae (a2-r-1) to (a2-r-7) above, A″ represents an oxygen atom (—O—), a sulfur atom (—S—) or an alkylene group of 1 to 5 carbon atoms which may contain an oxygen atom or a sulfur atom. As the alkylene group of 1 to 5 carbon atoms for A″, a linear or branched alkylene group is preferable, and examples thereof include a methylene group, an ethylene group, an n-propylene group and an isopropylene group. Examples of alkylene groups that contain an oxygen atom or a sulfur atom include the aforementioned alkylene groups in which —O— or —S— is bonded to the terminal of the alkylene group or present between the carbon atoms of the alkylene group. Specific examples of such alkylene groups include —O—CH$_2$—, —CH$_2$—O—CH$_2$—, —S—CH$_2$— and —CH$_2$—S—CH$_2$—. As A″, an alkylene group of 1 to 5 carbon atoms or —O— is preferable, more preferably an alkylene group of 1 to 5 carbon atoms, and most preferably a methylene group. Each Ra'$^{21}$ independently represents an alkyl group, an alkoxy group, a halogen atom, a halogenated alkyl group, —COOR″, —OC(=O)R″, a hydroxyalkyl group or a cyano group.

The alkyl group for Ra'$^{21}$ is preferably an alkyl group of 1 to 5 carbon atoms.

The alkoxy group for Ra'$^{21}$ is preferably an alkoxy group of 1 to 6 carbon atoms.

Further, the alkoxy group is preferably a linear or branched alkoxy group. Specific examples of the alkoxy groups include the aforementioned alkyl groups for Ra'$^{21}$ having an oxygen atom (—O—) bonded thereto.

As examples of the halogen atom for Ra'$^{21}$, a fluorine atom, chlorine atom, bromine atom and iodine atom can be given. Among these, a fluorine atom is preferable.

Examples of the halogenated alkyl group for Ra'$^{21}$ include groups in which part or all of the hydrogen atoms within the aforementioned alkyl group for Ra'$^{21}$ has been substituted with the aforementioned halogen atoms. As the halogenated alkyl group, a fluorinated alkyl group is preferable, and a perfluoroalkyl group is particularly desirable.

Specific examples of the groups represented by the aforementioned general formulae (a2-r-1) to (a2-r-7) are shown below.

[Chemical Formula 36]

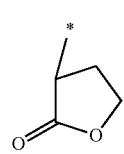
(r-Ic-1-1)

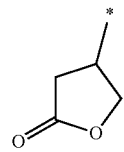
(r-Ic-1-2)

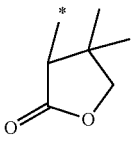
(r-Ic-1-3)

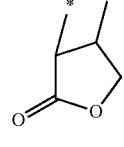
(r-Ic-1-4)

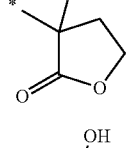
(r-Ic-1-5)

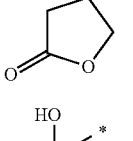
(r-Ic-1-6)

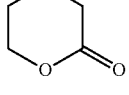
(r-Ic-1-7)

-continued
(r-Ic-2-1)
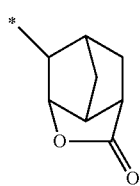
(r-Ic-2-2)
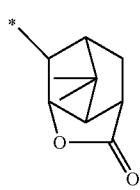
(r-Ic-2-3)
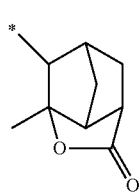
(r-Ic-2-4)
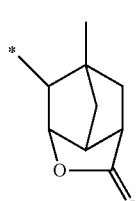
(r-Ic-2-5)
(r-Ic-2-6)
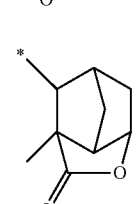
(r-Ic-2-7)
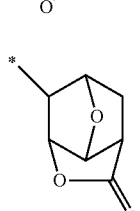
(r-Ic-2-8)
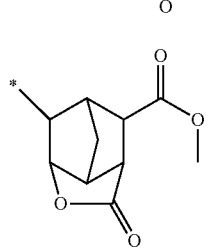
-continued
(r-Ic-2-9)
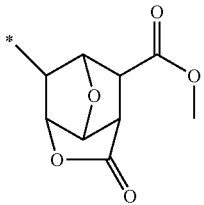
(r-Ic-2-10)
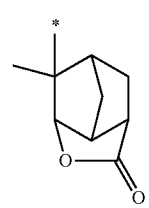
(r-Ic-2-11)
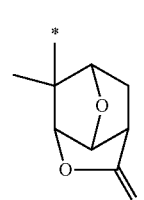
(r-Ic-2-12)
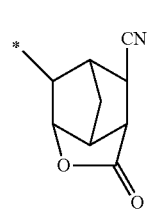
(r-Ic-2-13)
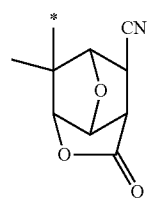
(r-Ic-3-1)
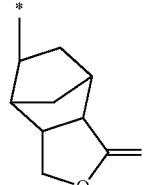
(r-Ic-3-2)

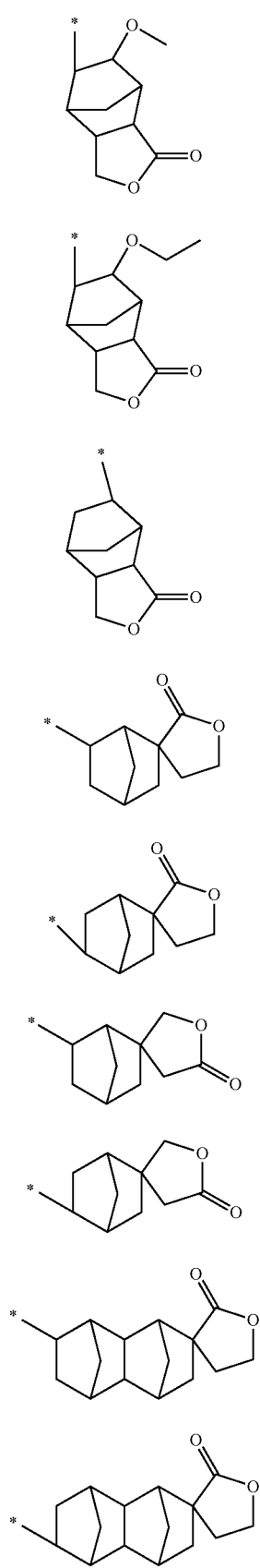
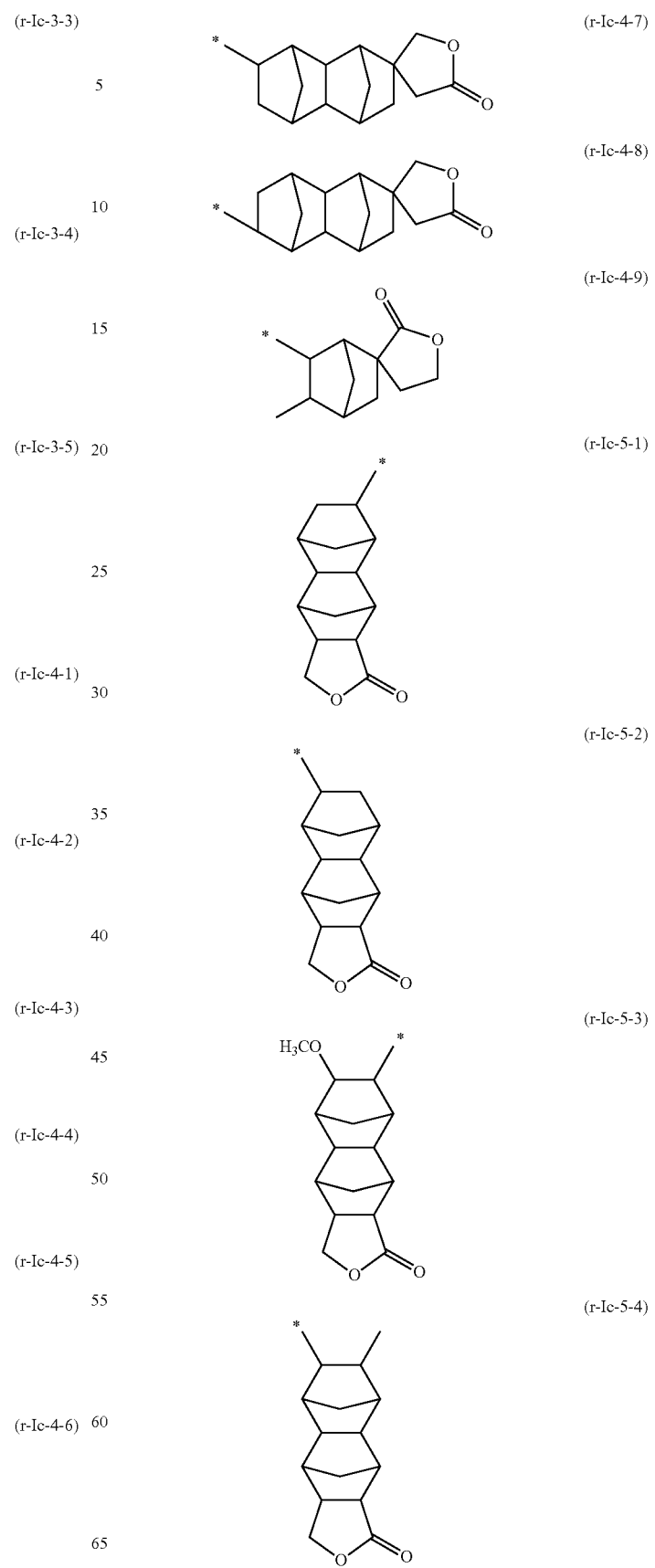

(r-Ic-6-1)

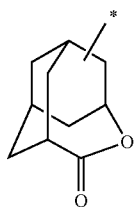

(r-Ic-7-1)

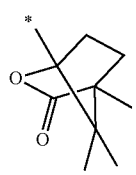

The term "carbonate-containing cyclic group" refers to a cyclic group including a ring containing a —O—C(=O)—O— structure (carbonate ring). The term "carbonate ring" refers to a single ring containing a —O—C(=O)—O— structure, and this ring is counted as the first ring. A carbonate-containing cyclic group in which the only ring structure is the carbonate ring is referred to as a monocyclic group, and groups containing other ring structures are described as polycyclic groups regardless of the structure of the other rings. The carbonate-containing cyclic group may be either a monocyclic group or a polycyclic group.

The carbonate-containing cyclic group as the cyclic hydrocarbon group for $R^1$ is not particularly limited, and an arbitrary group may be used. Specific examples include groups represented by general formulas (ax3-r-1) to (ax3-r-3) shown below.

[Chemical Formula 37]

(ax3-r-1)

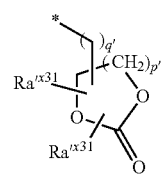

(ax3-r-2)

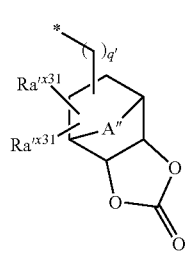

(ax3-r-3)

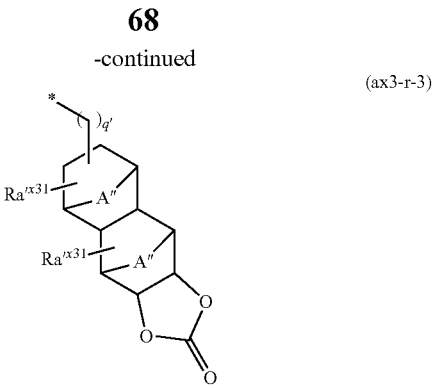

In the formulae, each $Ra'^{x31}$ independently represents a hydrogen atom, an alkyl group, an alkoxy group, a halogen atom, a halogenated alkyl group, a hydroxy group, —COOR", —OC(=O)R", a hydroxyalkyl group or a cyano group; R" represents a hydrogen atom or an alkyl group; A" represents an oxygen atom, a sulfur atom or an alkylene group of 1 to 5 carbon atoms which may contain an oxygen atom or a sulfur atom; and q' represents 0 or 1.

In general formulae (ax3-r-1) to (ax3-r-3), A" is the same as defined for A" in general formula (a1-r-1).

Examples of the alkyl group, alkoxy group, halogen atom, halogenated alkyl group, —COOR", —OC(=O)R" and hydroxyalkyl group for $Ra'^{31}$ include the same groups as those described above in the explanation of $Ra'^{21}$ in the general formulas (a2-r-1) to (a2-r-7).

Specific examples of the groups represented by the aforementioned general formulae (ax3-r-1) to (ax3-r-3) are shown below.

[Chemical Formula 38]

(r-cr-1-1)

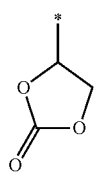

(r-cr-1-2)

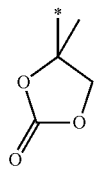

(r-cr-1-3)

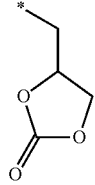

(r-cr-1-4)

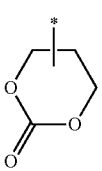

(r-cr-1-5)
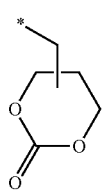
(r-cr-1-6)
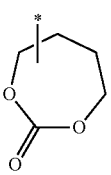
(r-cr-1-6)
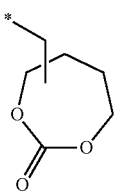
(r-cr-2-1)
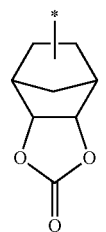
(r-cr-2-2)
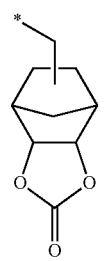
(r-cr-2-3)
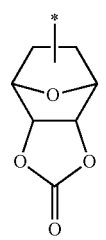
(r-cr-2-4)
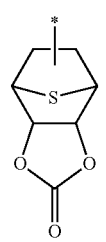
(r-cr-3-1)
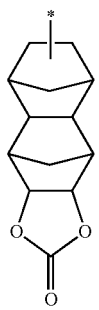
(r-cr-3-2)
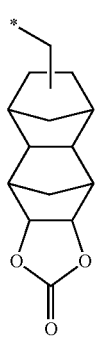
(r-cr-3-3)
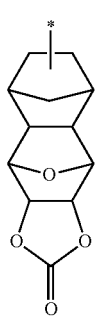
(r-cr-3-4)
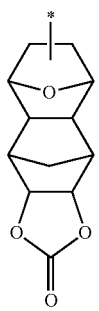
(r-cr-3-5)
Among these examples, as the lactone-containing cyclic group, a group represented by general formula (a2-r-1) or (a2-r-2) is preferable, and a group represented by the chemical formula (r-1c-1-1) is more preferable.

As the structural unit (a2) contained in the component (A1), 1 type of structural unit may be used, or 2 or more types may be used.

When the component (A1) contains the structural unit (a2), the amount of the structural unit (a2) based on the combined total of all structural units constituting the component (A1) is preferably 1 to 80 mol %, more preferably 5 to 70 mol %, still more preferably 10 to 65 mol %, and most preferably 10 to 60 mol %. When the amount of the structural unit (a2) is at least as large as the lower limit of the above-mentioned range, the effect of using the structural unit (a2) can be satisfactorily achieved. On the other hand, when the amount of the structural unit (a2) is no more than the upper limit of the above-mentioned range, a good balance can be achieved with the other structural units, and the pattern shape can be improved.

The component (A1) is preferably a copolymer containing the structural units (a0), (a1) and (a5), and more preferably a copolymer containing the structural units (a0), (a1), (a5) and (a3).

In the present invention, the weight average molecular weight (Mw) (the polystyrene equivalent value determined by gel permeation chromatography) of the component (A1) is not particularly limited, but is preferably 1,000 to 50,000, more preferably 1,500 to 30,000, and most preferably 2,000 to 20,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory. Further, the dispersity (Mw/Mn) is not particularly limited, but is preferably 1.0 to 5.0, more preferably 1.0 to 3.0, and most preferably 1.0 to 2.5. Here, Mn is the number average molecular weight.

As the component (A), one type may be used alone, or two or more types may be used in combination.

In the component (A), the amount of the component (A1) based on the total weight of the component (A) is preferably 25% by weight or more, more preferably 50% by weight or more, still more preferably 75% by weight or more, and may be even 100% by weight. When the amount of the component (A1) is 25% by weight or more, the pattern shape is improved.

In the resist composition of the present invention, as the component (A), one type may be used, or two or more types of compounds may be used in combination.

In the resist composition of the present invention, the amount of the component (A) can be appropriately adjusted depending on the thickness of the resist film to be formed, and the like.

[Optional Component]<Acid Generator Component; Component (B)>

The resist composition of the present invention may further include an acid generator component (B) (hereafter, referred to as "component (B)") which generates acid upon exposure. As the component (B), there is no particular limitation, and any of the known acid generators used in conventional chemically amplified resist compositions can be used.

Examples of these acid generators are numerous, and include onium salt acid generators such as iodonium salts and sulfonium salts; oxime sulfonate acid generators; diazomethane acid generators such as bisalkyl or bisaryl sulfonyl diazomethanes and poly(bis-sulfonyl)diazomethanes; nitrobenzylsulfonate acid generators; iminosulfonate acid generators; and disulfone acid generators. Among these, it is preferable to use an onium salt acid generator.

As the onium salt acid generator, a compound represented by general formula (b-1) below (hereafter, sometimes referred to as "component (b-1)"), a compound represented by general formula (b-2) below (hereafter, sometimes referred to as "component (b-2)") or a compound represented by general formula (b-3) below (hereafter, sometimes referred to as "component (b-3)") may be used.

[Chemical Formula 39]

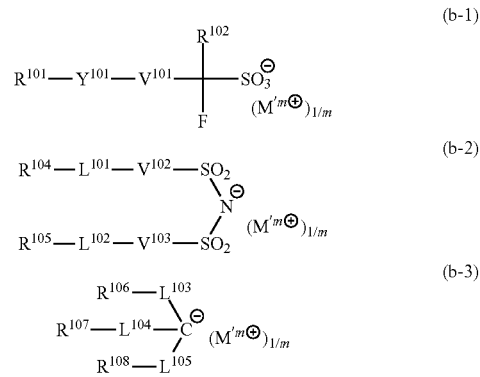

In the formulae, $R^{101}$ and $R^{104}$ to $R^{108}$ each independently represents a cyclic group which may have a substituent, a chain-like alkyl group which may have a substituent or a chain-like alkenyl group which may have a substituent, provided that $R^{104}$ and $R^{205}$ may be mutually bonded to form a ring; $R^{106}$ and $R^{107}$ may be mutually bonded to form a ring; $R^{102}$ represents a fluorine atom or a fluorinated alkyl group of 1 to 5 carbon atoms; $Y^{101}$ represents a single bond or a divalent linking group containing an oxygen atom; $V^{101}$ to $V^{103}$ each independently represents a single bond, an alkylene group or a fluorinated alkylene group; $L^{101}$ and $L^{102}$ each independently represents a single bond or an oxygen atom; $L^{103}$ to $L^{105}$ each independently represents a single bond, —CO— or —SO$_2$—; and $M^{m+}$ represents an organic cation having a valency of m (provided that the cation of a compound represented by the aforementioned formula (b1-1) is excluded).

{Anion Moiety} Anion Moiety of Component (b-1)

In the formula (b-1), $R^{101}$ represents a cyclic group which may have a substituent, a chain-like alkyl group which may have a substituent or a chain-like alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group.

As the aromatic hydrocarbon group for $R^{101}$, groups in which one hydrogen atom has been removed from an aromatic hydrocarbon ring described above in relation to the divalent aromatic hydrocarbon group for $Va^1$ in the formula (a1-1) or an aromatic compound containing two or more aromatic ring can be mentioned, and a phenyl group or a naphthyl group is preferable.

As the cyclic aliphatic hydrocarbon group for $R^{101}$, groups in which one hydrogen atom has been removed from a monocycloalkane or a polycycloalkane exemplified above in the explanation of the divalent aliphatic hydrocarbon group for Va$^1$ in the formula (a1-1) can be mentioned, and an adamantyl group or a norbornyl group is preferable.

Further, the cyclic hydrocarbon group for R$^{101}$ may contain a hetero atom like as a heterocycle, and specific examples thereof include lactone-containing cyclic groups represented by the aforementioned general formulas (a2-r-1) to (a2-r-7), —SO$_2$— containing cyclic groups represented by the aforementioned formulas (a5-r-1) to (a5-r-4) and heterocycles shown below.

[Chemical Formula 40]

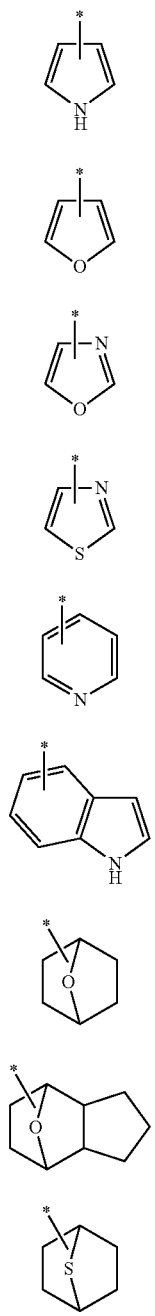

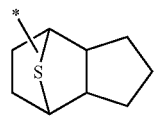
(r-hr-10)

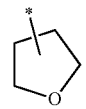
(r-hr-11)

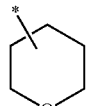
(r-hr-12)

(r-hr-13)

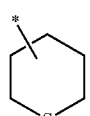
(r-hr-14)

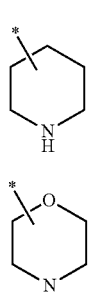
(r-hr-15)

(r-hr-16)

As the substituent for the cyclic hydrocarbon group for R$^{101}$, an alkyl group, an alkoxy group, a halogen atom, a halogenated alkyl group, a hydroxyl group, a carbonyl group, a nitro group or the like can be used.

The alkyl group as the substituent is preferably an alkyl group of 1 to 5 carbon atoms, and a methyl group, an ethyl group, a propyl group, an n-butyl group or a tert-butyl group is particularly desirable.

The alkoxy group as the substituent is preferably an alkoxy group having 1 to 5 carbon atoms, more preferably a methoxy group, ethoxy group, n-propoxy group, isopropoxy group, n-butoxy group or tert-butoxy group, and most preferably a methoxy group or an ethoxy group.

Examples of the halogen atom for the substituent include a fluorine atom, a chlorine atom, a bromine atom and an iodine atom, and a fluorine atom is preferable.

Example of the aforementioned halogenated alkyl group includes a group in which a part or all of the hydrogen atoms within an alkyl group of 1 to 5 carbon atoms (e.g., a methyl group, an ethyl group, a propyl group, an n-butyl group or a tert-butyl group) have been substituted with the aforementioned halogen atoms.

(Chain-Like Alkyl Group which May have a Substituent)

The chain-like alkyl group for R$^{101}$ may be linear or branched.

The linear alkyl group preferably has 1 to 20 carbon atoms, more preferably 1 to 15, and most preferably 1 to 10. Specific examples include a methyl group, an ethyl group, a propyl group, a butyl group, a pentyl group, a hexyl group, a heptyl group, an octyl group, a nonyl group, a decyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group and a docosyl group.

The branched alkyl group preferably has 3 to 20 carbon atoms, more preferably 3 to 15, and most preferably 3 to 10. Specific examples include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group and a 4-methylpentyl group.

(Chain-Like Alkenyl Group which May have a Substituent)

The chain-like alkenyl group for $R^{101}$ may be linear or branched, and preferably has 2 to 10 carbon atoms, more preferably 2 to 5 carbon atoms, still more preferably 2 to 4 carbon atoms, and most preferably 3 carbon atoms. Examples of linear alkenyl groups include a vinyl group, a propenyl group (an allyl group) and a butynyl group. Examples of branched alkenyl groups include a 1-methylpropenyl group and a 2-methylpropenyl group.

Among the above-mentioned examples, as the chain-like alkenyl group, a propenyl group is particularly desirable.

As the substituent for the chain-like alkyl group or alkenyl group for $R^{101}$, an alkoxy group, a halogen atom, a halogenated alkyl group, a hydroxyl group, a carbonyl group, a nitro group, an amino group, a cyclic group for $R^{101}$ or the like can be used.

Among these examples, as $R^{101}$, a cyclic group which may have a substituent is preferable, and a cyclic hydrocarbon group which may have a substituent is more preferable. Specifically, a phenyl group, a naphthyl group, a group in which one or more hydrogen atoms have been removed from a polycycloalkane, a lactone-containing cyclic group represented by any one of the aforementioned formula (a2-r-1) to (a2-r-7), and an —SO$_2$— containing cyclic group represented by any one of the aforementioned formula (a5-r-1) to (a5-r-4).

In formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of atoms other than an oxygen atom include a carbon atom, a hydrogen atom, a sulfur atom and a nitrogen atom.

Examples of divalent linking groups containing an oxygen atom include non-hydrocarbon, oxygen atom-containing linking groups such as an oxygen atom (an ether bond; —O—), an ester bond (—C(=O)—O—), an oxycarbonyl group (—O—C(=O)—), an amido bond (—C(=O)—NH—), a carbonyl group (—C(=O)—) and a carbonate bond (—O—C(=O)—O—); and combinations of the aforementioned non-hydrocarbon, hetero atom-containing linking groups with an alkylene group. Furthermore, the combinations may have a sulfonyl group (—SO$_2$—) bonded thereto. As the combination, the linking group represented by formulas (y-a1-1) to (y-a1-7) shown below can be mentioned.

[Chemical Formula 41]

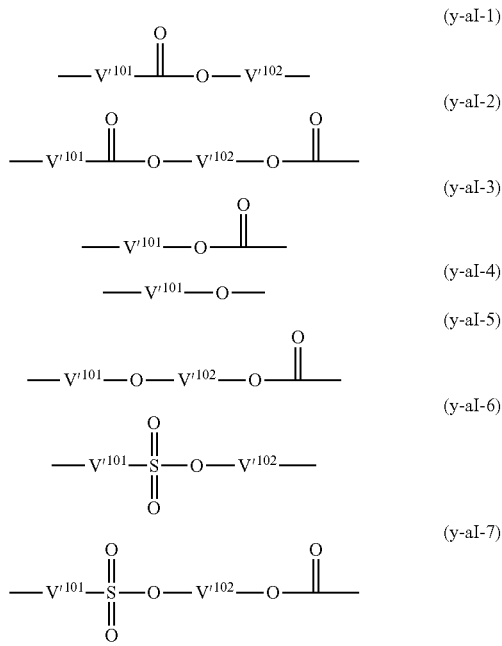

In the formulae, $V'^{101}$ represents a single bond or an alkylene group of 1 to 5 carbon atoms; $V'^{102}$ represents a divalent saturated hydrocarbon group of 1 to 30 carbon atoms.

The divalent saturated hydrocarbon group for $V'^{102}$ is preferably an alkylene group of 1 to 30 carbon atoms.

The alkylene group for $V'^{101}$ and $V'^{102}$ may be a linear alkylene group or a branched alkylene group, and a linear alkylene group is preferable.

Specific examples of the alkylene group for $V'^{101}$ and $V'^{102}$ include a methylene group [—CH$_2$]; an alkylmethylene group, such as —CH(CH$_3$)—, —CH(CH$_2$CH$_3$)—, —C(CH$_3$)$_2$—, —C(CH$_3$)(CH$_2$CH$_3$)—, —C(CH$_3$)(CH$_2$CH$_2$CH$_3$)— and —C(CH$_2$CH$_3$)$_2$—; an ethylene group [—CH$_2$CH$_2$—]; an alkylethylene group, such as —CH(CH$_3$)CH$_2$—, —CH(CH$_3$)CH(CH$_3$)—, —C(CH$_3$)$_2$CH$_2$— and —CH(CH$_2$CH$_3$)CH$_2$—; a trimethylene group (n-propylene group) [—CH$_2$CH$_2$CH$_2$—]; an alkyltrimethylene group, such as —CH(CH$_3$)CH$_2$CH$_2$— and —CH$_2$CH(CH$_3$)CH$_2$—; a tetramethylene group [—CH$_2$CH$_2$CH$_2$CH$_2$—]; an alkyltetramethylene group, such as —CH(CH$_3$)CH$_2$CH$_2$CH$_2$—, —CH$_2$CH(CH$_3$)CH$_2$CH$_2$—; and a pentamethylene group [—CH$_2$CH$_2$CH$_2$CH$_2$CH$_2$—].

Further, part of methylene group within the alkylene group for $V'^{101}$ and $V'^{102}$ may be substituted with a divalent aliphatic cyclic group of 5 to 10 carbon atoms. The aliphatic cyclic group is preferably a divalent group in which one hydrogen atom has been removed from the cyclic aliphatic hydrocarbon group for Ra'$^3$ in the aforementioned formula (a1-r-1), and a cyclohexylene group, 1,5-adamantylene group or 2,6-adamantylene group is preferable.

$Y^{101}$ is preferably a divalent linking group containing an ether bond or an ester bond, and groups represented by the aforementioned formulas (y-a1-1) to (y-a1-5) are preferable.

In formula (b-1), $V^{101}$ represents a single bond, an alkylene group or a fluorinated alkylene group. The alkylene group and the fluorinated alkylene group for $V^{101}$ preferably have 1 to 4 carbon atoms. Examples of the fluorinated alkylene group for $V^{101}$ include a group in which part or all of the hydrogen atoms within the alkylene group for $V^{101}$ have been substituted with fluorine. Among these examples, as $V^{101}$, a single bond or a fluorinated alkylene group of 1 to 4 carbon atoms is preferable.

In formula (b-1), $R^{102}$ represents a fluorine atom or a fluorinated alkyl group of 1 to 5 carbon atoms. $R^{102}$ is preferably a fluorine atom or a perfluoroalkyl group of 1 to 5 carbon atoms, and more preferably a fluorine atom.

As specific examples of anion moieties of the formula (b-1), in the case where $Y^{101}$ a single bond, a fluorinated alkylsulfonate anion such as a trifluoromethanesulfonate anion or a perfluorobutanesulfonate anion can be mentioned; and in the case where $Y^{101}$ represents a divalent linking group containing an oxygen atom, anions represented by formulae (an-1) to (an-3) shown below can be mentioned.

[Chemical Formula 42]

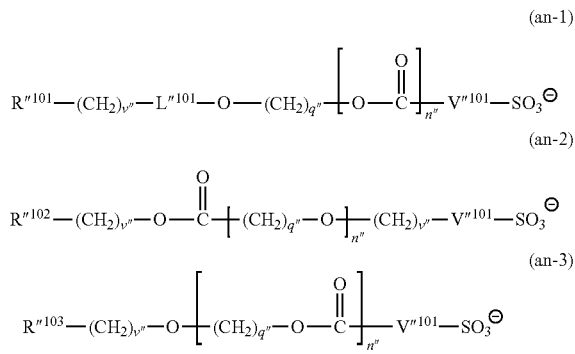

In the formulae, $R'''^{101}$ represents an aliphatic cyclic group which may have a substituent, a group represented by any one of the aforementioned formulae (r-hr-1) to (r-hr-6) or a chain-like alkyl group which may have a substituent; $R'''^{102}$ represents an aliphatic cyclic group which may have a substituent, a lactone-containing cyclic group represented by any one of the aforementioned formulae (a2-r-1) to (a2-r-7) or an —$SO_2$— containing cyclic group represented by any one of the aforementioned formulae (a5-r-1) to (a5-r-4); $R'''^{103}$ represents an aromatic cyclic group which may have a substituent, an aliphatic cyclic group which may have a substituent or a chain-like alkenyl group which may have a substituent; $V'''^{101}$, represents a fluorinated alkylene group; $L'''^{101}$ represents —C(=O)— or —$SO_2$—; v'' represents an integer of 0 to 3; q'' represents an integer of 1 to 20; and n'' represents 0 or 1.

As the aliphatic cyclic group for $R'''^{101}$, $R'''^{102}$ and $R'''^{103}$ which may have a substituent, the same groups as the cyclic aliphatic hydrocarbon group for $R^{101}$ described above are preferable. As the substituent, the same groups as those described above for substituting the cyclic aliphatic hydrocarbon group for $R^{101}$ can be mentioned.

As the aromatic cyclic group for $R'''^{103}$ which may have a substituent, the same groups as the aromatic hydrocarbon group for the cyclic hydrocarbon group represented by $R^{101}$ described above are preferable. The substituent is the same as defined for the substituent for the aromatic hydrocarbon group represented by $R^{101}$.

As the chain-like alkyl group for $R'''^{101}$ which may have a substituent, the same groups as those described above for $R^{101}$ are preferable. As the chain-like alkenyl group for $R'''^{103}$ which may have a substituent, the same groups as those described above for $R^{101}$ are preferable. $V'''^{101}$ is preferably a fluorinated alkylene group of 1 to 3 carbon atoms, and most preferably —$CF_2$—, —$CF_2CF_2$—, —$CHFCF_2$—, —$CF(CF_3)CF_2$— or —$CH(CF_3)CF_2$—.

Anion Moiety of Component (b-2)

In formula (b-2), $R^{104}$ and $R^{105}$ each independently represents a cyclic group which may have a substituent, a chain-like alkyl group which may have a substituent or a chain-like alkenyl group which may have a substituent, and is the same as defined for $R^{101}$ in formula (b-1). $R^{104}$ and $R^{105}$ may be mutually bonded to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group preferably has 1 to 10 carbon atoms, more preferably 1 to 7 carbon atoms, and still more preferably 1 to 3 carbon atoms. The smaller the number of carbon atoms of the chain-like alkyl group for $R^{104}$ and $R^{105}$, the more the solubility in a resist solvent is improved. Further, in the chain-like alkyl group for $R^{104}$ and $R^{105}$, it is preferable that the number of hydrogen atoms substituted with fluorine atoms is as large as possible because the acid strength increases and the transparency to high energy radiation of 200 nm or less or electron beam is improved. The fluorination ratio of the chain-like alkyl group is preferably from 70 to 100%, more preferably from 90 to 100%, and it is particularly desirable that the chain-like alkyl group be a perfluoroalkyl group in which all hydrogen atoms are substituted with fluorine atoms.

In formula (b-2), $V^{102}$ and $V^{103}$ each independently represents a single bond, an alkylene group or a fluorinated alkylene group, and is the same as defined for $V^{101}$ in formula (b-1).

In formula (b-2), $L^{101}$ and $L^{102}$ each independently represents a single bond or an oxygen atom.

Anion Moiety of Component (b-3)

In formula (b-3), $R^{106}$ to $R^{108}$ each independently represents a cyclic group which may have a substituent, a chain-like alkyl group which may have a substituent or a chain-like alkenyl group which may have a substituent, and is the same as defined for $R^{101}$ in formula (b-1).

$L^{103}$ to $L^{105}$ each independently represents a single bond, —CO— or —$SO_2$—.

{Cation Moiety}

In formulae (b-1), (b-2) and (b-3), $M'^{m+}$ represents an organic cation having a valency of m other than the cation moiety of the compound represented by the aforementioned formula (b1-1), preferably a sulfonium cation or an iodonium cation, and most preferably a cation represented by any one of formulae (ca-1) to (ca-4) shown below.

[Chemical Formula 43]

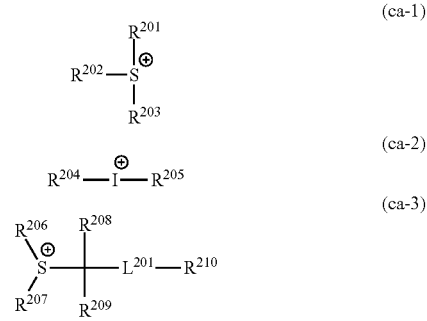

-continued (ca-4)

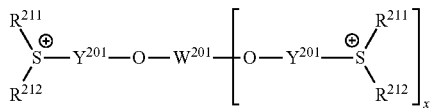

[ca-r-7]

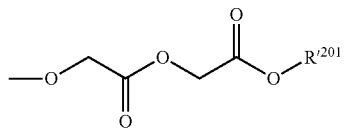

In the formulae, $R^{201}$ to $R^{207}$, $R^{211}$ and $R^{212}$ independently represents an aryl group, an alkyl group or an alkenyl group, provided that two of $R^{201}$ to $R^{203}$, $R^{206}$ and $R^{207}$, or $R^{211}$ and $R^{212}$ may be mutually bonded to form a ring with the sulfur atom; $R^{208}$ and $R^{209}$ each independently represents a hydrogen atom or an alkyl group of 1 to 5 carbon atoms; $R^{210}$ represents an aryl group which may have a substituent, an alkyl group which may have a substituent, an alkenyl group which may have a substituent or an —$SO_2$— containing cyclic group which may have a substituent; $L^{201}$ represents —C(=O)— or —C(=O)—O—; $Y^{201}$ each independently represents an arylene group, an alkylene group or an alkenylene group; x represents 1 or 2; and $W^{201}$ represents a linking group having a valency of (x+1).

As the aryl group for $R^{201}$ to $R^{207}$, $R^{211}$ and $R^{212}$, an unsubstituted aryl group of 6 to 20 carbon atoms can be mentioned, and a phenyl group or a naphthyl group is preferable.

The alkyl group $R^{201}$ to $R^{207}$, $R^{211}$ and $R^{212}$ is preferably a chain-like or cyclic alkyl group having 1 to 30 carbon atoms.

The alkenyl group for $R^{201}$ to $R^{207}$, $R^{211}$ and $R^{212}$ preferably has 2 to 10 carbon atoms.

Specific examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, an arylthio group and groups represented by formulae (ca-r-1) to (ca-r-7) shown below.

The aryl group within the arylthio group as the substituent is the same as defined for $R^{101}$, and specific examples include a phenylthio group and a biphenylthio group.

[Chemical Formula 44]

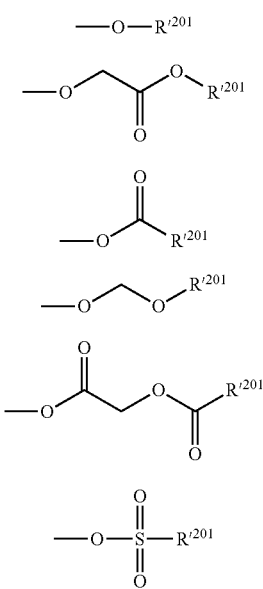

[ca-r-1]
[ca-r-2]
[ca-r-3]
[ca-r-4]
[ca-r-5]
[ca-r-6]

In the formulae, $R'^{201}$ each independently represents a hydrogen atom, a cyclic group which may have a substituent, a chain-like alkyl group which may have a substituent or a chain-like alkenyl group which may have a substituent.

As the cyclic group which may have a substituent, the chain-like alkyl group which may have a substituent and the chain-like alkenyl group which may have a substituent for $R'^{201}$, the same groups as those described above for $R^{101}$ can be mentioned. As the cyclic group which may have a substituent and chain-like alkyl group which may have a substituent, the same groups as those described above for the acid dissociable group represented by the aforementioned formula (a1-r-2) can be also mentioned.

When $R^{201}$ to $R^{203}$, $R^{206}$, $R^{207}$, $R^{211}$ and $R^{212}$ are mutually bonded to form a ring with the sulfur atom, these groups may be mutually bonded via a hetero atom such as a sulfur atom, an oxygen atom or a nitrogen atom, or a functional group such as a carbonyl group, —SO—, —$SO_2$—, —$SO_3$—, —COO—, —CONH— or —N($R_N$)— (wherein $R_N$ represents an alkyl group of 1 to 5 carbon atoms). The ring containing the sulfur atom in the skeleton thereof is preferably a 3 to 10-membered ring, and most preferably a 5 to 7-membered ring. Specific examples of the ring formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represents a hydrogen atom or an alkyl group of 1 to 5 carbon atoms, preferably a hydrogen atom or an alkyl group of 1 to 3 carbon atoms, and when $R^{208}$ and $R^{209}$ each represents an alkyl group, $R^{208}$ and $R^{209}$ may be mutually bonded to form a ring.

$R^{210}$ represents an aryl group which may have a substituent, an alkyl group which may have a substituent, an alkenyl group which may have a substituent, or an —$SO_2$— containing cyclic group which may have a substituent.

Examples of the aryl group for $R^{210}$ include an unsubstituted aryl group of 6 to 20 carbon atoms, and a phenyl group or a naphthyl group is preferable.

As the alkyl group for $R^{210}$, a chain-like or cyclic alkyl group having 1 to 30 carbon atoms is preferable.

The alkenyl group for $R^{210}$ preferably has 2 to 10 carbon atoms.

As the —$SO_2$— containing cyclic group for $R^{210}$ which may have a substituent, the same "—$SO_2$— containing cyclic groups" as those described above for $Ra^{21}$ in the aforementioned general formula (a2-1) can be mentioned, and the group represented by the aforementioned general formula (a5-r-1) is preferable.

Each $Y^{201}$ independently represents an arylene group, an alkylene group or an alkenylene group.

Examples of the arylene group for $Y^{201}$ include groups in which one hydrogen atom has been removed from an aryl group given as an example of the aromatic hydrocarbon group for $R^{101}$ in the aforementioned formula (b-1).

The alkylene group and the alkenylene group for $Y^{201}$ is the same as defined for the aliphatic hydrocarbon group as the divalent linking group represented by $Va^1$ in the aforementioned general formula (a1-1).

In the formula (ca-4), x represents 1 or 2.

$W^{201}$ represents a linking group having a valency of (x+1), i.e., a divalent or trivalent linking group.

As the divalent linking group for $W^{201}$, a divalent hydrocarbon group which may have a substituent is preferable, and as examples thereof, the same hydrocarbon groups as those described above for $Ya^{21}$ in the general formula (a2-1) can be mentioned. The divalent linking group for $W^{201}$ may be linear, branched or cyclic, and cyclic is more preferable. Among these, an arylene group having two carbonyl groups, each bonded to the terminal thereof is preferable. Examples of the arylene group include a phenylene group and a naphthylene group, and a phenylene group is particularly desirable.

As the trivalent linking group for $W^{201}$, a group in which one hydrogen atom has been removed from the aforementioned divalent linking group for $W^{201}$ and a group in which the divalent linking group has been bonded to another divalent linking group can be mentioned. The trivalent linking group for $W^{201}$ is preferably a group in which 2 carbonyl groups are bonded to an arylene group.

Specific examples of preferable cations represented by formula (ca-1) include cations represented by formulae (ca-1-1) to (ca-1-63) shown below.

[Chemical Formula 45]

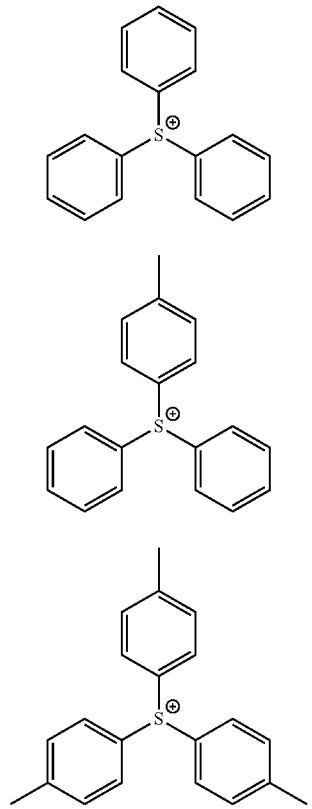

(ca-1-1)

(ca-1-2)

(ca-1-3)

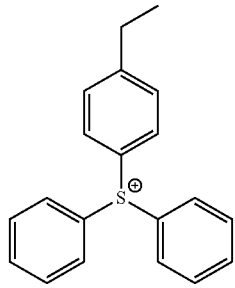

(ca-1-4)

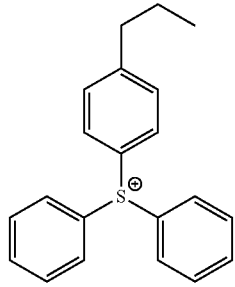

(ca-1-5)

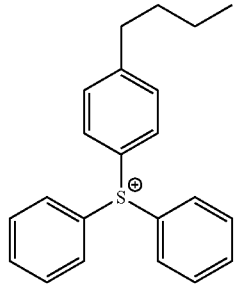

(ca-1-6)

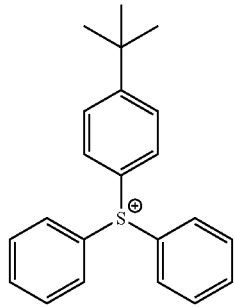

(ca-1-7)

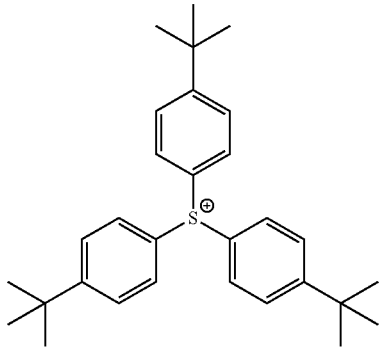

(ca-1-8)

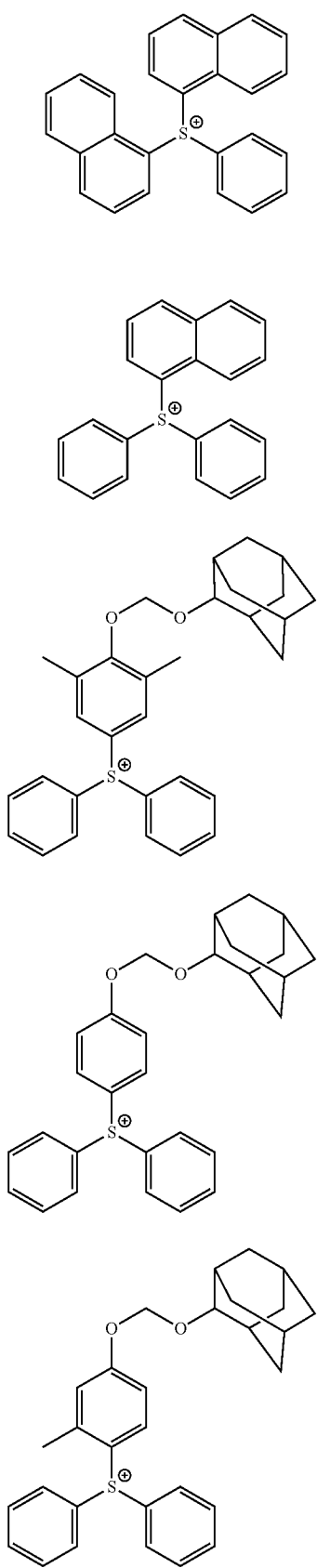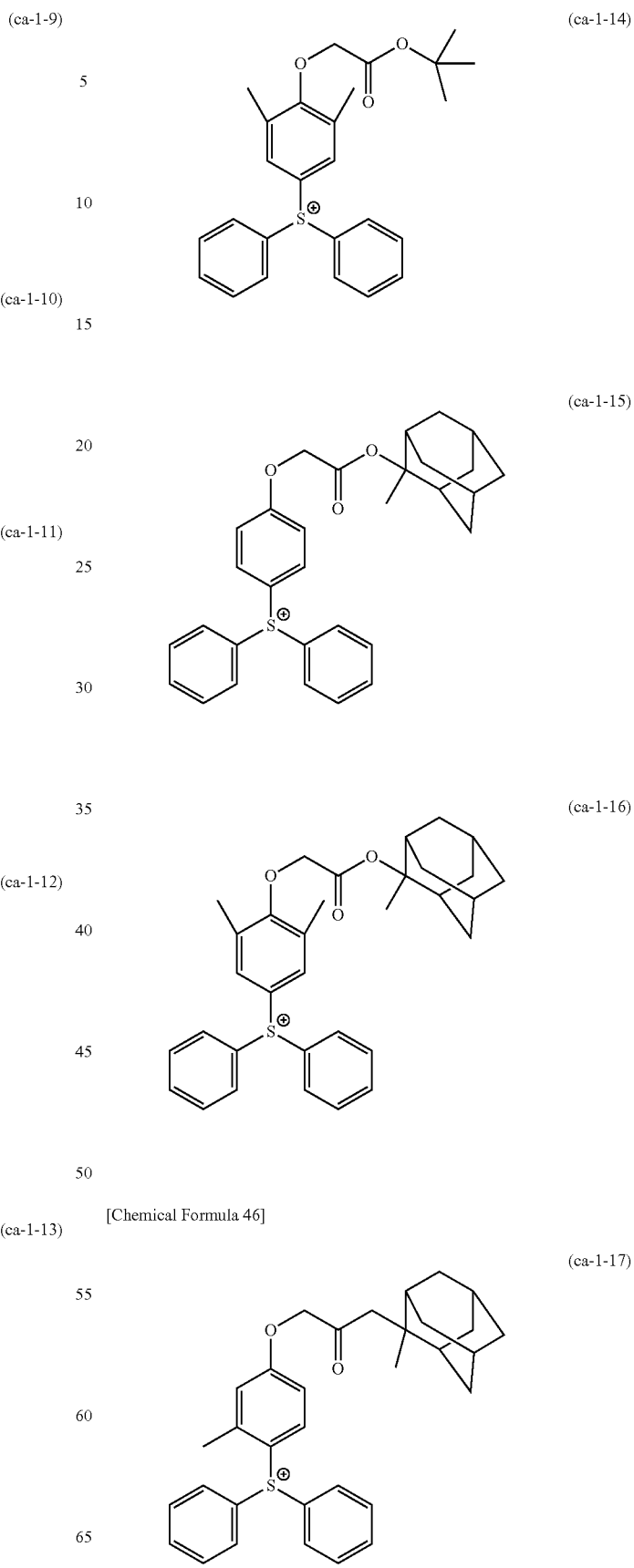

-continued
(ca-1-18)
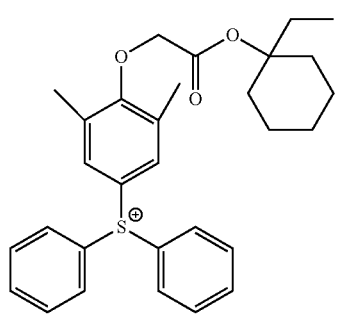
(ca-1-19)
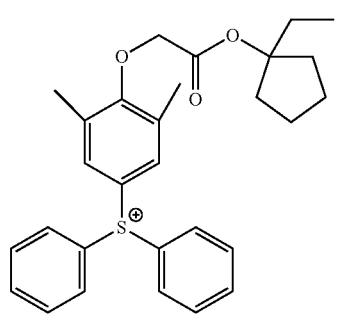
(ca-1-20)
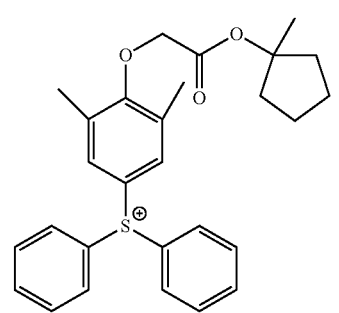
(ca-1-21)
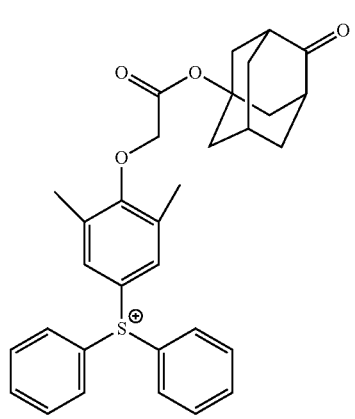
(ca-1-22)
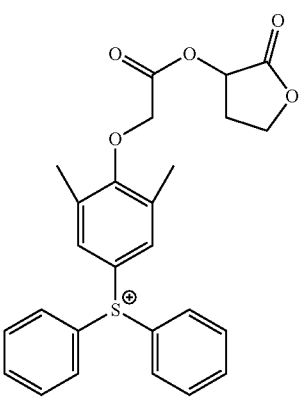
(ca-1-23)
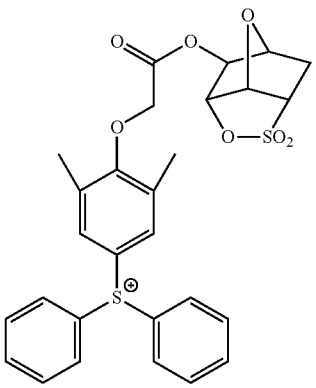
(ca-1-24)
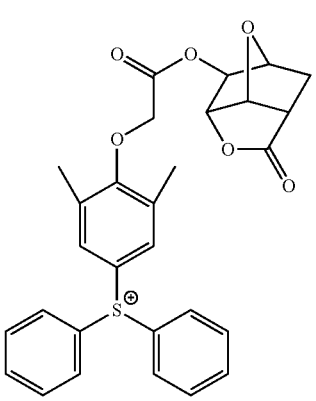
(ca-1-25)
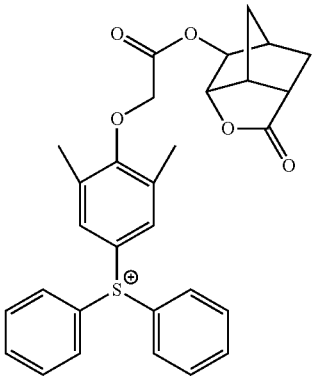

-continued
(ca-1-26)
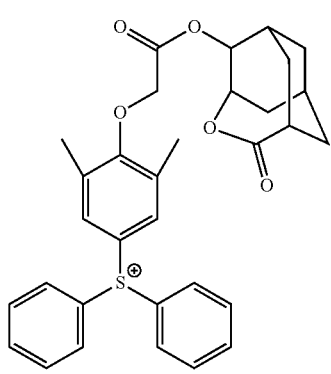
(ca-1-27)
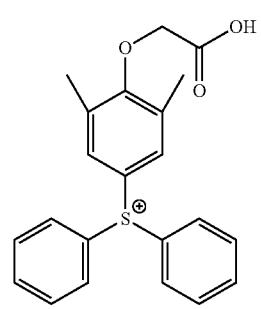
(ca-1-28)
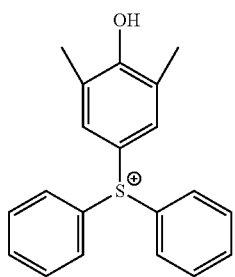
(ca-1-29)
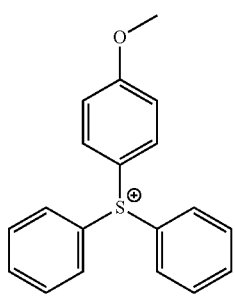
(ca-1-30)
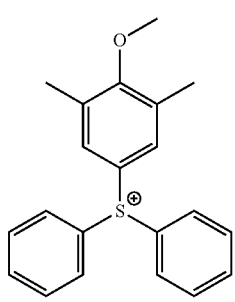
-continued
(ca-1-31)
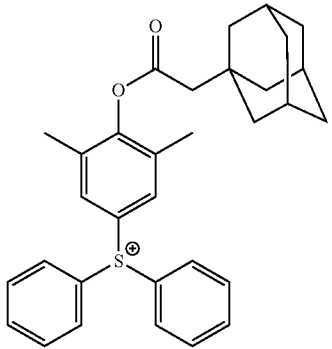
(ca-1-32)
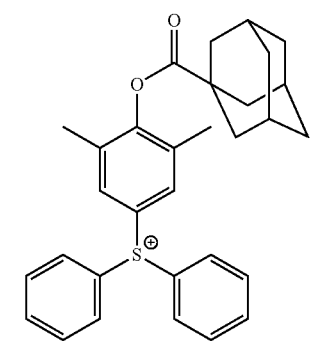
(ca-1-33)
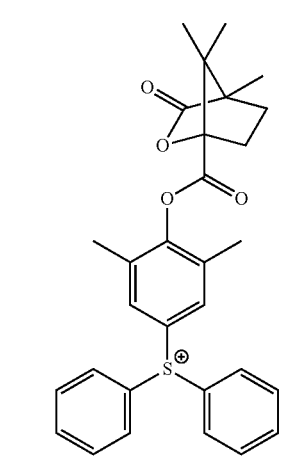
[Chemical Formula 47]
(ca-1-34)
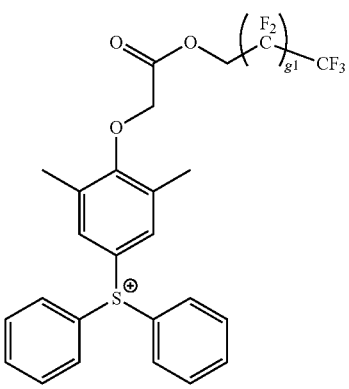

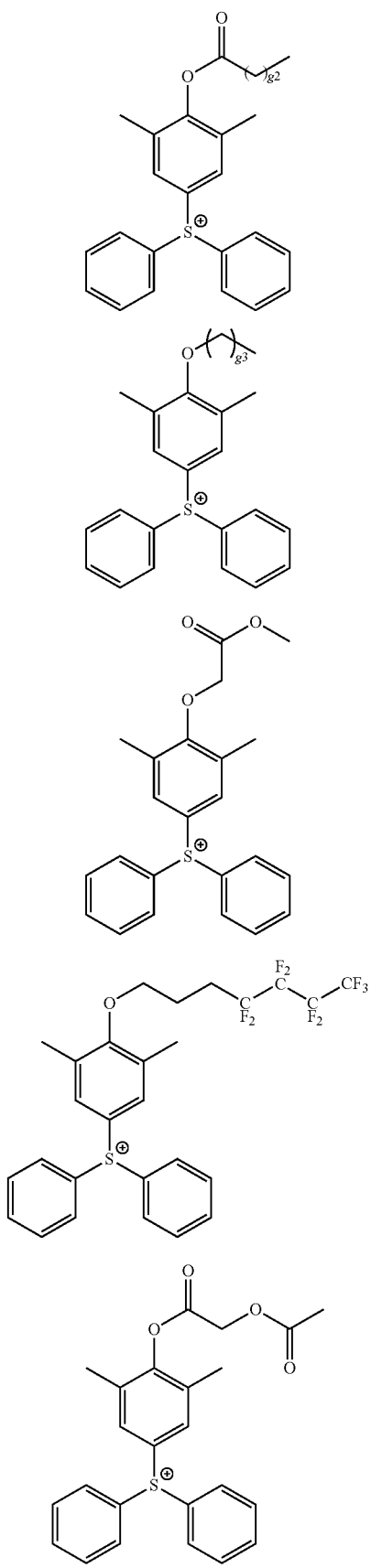
(ca-1-35)
(ca-1-36)
(ca-1-37)
(ca-1-38)
(ca-1-39)
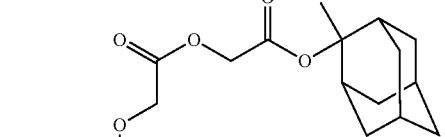
(ca-1-40)
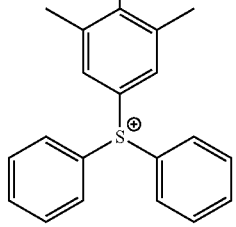
(ca-1-41)
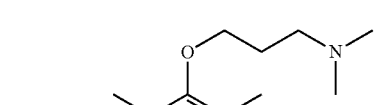
(ca-1-42)
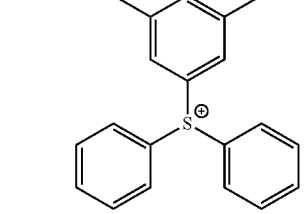
(ca-1-43)
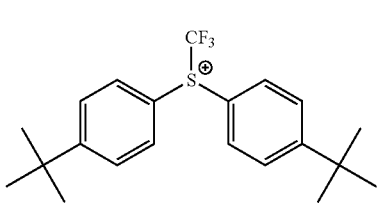
(ca-1-44)
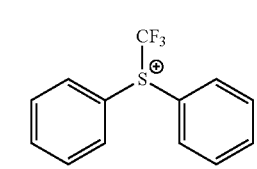
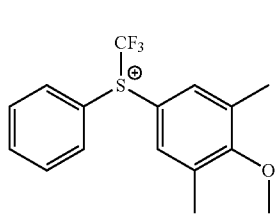
(ca-1-45)
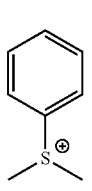
(ca-1-46)

(ca-1-47)
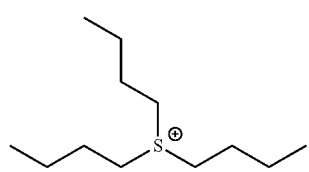
(ca-1-48)
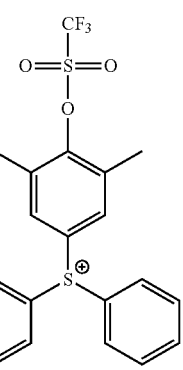
In the formulae, g1, g2 and g3 represent recurring numbers, wherein g1 is an integer of 1 to 5, g2 is an integer of 0 to 20, and g3 is an integer of 0 to 20.
[Chemical Formula 48]
(ca-1-49)
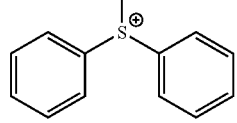
(ca-1-50)
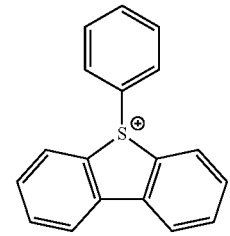
(ca-1-51)
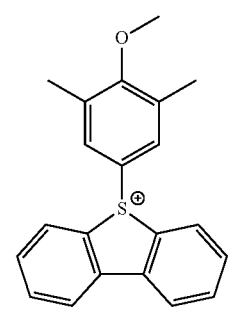
(ca-1-52)
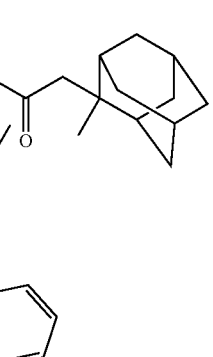
(ca-1-53)
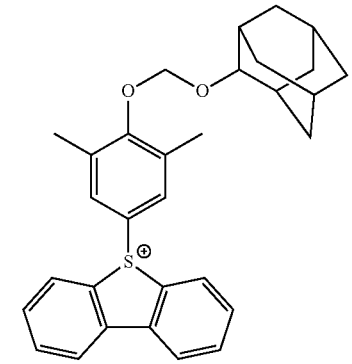
(ca-1-54)
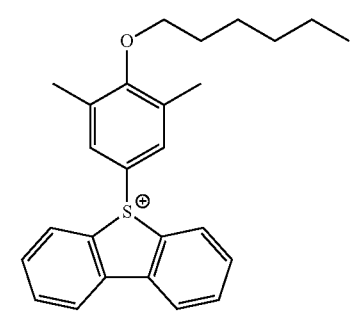
(ca-1-55)
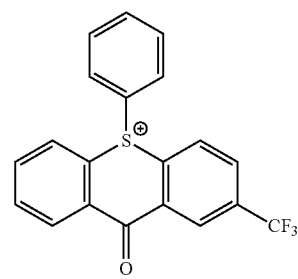
(ca-1-56)
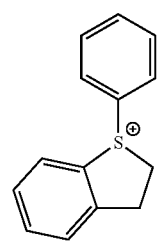

(ca-1-57) 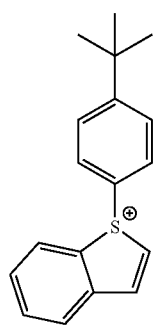

(ca-1-58) 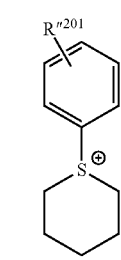

(ca-1-59) 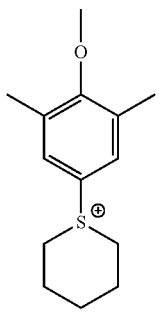

(ca-1-60) 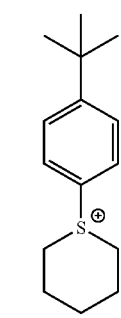

(ca-1-61) 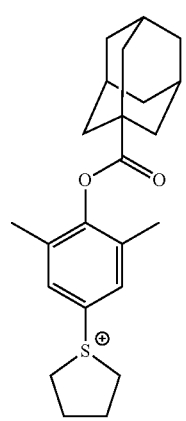

(ca-1-62) 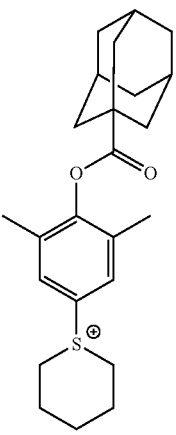

(ca-1-63) 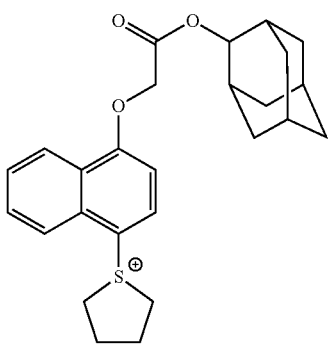

In the formulae, $R''^{201}$ represents a hydrogen atom or a substituent, and as the substituent, the same groups as those described above for substituting $R^{201}$ to $R^{207}$ and $R^{210}$ to $R^{212}$ can be mentioned.

Specific examples of preferable cations represented by formula (ca-3) include cations represented by formulae (ca-3-1) to (ca-3-6) shown below.

[Chemical Formula 49]

(ca-3-1) 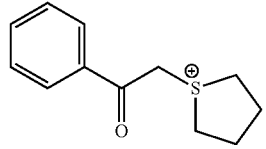

(ca-3-2) 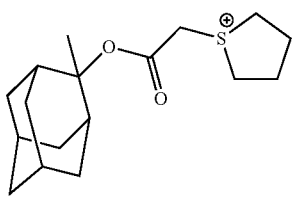

(ca-3-3) 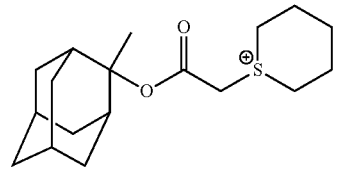

-continued (ca-3-4)
(ca-3-5)
(ca-3-6)

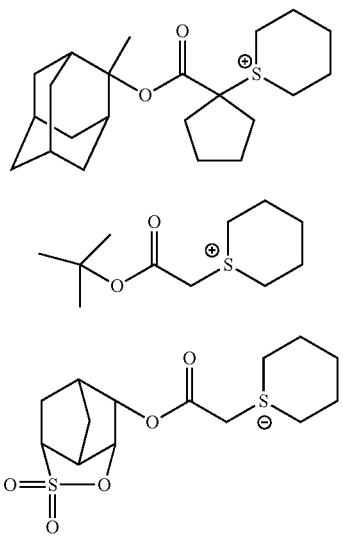

Specific examples of preferable cations represented by formula (ca-4) include cations represented by formulae (ca-4-1) and (ca-4-2) shown below.

[Chemical Formula 50]

(ca-4-1)

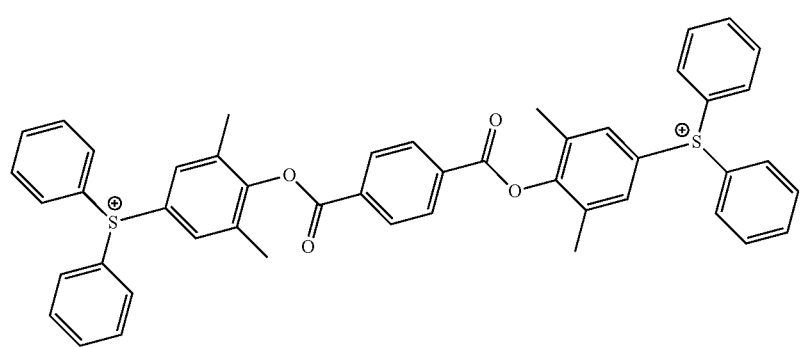

(ca-4-2)

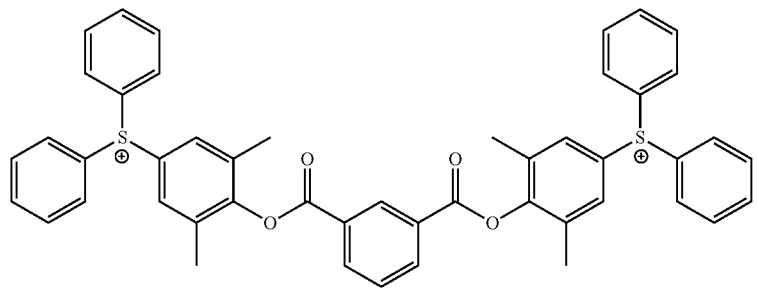

As the component (B), one type of these acid generators may be used alone, or two or more types may be used in combination.

When the resist composition of the present invention contains the component (B), the amount of the component (B) relative to 100 parts by weight of the component (A) is preferably within a range from 0.5 to 60 parts by weight, more preferably from 1 to 50 parts by weight, and still more preferably from 1 to 40 parts by weight. When the amount of the component (B) is within the above-mentioned range, formation of a resist pattern can be satisfactorily performed. Further, by virtue of the above-mentioned range, when each of the components are dissolved in an organic solvent, a uniform solution can be obtained and the storage stability becomes satisfactory.

<Basic Compound Component; Component (D)>

Moreover, the resist composition of the present invention may include an acid diffusion control agent component (hereafter, frequently referred to as "component (D)"), in addition to the component (A), or in addition to the component (A) and the component (B).

The component (D) functions as an acid diffusion control agent, i.e., a quencher which traps the acid generated from the component (B) and the like upon exposure.

In the present invention, the component (D) may be a photodecomposable base (D1) (hereafter, referred to as "component (D1)") which is decomposed upon exposure and then loses the ability of controlling of acid diffusion, or a nitrogen-containing organic compound (D2) (hereafter, referred to as "component (D2)") which does not fall under the definition of component (D1).

[Component (D1)]

When a resist pattern is formed using a resist composition containing the component (D1), the contrast between exposed portions and unexposed portions is improved.

The component (D1) is not particularly limited, as long as it is decomposed upon exposure and then loses the ability of controlling of acid diffusion. As the component (D1), at least one compound selected from the group consisting of a compound represented by general formula (d1-1) shown below (hereafter, referred to as "component (d1-1)"), a compound represented by general formula (d1-2) shown below (hereafter, referred to as "component (d1-2)") and a compound represented by general formula (d1-3) shown below (hereafter, referred to as "component (d1-3)") is preferably used.

At exposed portions, the components (d1-1) to (d1-3) are decomposed and then lose the ability of controlling of acid diffusion (i.e., basicity), and therefore the components (d1-1) to (d1-3) cannot function as a quencher, whereas at unexposed portions, the components (d1-1) to (d1-3) functions as a quencher.

[Chemical Formula 51]

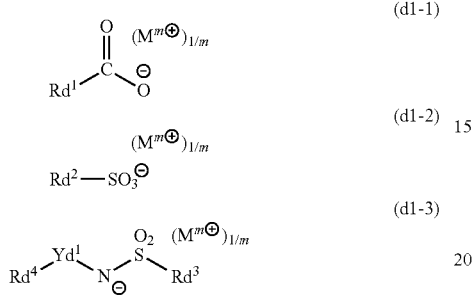

In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom within the $Rd^2$ in the formula (d1-2) has no fluorine atom bonded thereto; $Yd^1$ represents a single bond or a divalent linking group; and $M^{m+}$ each independently represents a cation having a valency of m.

{Component (d1-1)}—Anion Moiety

In formula (d1-1), $Rd^1$ represents a cyclic group which may have a substituent, a chain-like alkyl group which may have a substituent or a chain-like alkenyl group which may have a substituent, and is the same groups as those defined above for $R^{101}$.

Among these, as the group for $Rd^1$, an aromatic hydrocarbon group which may have a substituent, an aliphatic cyclic group which may have a substituent and a chain-like hydrocarbon group which may have a substituent are preferable. As the substituents which these groups may have, a fluorine atom or a fluorinated alkyl group is preferable.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

As the chain-like hydrocarbon group, a chain-like alkyl group is preferable. The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group or a 4-methylpentyl group.

In the case where the chain-like alkyl group is a fluorinated alkyl group having a fluorine atom or a fluorinated alkyl group, the fluorinated alkyl group preferably has 1 to 11 carbon atoms, more preferably 1 to 8 carbon atoms, and still more preferably 1 to 4 carbon atoms. The fluorinated alkyl group may contain an atom other than fluorine.

Examples of the atom other than fluorine include an oxygen atom, a carbon atom, a hydrogen atom, a sulfur atom and a nitrogen atom.

As $Rd^1$, a fluorinated alkyl group in which part or all of the hydrogen atoms constituting a linear alkyl group have been substituted with fluorine atom(s) is preferable, and a fluorinated alkyl group in which all of the hydrogen atoms constituting a linear alkyl group have been substituted with fluorine atoms (i.e., a linear perfluoroalkyl group) is more preferable.

Specific examples of preferable anion moieties for the component (d1-1) are shown below.

[Chemical Formula 52]

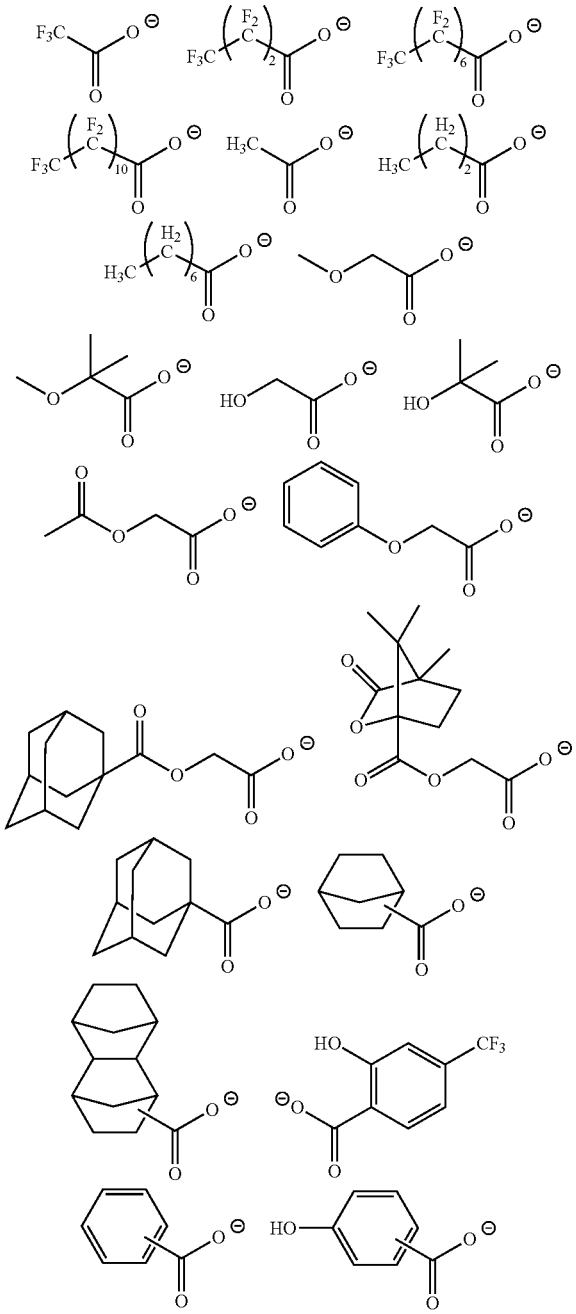

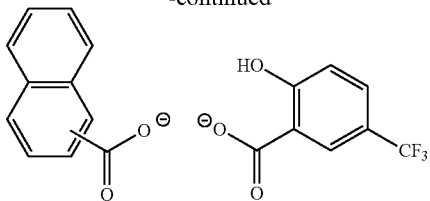

Cation Moiety

In formula (d1-1), $M^{m+}$ represents an organic cation having a valency of m.

The organic cation for $M^{m+}$ is not particularly limited, and examples thereof include the same cation moieties as those represented by the aforementioned formulas (ca-1) to (ca-4), and cation moieties represented by the aforementioned formulas (ca-1-1) to (ca-1-63) are preferable.

As the component (d1-1), one type of compound may be used, or two or more types of compounds may be used in combination.

{Component (d1-2)}—Anion Moiety

In formula (d1-2), $Rd^2$ represents a cyclic group which may have a substituent, a chain-like alkyl group which may have a substituent or a chain-like alkenyl group which may have a substituent, and is the same groups as those defined above for $R^{101}$, provided that, the carbon atom adjacent to the sulfur atom within $Rd^2$ group has no fluorine atom bonded thereto (i.e., the carbon atom adjacent to the sulfur atom within $Rd^2$ group does not substituted with a fluorine atom). As a result, the anion of the component (d1-2) becomes an appropriately weak acid anion, thereby improving the quenching ability of the component (D).

As $Rd^2$, an aliphatic cyclic group which may have a substituent is preferable, and a group in which one or more hydrogen atoms have been removed from adamantane, norbornane, isobornane, tricyclodecane, tetracyclododecane or camphor (which may have a substituent) is more preferable.

The hydrocarbon group for $Rd^2$ may have a substituent. As the substituent, the same groups as those described above for substituting the hydrocarbon group (e.g., aromatic hydrocarbon group, aliphatic hydrocarbon group) for $Rd^1$ in the formula (d1-1) can be mentioned.

Specific examples of preferable anion moieties for the component (d1-2) are shown below.

[Chemical Formula 53]

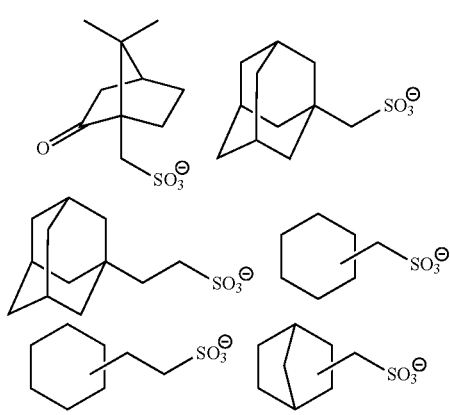

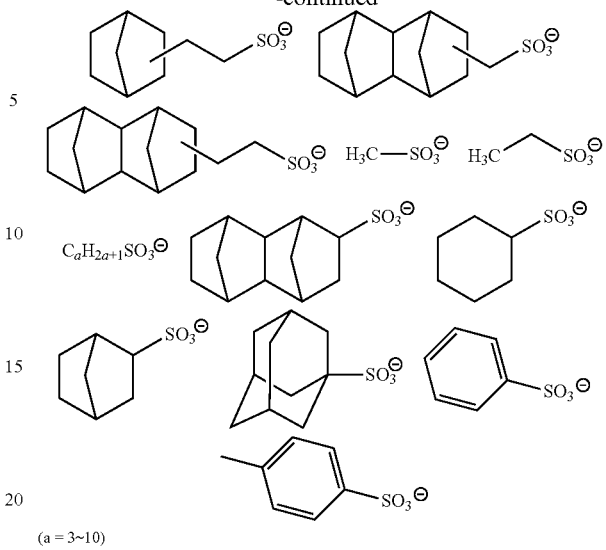

(a = 3~10)

Cation Moiety

In formula (d1-2), $M^{m+}$ is an organic cation having a valency of m, and is the same as defined for $M^{m+}$ in the aforementioned formula (d1-1).

As the component (d1-2), one type of compound may be used, or two or more types of compounds may be used in combination.

{Component (d1-3)}—Anion Moiety

In formula (d1-3), $Rd^3$ represents a cyclic group which may have a substituent, a chain-like alkyl group which may have a substituent or a chain-like alkenyl group which may have a substituent, and is the same groups as those defined above for $R^{101}$, and a cyclic group containing a fluorine atom, a chain-like alkyl group or a chain-like alkenyl group is preferable. Among these, a fluorinated alkyl group is preferable, and more preferably the same fluorinated alkyl groups as those described above for $Rd^1$.

In formula (d1-3), $Rd^4$ represents a cyclic group which may have a substituent, a chain-like alkyl group which may have a substituent or a chain-like alkenyl group which may have a substituent, and is the same groups as those defined above for $R^{101}$.

Among these, an alkyl group which may have substituent, an alkoxy group which may have substituent, an alkenyl group which may have substituent or a cyclic group which may have substituent is preferable.

The alkyl group for $Rd^4$ is preferably a linear or branched alkyl group of 1 to 5 carbon atoms, and specific examples include a methyl group, an ethyl group, a propyl group, an isopropyl group, an n-butyl group, an isobutyl group, a tert-butyl group, a pentyl group, an isopentyl group, and a neopentyl group. Part of the hydrogen atoms within the alkyl group for $Rd^4$ may be substituted with a hydroxy group, a cyano group or the like.

The alkoxy group for $Rd^4$ is preferably an alkoxy group of 1 to 5 carbon atoms, and specific examples thereof include a methoxy group, an ethoxy group, an n-propoxy group, an iso-propoxy group, an n-butoxy group and a tert-butoxy group. Among these, a methoxy group and an ethoxy group are preferable.

As the alkenyl group for $Rd^4$, the same groups as those described above for $R^{101}$ can be mentioned, and a vinyl group, a propenyl group (an allyl group), a 1-methylpropenyl group and a 2-methylpropenyl group are preferable. These groups may have an alkyl group of 1 to 5 carbon atoms or a halogenated alkyl group of 1 to 5 carbon atoms as a substituent.

As the cyclic group for $Rd^4$, the same groups as those described above for $R^{101}$ can be mentioned. Among these, as the cyclic group, an alicyclic group (e.g., a group in which one or more hydrogen atoms have been removed from a cycloalkane such as cyclopentane, cyclohexane, adamantane, norbornane, isobornane, tricyclodecane or tetracyclododecane) or an aromatic group (e.g., a phenyl group or a naphthyl group) is preferable. When $Rd^4$ is an alicyclic group, the resist composition can be satisfactorily dissolved in an organic solvent, thereby improving the lithography properties. Alternatively, when $Rd^4$ is an aromatic group, the resist composition exhibits an excellent photoabsorption efficiency in a lithography process using EUV or the like as the exposure source, thereby resulting in the improvement of the sensitivity and the lithography properties.

In formula (d1-3), $Yd^1$ represents a single bond or a divalent linking group.

The divalent linking group for $Yd^1$ is not particularly limited, and examples thereof include a divalent hydrocarbon group (aliphatic hydrocarbon group, or aromatic hydrocarbon group) which may have a substituent and a divalent linking group containing a hetero atom. As such groups, the same divalent linking groups as those described above for $Ya^{21}$ in the formula (a2-1) can be mentioned.

As $Yd^1$, a carbonyl group, an ester bond, an amide bond, an alkylene group or a combination of these is preferable. As the alkylene group, a linear or branched alkylene group is more preferable, and a methylene group or an ethylene group is still more preferable.

Specific examples of preferable anion moieties for the component (d1-3) are shown below.

[Chemical Formula 54]

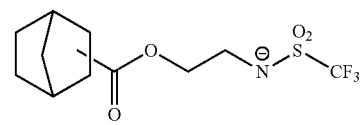
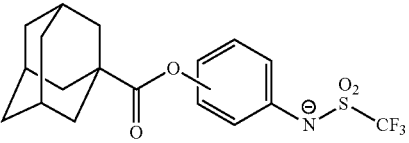
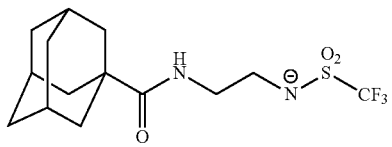
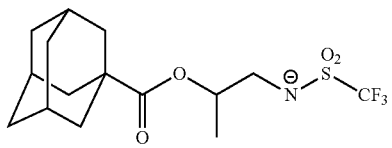
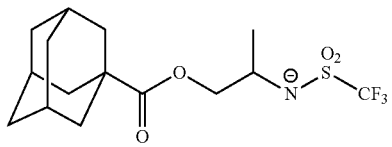
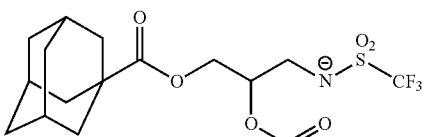

-continued

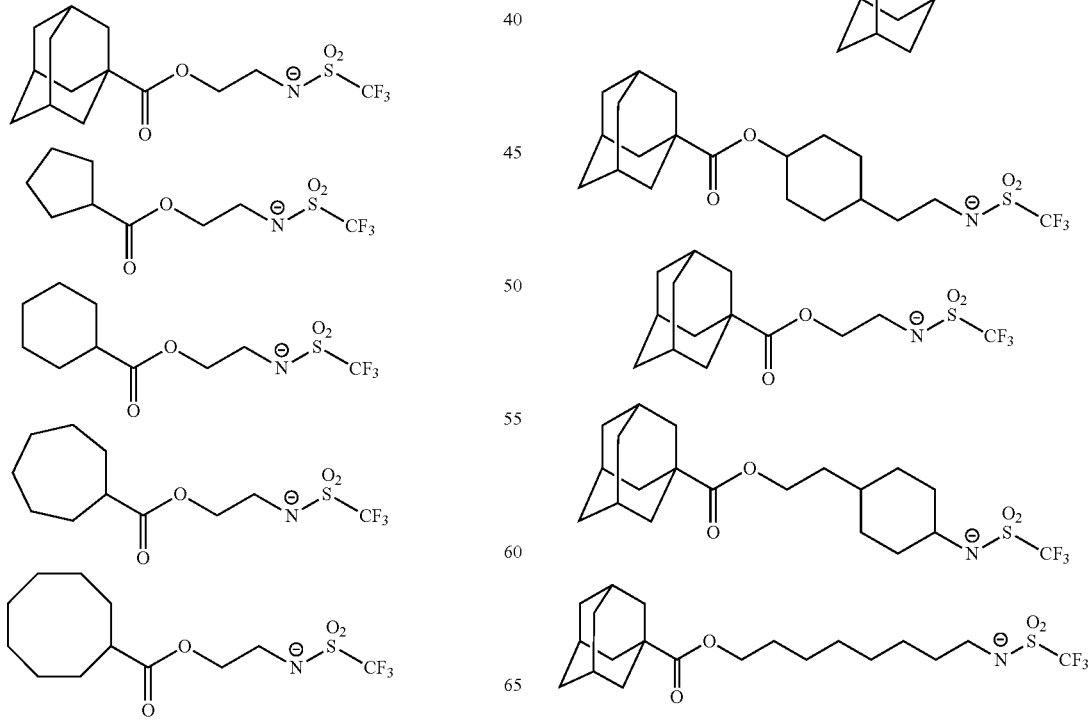

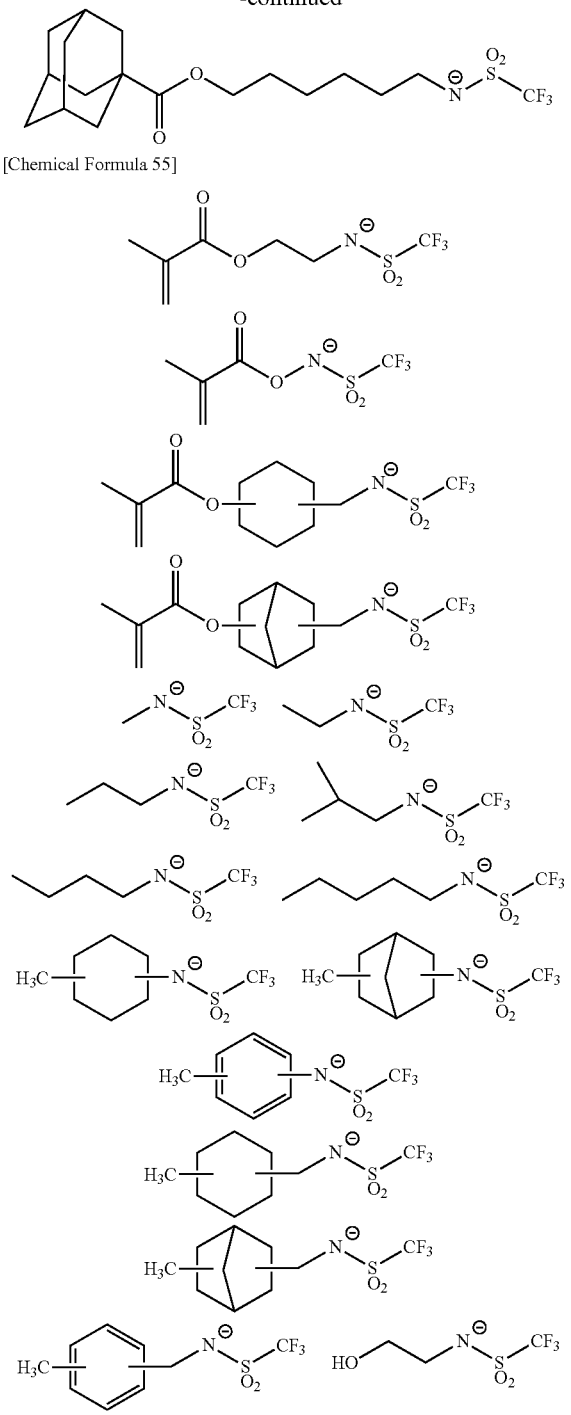

Cation Moiety

In formula (d1-3), $M^{m+}$ is an organic cation having a valency of m, and is the same as defined for $M^{m+}$ in the aforementioned formula (d1-1).

As the component (d1-3), one type of compound may be used, or two or more types of compounds may be used in combination.

As the component (D1), one type of the aforementioned components (d1-1) to (d1-3), or at least two types of the aforementioned components (d1-1) to (d1-3) can be used in combination.

The amount of the component (D1) relative to 100 parts by weight of the component (A) is preferably within a range from 0.5 to 10 parts by weight, more preferably from 0.5 to 8 parts by weight, and still more preferably from 1 to 8 parts by weight.

When the amount of the component (D1) is at least as large as the lower limit of the above-mentioned range, excellent lithography properties and excellent resist pattern shape can be obtained. On the other hand, when the amount of the component (D1) is no more than the upper limit of the above-mentioned range, sensitivity can be maintained at a satisfactory level, and through-put becomes excellent.

The production methods of the components (d1-1) and (d1-2) are not particularly limited, and the components (d1-1) and (d1-2) can be produced by conventional methods.

The amount of the component (D1) relative to 100 parts by weight of the component (A) is preferably within a range from 0.5 to 10.0 parts by weight, more preferably from 0.5 to 8.0 parts by weight, and still more preferably from 1.0 to 8.0 parts by weight. When the amount of at least as large as the lower limit of the above-mentioned range, excellent lithography properties and excellent resist pattern shape can be obtained. On the other hand, when the amount of the component (D) is no more than the upper limit of the above-mentioned range, sensitivity can be maintained at a satisfactory level, and through-put becomes excellent.

(Component (D2))

The component (D) may contain a nitrogen-containing organic compound (D2) (hereafter, referred to as component (D2)) which does not fall under the definition of component (D1).

The component (D2) is not particularly limited, as long as it functions as an acid diffusion control agent, and does not fall under the definition of the component (D1). As the component (D2), any of the conventionally known compounds may be selected for use. Among these, an aliphatic amine, particularly a secondary aliphatic amine or tertiary aliphatic amine is preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group of no more than 12 carbon atoms (i.e., alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly desirable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include aniline, pyridine, 4-dimethylaminopyridine, pyrrole, indole, pyrazole, imidazole and derivatives thereof, as well as diphenylamine, triphenylamine, tribenzylamine, 2,6-diisopropylaniline and N-tert-butoxycarbonylpyrrolidine.

As the component (D2), one type of compound may be used alone, or two or more types may be used in combination.

The component (D2) is typically used in an amount within a range from 0.01 to 5.0 parts by weight, relative to 100 parts by weight of the component (A). When the amount of the component (D) is within the above-mentioned range, the shape of the resist pattern and the post exposure stability of the latent image formed by the pattern-wise exposure of the resist layer are improved.

As the component (D), one type of compound may be used, or two or more types of compounds may be used in combination.

When the resist composition of the present invention contains the component (D), the amount of the component (D) relative to 100 parts by weight of the component (A) is preferably within a range from 0.1 to 15 parts by weight, more preferably from 0.3 to 12 parts by weight, and still more preferably from 0.5 to 12 parts by weight. When the amount of the component (D) is at least as large as the lower limit of the above-mentioned range, various lithography properties (such as LWR) of the resist composition are improved. Further, a resist pattern having an excellent shape can be obtained. On the other hand, when the amount of the component (D) is no more than the upper limit of the above-mentioned range, sensitivity can be maintained at a satisfactory level, and through-put becomes excellent.

<Optional Components>

[Component (E)]

Furthermore, in the resist composition of the present invention, for preventing any deterioration in sensitivity, and improving the resist pattern shape and the post exposure stability of the latent image formed by the pattern-wise exposure of the resist layer, at least one compound (E) (hereafter referred to as the component (E)) selected from the group consisting of an organic carboxylic acid, or a phosphorus oxo acid or derivative thereof can be added.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid and phosphinic acid. Among these, phosphonic acid is particularly desirable.

Examples of oxo acid derivatives include esters in which a hydrogen atom within the above-mentioned oxo acids is substituted with a hydrocarbon group. Examples of the hydrocarbon group include an alkyl group of 1 to 5 carbon atoms and an aryl group of 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate and dibenzyl phosphonate.

Examples of phosphinic acid derivatives include phosphinic acid esters and phenylphosphinic acid.

As the component (E), one type may be used alone, or two or more types may be used in combination.

The component (E) is typically used in an amount within a range from 0.01 to 5.0 parts by weight, relative to 100 parts by weight of the component (A).

[Component (F)]

The resist composition of the present invention may contain a fluorine additive (hereafter, referred to as "component (F)") for imparting water repellency to the resist film.

As the component (F), for example, a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be used.

Specific examples of the component (F) include polymers having a structural unit (f1) represented by general formula (f1-1) shown below. As the polymer, a polymer (homopolymer) consisting of a structural unit (f1) represented by formula (f1-1) shown below; a copolymer of a structural unit (f1) represented by formula (f1-1) shown below and the aforementioned structural unit (a1); and a copolymer of a structural unit (f1) represented by formula (f1-1) shown below, a structural unit derived from acrylic acid or methacrylic acid and the aforementioned structural unit (a1) are preferable. As the structural unit (a1) to be copolymerized with a structural unit (f1) represented by formula (f1-1) shown below, a structural unit derived from 1-ethyl-1-cyclooctyl(meth)acrylate or a structural unit represented by the aforementioned formula (a1-2-01) is preferable.

[Chemical Formula 56]

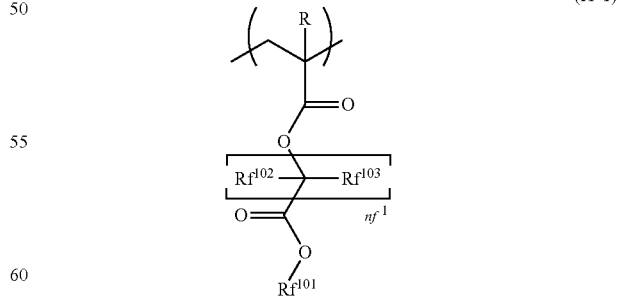

(f1-1)

In the formula, R is the same as defined above; $Rr^{102}$ and $Rf^{103}$ each independently represents a hydrogen atom, a halogen atom, an alkyl group of 1 to 5 carbon atoms, or a halogenated alkyl group of 1 to 5 carbon atoms, provided that $Rf^{102}$ and $Rf^{103}$ may be the same or different; $nf^1$ represents an integer of 1 to 5; and $Rf^{101}$ represents an organic group containing a fluorine atom.

In formula (f1-1), R is the same as defined above. As R, a hydrogen atom or a methyl group is preferable.

In formula (f1-1), examples of the halogen atom for $Rf^{102}$ and $Rf^{103}$ include a fluorine atom, a chlorine atom, a bromine atom and an iodine atom, and a fluorine atom is particularly desirable. Examples of the alkyl group of 1 to 5 carbon atoms for $Rf^{102}$ and $Rf^{103}$ include the same alkyl group of 1 to 5 carbon atoms as those described above for R, and a methyl group or an ethyl group is preferable. Specific examples of the halogenated alkyl group of 1 to 5 carbon atoms represented by $Rf^{102}$ or $Rf^{103}$ include groups in which part or all of the hydrogen atoms of the aforementioned alkyl groups of 1 to 5 carbon atoms have been substituted with halogen atoms. Examples of the halogen atom include a fluorine atom, a chlorine atom, a bromine atom and an iodine atom, and a fluorine atom is particularly desirable. Among these, as $Rf^{102}$ and $Rf^{103}$, a hydrogen atom, a fluorine atom or an alkyl group of 1 to 5 carbon atoms is preferable, and a hydrogen atom, a fluorine atom, a methyl group or an ethyl group is more preferable.

In formula (f1-1), $Rf^1$ represents an integer of 1 to 5, preferably an integer of 1 to 3, and more preferably 1 or 2.

In formula (f1-1), $Rf^{101}$ represents an organic group containing a fluorine atom, and is preferably a hydrocarbon group containing a fluorine atom.

The hydrocarbon group containing a fluorine atom may be linear, branched or cyclic, and preferably has 1 to 20 carbon atoms, more preferably 1 to 15 carbon atoms, and most preferably 1 to 10 carbon atoms.

It is preferable that the hydrocarbon group having a fluorine atom has 25% or more of the hydrogen atoms within the hydrocarbon group fluorinated, more preferably 50% or more, and most preferably 60% or more, as the hydrophobicity of the resist film during immersion exposure is enhanced.

Among these, as $Rf^{101}$, a fluorinated hydrocarbon group of 1 to 5 carbon atoms is preferable, and a methyl group, —$CH_2$—$CF_3$, —$CH_2$—$CF_2$—$CF_3$, —$CH(CF_3)_2$, —$CH_2$—$CH_2$—$CF_3$, and —$CH_2$—$CH_2$—$CF_2$—$CF_2$—$CF_2$—$CF_3$ are most preferable.

The weight average molecular weight (Mw) (the polystyrene equivalent value determined by gel permeation chromatography) of the component (F) is preferably 1,000 to 50,000, more preferably 5,000 to 40,000, and most preferably 10,000 to 30,000. When the weight average molecular weight is no more than the upper limit of the above-mentioned range, the resist composition exhibits a satisfactory solubility in a resist solvent. On the other hand, when the weight average molecular weight is at least as large as the lower limit of the above-mentioned range, dry etching resistance and the cross-sectional shape of the resist pattern becomes satisfactory.

Further, the dispersity (Mw/Mn) of the component (F) is preferably 1.0 to 5.0, more preferably 1.0 to 3.0, and most preferably 1.2 to 2.5.

As the component (F), one type may be used alone, or two or more types may be used in combination.

The component (F) is typically used in an amount within a range from 0.5 to 10 parts by weight, relative to 100 parts by weight of the component (A).

If desired, other miscible additives can also be added to the resist composition of the present invention. Examples of such miscible additives include additive resins for improving the performance of the resist film, dissolution inhibitors, plasticizers, stabilizers, colorants, halation prevention agents, and dyes.

[Component (S)]

The resist composition for immersion exposure according to the present invention can be prepared by dissolving the materials for the resist composition in an organic solvent (hereafter, frequently referred to as "component (S)").

The component (S) may be any organic solvent which can dissolve the respective components to give a uniform solution, and one or more kinds of any organic solvent can be appropriately selected from those which have been conventionally known as solvents for a chemically amplified resist.

Examples thereof include lactones such as γ-butyrolactone; ketones such as acetone, methyl ethyl ketone (MEK), cyclohexanone, methyl-n-pentyl ketone (2-heptanone), and methyl isopentyl ketone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

These solvents can be used individually, or in combination as a mixed solvent.

Among these, PGMEA, PGME, γ-butyrolactone and EL are preferable.

Further, among the mixed solvents, a mixed solvent obtained by mixing PGMEA with a polar solvent is preferable. The mixing ratio (weight ratio) of the mixed solvent can be appropriately determined, taking into consideration the compatibility of the PGMEA with the polar solvent, but is preferably in the range of 1:9 to 9:1, more preferably from 2:8 to 8:2.

Specifically, when EL or cyclohexanone is mixed as the polar solvent, the PGMEA:EL or cyclohexanone weight ratio is preferably from 1:9 to 9:1, and more preferably from 2:8 to 8:2. Alternatively, when PGME is mixed as the polar solvent, the PGMEA:PGME weight ratio is preferably from 1:9 to 9:1, more preferably from 2:8 to 8:2, and still more preferably 3:7 to 7:3.

Further, as the component (S), a mixed solvent of at least one of PGMEA and EL with γ-butyrolactone is also preferable. The mixing ratio (former:latter) of such a mixed solvent is preferably from 70:30 to 95:5.

The amount of the component (S) is not particularly limited, and is appropriately adjusted to a concentration which enables coating of a coating solution to a substrate In general, the organic solvent is used in an amount such that the solid content of the resist composition becomes within the range from 1 to 20% by weight, and preferably from 2 to 15% by weight.

<<Method of Forming a Resist Pattern>>

The method of forming a resist pattern according to a third aspect of the present invention includes: forming a resist film on a substrate using a resist composition of the present invention; conducting exposure of the resist film; and developing the resist film to form a resist pattern.

The method for forming a resist pattern according to the present invention can be performed, for example, as follows.

Firstly, a resist composition of the present invention is applied to a substrate using a spinner or the like, and a bake treatment (post applied bake (PAB)) is conducted at a temperature of 80 to 150° C. for 40 to 120 seconds, preferably 60 to 90 seconds, to form a resist film.

Following selective exposure of the thus formed resist film, either by exposure through a mask having a predetermined pattern formed thereon (mask pattern) using an exposure apparatus such as an ArF exposure apparatus, an electron beam lithography apparatus or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment.

The developing treatment is conducted using an alkali developing solution in the case of an alkali developing process, and a developing solution containing an organic solvent (organic developing solution) in the case of a solvent developing process.

After the developing treatment, it is preferable to conduct a rinse treatment. The rinse treatment is preferably conducted using pure water in the case of an alkali developing process, and a rinse solution containing an organic solvent in the case of a solvent developing process.

In the case of a solvent developing process, after the developing treatment or the rinsing, the developing solution or the rinse liquid remaining on the pattern can be removed by a treatment using a supercritical fluid.

After the developing treatment or the rinse treatment, drying is conducted. If desired, bake treatment (post bake) can be conducted following the developing. In this manner, a resist pattern can be obtained.

The substrate is not specifically limited and a conventionally known substrate can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the substrate, any one of the above-mentioned substrates provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as ArF excimer laser, KrF excimer laser, $F_2$ excimer laser, extreme ultraviolet rays (EUV), vacuum ultraviolet rays (VUV), electron beam (EB), X-rays, and soft X-rays. The resist composition of the present invention is effective to KrF excimer laser, ArF excimer laser, EB and EUV.

The exposure of the resist film can be either a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-mentioned requirements.

Examples of this immersion medium which exhibits a refractive index that is larger than the refractive index of air but smaller than the refractive index of the resist film include water, fluorine-based inert liquids, silicon-based solvents and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, which have a boiling point within a range from 70 to 180° C. and preferably from 80 to 160° C. A fluorine-based inert liquid having a boiling point within the above-mentioned range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly desirable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point 102° C.), and an example of a suitable perfluoroalkylamine compound is perfluorotributylamine (boiling point 174° C.).

As the immersion medium, water is preferable in terms of cost, safety, environment and versatility.

As an example of the alkali developing solution used in an alkali developing process, a 0.1 to 10% by weight aqueous solution of tetramethylammonium hydroxide (TMAH) can be given.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, amide solvents and ether solvents, and hydrocarbon solvents.

If desired, the organic developing solution may have a conventional additive blended. Examples of the additive include surfactants. The surfactant is not particularly limited, and for example, an ionic or non-ionic fluorine and/or silicon surfactant can be used.

When a surfactant is added, the amount thereof based on the total amount of the organic developing solution is generally 0.001 to 5% by weight, preferably 0.005 to 2% by weight, and more preferably 0.01 to 0.5% by weight.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

EXAMPLES

The present invention will be described more specifically with reference to the following examples, although the scope of the present invention is by no way limited by these examples.

Synthesis Example of Polymeric Compound

Synthesis of Polymeric Compound 1

In a separable flask equipped with a thermometer, a reflux tube and a nitrogen-feeding pipe, 14.00 g (82.28 mmol) of a compound (1), 15.00 g (47.41 mmol) of a compound (2), 20.86 g (79.49 mmol) of a compound (3), 6.57 g (39.05 mmol) of a compound (4) and 7.25 g (30.68 mmol) of a compound (5) were dissolved in 80.62 g of methyl ethyl ketone (MEK). To the resulting solution was added 13.95 mmol of dimethyl 2,2'-azobis(isobutyrate) (V-601) as a polymerization initiator, and 1.18 mg of aniline (0.025 mol %, based on the compound (2)) was further added and dissolved to obtain a dripping solution.

The dripping solution was dropwise added to 49.36 g of MEK heated to 80° C. in a nitrogen atmosphere over 4 hours. Thereafter, the reaction solution was heated for 1 hour while stirring, and then cooled to room temperature.

The obtained reaction polymer solution was dropwise added to an excess amount of methanol to deposit a polymer. Thereafter, the precipitated white powder was separated by filtration, followed by washing with methanol and drying, thereby obtaining 50.28 g of a polymeric compound 1 as an objective compound.

With respect to the polymeric compound 1, the weight average molecular weight (Mw) and the dispersity (Mw/Mn) were determined by the polystyrene equivalent value as measured by gel permeation chromatography (GPC). As a result, it was found that the weight average molecular weight was 7,100, and the dispersity was 1.71.

Further, as a result of an analysis by carbon 13 nuclear magnetic resonance spectroscopy (600 MHz, $^{13}$C-NMR), it was found that the composition of the copolymer (ratio (molar ratio) of the respective structural units within the structural formula) was (1)/(2)/(3)/(4)/(5)=34/21/17/15/13.

[Chemical Formula 57]

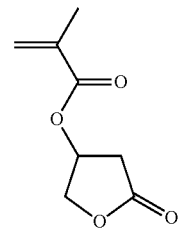

(1)

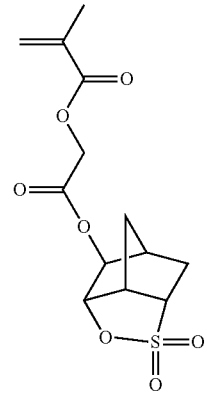

(2)

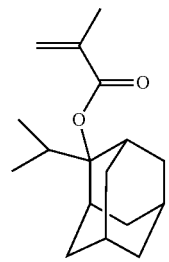

(3)

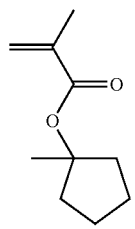

(4)

(5) 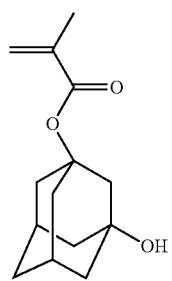
(6) 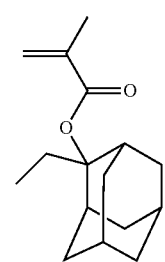
(7) 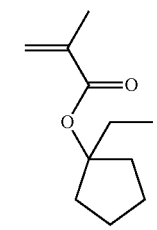
(8) 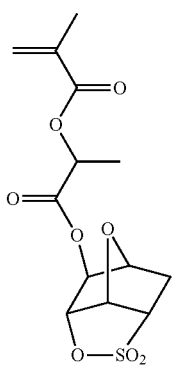
(9) 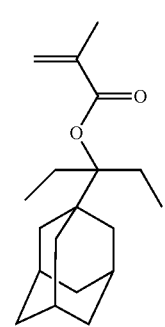
(10) 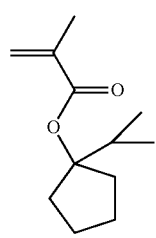
(11) 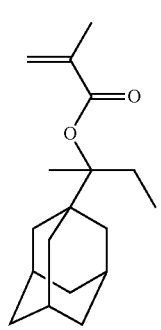
(12) 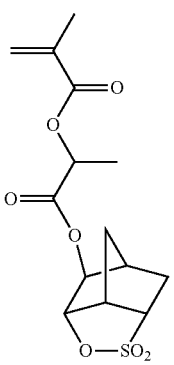
(13) 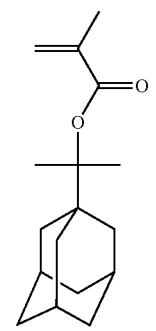
(14) 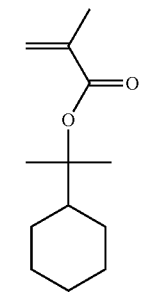

-continued (15)

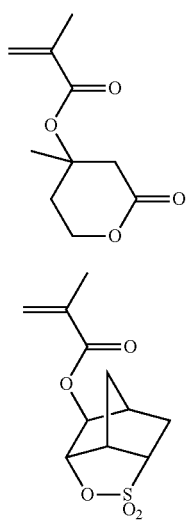

(16)

Polymeric compounds 2 to 12 having the structures shown in Tables 8 and 9 below were synthesized using the following monomers which derive the structural units constituting each polymeric compound in the molar amounts shown in Tables 8 and 9 in the same manner as in Synthesis of Polymeric Compound 1.

TABLE 8

| | | Polymeric compound | | | | | |
|---|---|---|---|---|---|---|---|
| | | 1 | 2 | 3 | 4 | 5 | 6 |
| Monomer | (1) | 34 | | | | 31 | 30 |
| | (2) | 21 | 21 | 21 | | | 20 |
| | (3) | 17 | 17 | | | | |
| | (4) | 15 | 15 | | | | |
| | (5) | 13 | 13 | 13 | 13 | 13 | 10 |
| | (6) | | | 17 | | | |
| | (7) | | | 15 | | | 40 |

TABLE 8-continued

| | | Polymeric compound | | | | | |
|---|---|---|---|---|---|---|---|
| | | 1 | 2 | 3 | 4 | 5 | 6 |
| | (8) | | | | 20 | | 20 |
| | (9) | | | | 19 | | |
| | (10) | | | | 17 | | |
| | (11) | | | | | 35 | |
| | (12) | | | | | | |
| | (13) | | | | | | |
| | (14) | | | | | | |
| | (15) | | 34 | 34 | | | 30 |
| | (16) | | | | | | |
| Mw | | 7100 | 6700 | 6900 | 6900 | 7500 | 7000 |
| Mw/Mn | | 1.71 | 1.76 | 1.67 | 1.67 | 1.68 | 1.74 |

TABLE 9

| | | Polymeric compound | | | | | |
|---|---|---|---|---|---|---|---|
| | | 7 | 8 | 9 | 10 | 11 | 12 |
| Monomer | (1) | | 30 | 34 | | 25 | |
| | (2) | 22 | 20 | 21 | | | |
| | (3) | 15 | | | | 40 | |
| | (4) | 14 | | | | | |
| | (5) | 14 | 15 | 13 | 13 | | 13 |
| | (6) | | 17 | | | | |
| | (7) | | 15 | | | 15 | |
| | (8) | | | | | | |
| | (9) | | | | | | |
| | (10) | | | | | | |
| | (11) | | 35 | | | | |
| | (12) | | | | 21 | | 21 |
| | (13) | | | | 17 | | 17 |
| | (14) | | | | 15 | | 15 |
| | (15) | 35 | | | 34 | | 34 |
| | (16) | | | | | 20 | |
| Mw | | 6800 | 7200 | 6800 | 6500 | 7800 | 6600 |
| Mw/Mn | | 1.73 | 1.7 | 1.75 | 1.7 | 1.64 | 1.73 |

Using the obtained polymeric compounds, resist compositions were produced with the blend ratio shown in Tables 10 to 13 below (Examples 1 to 27 and Comparative Examples 1 to 21).

TABLE 10

| | Component (A) | Component (B) | Component (X) | Component (D) | Component (F) | Component (S)-1 | Component (S)-2 |
|---|---|---|---|---|---|---|---|
| Example 1 | (A)-1 [100] | (B)-1 [10] | (X)-1 [0.31] | (D)-1 [0.1] | (F)-1 [3] | (S)-1 [25] | (S)-2 [2700] |
| Example 2 | (A)-1 [100] | (B)-1 [10] | (X)-1 [0.025] | (D)-1 [0.1] | (F)-1 [3] | (S)-1 [25] | (S)-2 [2700] |
| Example 3 | (A)-1 [100] | (B)-1 [10] | (X)-1 [0.001] | (D)-1 [0.1] | (F)-1 [3] | (S)-1 [25] | (S)-2 [2700] |
| Example 4 | (A)-2 [100] | (B)-1 [10] | (X)-1 [0.31] | (D)-1 [0.1] | (F)-1 [3] | (S)-1 [25] | (S)-2 [2700] |
| Example 5 | (A)-2 [100] | (B)-1 [10] | (X)-1 [0.025] | (D)-1 [0.1] | (F)-1 [3] | (S)-1 [25] | (S)-2 [2700] |
| Example 6 | (A)-2 [100] | (B)-1 [10] | (X)-1 [0.001] | (D)-1 [0.1] | (F)-1 [3] | (S)-1 [25] | (S)-2 [2700] |
| Example 7 | (A)-3 [100] | (B)-1 [10] | (X)-2 [0.31] | (D)-1 [0.1] | (F)-1 [3] | (S)-1 [25] | (S)-2 [2700] |
| Example 8 | (A)-3 [100] | (B)-1 [10] | (X)-2 [0.025] | (D)-1 [0.1] | (F)-1 [3] | (S)-1 [25] | (S)-2 [2700] |
| Example 9 | (A)-3 [100] | (B)-1 [10] | (X)-2 [0.001] | (D)-1 [0.1] | (F)-1 [3] | (S)-1 [25] | (S)-2 [2700] |
| Example 10 | (A)-4 [100] | (B)-1 [10] | (X)-2 [0.31] | (D)-1 [0.1] | (F)-1 [3] | (S)-1 [25] | (S)-2 [2700] |
| Example 11 | (A)-4 [100] | (B)-1 [10] | (X)-2 [0.025] | (D)-1 [0.1] | (F)-1 [3] | (S)-1 [25] | (S)-2 [2700] |
| Example 12 | (A)-4 [100] | (B)-1 [10] | (X)-2 [0.001] | (D)-1 [0.1] | (F)-1 [3] | (S)-1 [25] | (S)-2 [2700] |

TABLE 11

| | Component (A) | Component (B) | Component (X) | Component (D) | Component (F) | Component (S)-1 | Component (S)-2 |
|---|---|---|---|---|---|---|---|
| Example 13 | (A)-5 [100] | (B)-1 [10] | (X)-3 [0.31] | (D)-1 [0.1] | (F)-1 [3] | (S)-1 [25] | (S)-2 [2700] |
| Example 14 | (A)-5 [100] | (B)-1 [10] | (X)-3 [0.025] | (D)-1 [0.1] | (F)-1 [3] | (S)-1 [25] | (S)-2 [2700] |
| Example 15 | (A)-5 [100] | (B)-1 [10] | (X)-3 [0.001] | (D)-1 [0.1] | (F)-1 [3] | (S)-1 [25] | (S)-2 [2700] |
| Example 16 | (A)-6 [100] | (B)-1 [10] | (X)-3 [0.31] | (D)-1 [0.1] | (F)-1 [3] | (S)-1 [25] | (S)-2 [2700] |
| Example 17 | (A)-6 [100] | (B)-1 [10] | (X)-3 [0.025] | (D)-1 [0.1] | (F)-1 [3] | (S)-1 [25] | (S)-2 [2700] |
| Example 18 | (A)-6 [100] | (B)-1 [10] | (X)-3 [0.001] | (D)-1 [0.1] | (F)-1 [3] | (S)-1 [25] | (S)-2 [2700] |
| Example 19 | (A)-9 [100] | (B)-1 [10] | (X)-4 [0.31] | (D)-1 [0.1] | (F)-1 [3] | (S)-1 [25] | (S)-2 [2700] |
| Example 20 | (A)-9 [100] | (B)-1 [10] | (X)-4 [0.025] | (D)-1 [0.1] | (F)-1 [3] | (S)-1 [25] | (S)-2 [2700] |
| Example 21 | (A)-9 [100] | (B)-1 [10] | (X)-4 [0.001] | (D)-1 [0.1] | (F)-1 [3] | (S)-1 [25] | (S)-2 [2700] |
| Example 22 | (A)-10 [100] | (B)-1 [10] | (X)-5 [0.31] | (D)-1 [0.1] | (F)-1 [3] | (S)-1 [25] | (S)-2 [2700] |
| Example 23 | (A)-10 [100] | (B)-1 [10] | (X)-5 [0.025] | (D)-1 [0.1] | (F)-1 [3] | (S)-1 [25] | (S)-2 [2700] |
| Example 24 | (A)-10 [100] | (B)-1 [10] | (X)-5 [0.001] | (D)-1 [0.1] | (F)-1 [3] | (S)-1 [25] | (S)-2 [2700] |
| Example 25 | (A)-11 [100] | (B)-1 [10] | (X)-6 [0.31] | (D)-1 [0.1] | (F)-1 [3] | (S)-1 [25] | (S)-2 [2700] |
| Example 26 | (A)-11 [100] | (B)-1 [10] | (X)-6 [0.025] | (D)-1 [0.1] | (F)-1 [3] | (S)-1 [25] | (S)-2 [2700] |
| Example 27 | (A)-11 [100] | (B)-1 [10] | (X)-6 [0.001] | (D)-1 [0.1] | (F)-1 [3] | (S)-1 [25] | (S)-2 [2700] |

TABLE 12

| | Component (A) | Component (B) | Component (X) | Component (D) | Component (F) | Component (S)-1 | Component (S)-2 |
|---|---|---|---|---|---|---|---|
| Comparative Example 1 | (A)-1 [100] | (B)-1 [10] | — | (D)-1 [0.1] | (F)-1 [3] | (S)-1 [25] | (S)-2 [2700] |
| Comparative Example 2 | (A)-2 [100] | (B)-1 [10] | — | (D)-1 [0.1] | (F)-1 [3] | (S)-1 [25] | (S)-2 [2700] |
| Comparative Example 3 | (A)-3 [100] | (B)-1 [10] | — | (D)-1 [0.1] | (F)-1 [3] | (S)-1 [25] | (S)-2 [2700] |
| Comparative Example 4 | (A)-4 [100] | (B)-1 [10] | — | (D)-1 [0.1] | (F)-1 [3] | (S)-1 [25] | (S)-2 [2700] |
| Comparative Example 5 | (A)-5 [100] | (B)-1 [10] | — | (D)-1 [0.1] | (F)-1 [3] | (S)-1 [25] | (S)-2 [2700] |
| Comparative Example 6 | (A)-6 [100] | (B)-1 [10] | — | (D)-1 [0.1] | (F)-1 [3] | (S)-1 [25] | (S)-2 [2700] |
| Comparative Example 7 | (A)-7 [100] | (B)-1 [10] | (X)-7 [0.31] | (D)-1 [0.1] | (F)-1 [3] | (S)-1 [25] | (S)-2 [2700] |
| Comparative Example 8 | (A)-7 [100] | (B)-1 [10] | (X)-7 [0.025] | (D)-1 [0.1] | (F)-1 [3] | (S)-1 [25] | (S)-2 [2700] |
| Comparative Example 9 | (A)-7 [100] | (B)-1 [10] | (X)-7 [0.001] | (D)-1 [0.1] | (F)-1 [3] | (S)-1 [25] | (S)-2 [2700] |
| Comparative Example 10 | (A)-7 [100] | (B)-1 [10] | — | (D)-1 [0.1] | (F)-1 [3] | (S)-1 [25] | (S)-2 [2700] |
| Comparative Example 11 | (A)-8 [100] | (B)-1 [10] | (X)-7 [0.31] | (D)-1 [0.1] | (F)-1 [3] | (S)-1 [25] | (S)-2 [2700] |
| Comparative Example 12 | (A)-8 [100] | (B)-1 [10] | (X)-7 [0.025] | (D)-1 [0.1] | (F)-1 [3] | (S)-1 [25] | (S)-2 [2700] |
| Comparative Example 13 | (A)-8 [100] | (B)-1 [10] | (X)-7 [0.001] | (D)-1 [0.1] | (F)-1 [3] | (S)-1 [25] | (S)-2 [2700] |
| Comparative Example 14 | (A)-8 [100] | (B)-1 [10] | — | (D)-1 [0.1] | (F)-1 [3] | (S)-1 [25] | (S)-2 [2700] |

TABLE 13

| | Component (A) | Component (B) | Component (X) | Component (D) | Component (F) | Component (S)-1 | Component (S)-2 |
|---|---|---|---|---|---|---|---|
| Comparative Example 15 | (A)-9 [100] | (B)-1 [10] | — | (D)-1 [0.1] | (F)-1 [3] | (S)-1 [25] | (S)-2 [2700] |

TABLE 13-continued

| | Component (A) | Component (B) | Component (X) | Component (D) | Component (F) | Component (S)-1 | Component (S)-2 |
|---|---|---|---|---|---|---|---|
| Comparative Example 16 | (A)-10 [100] | (B)-1 [10] | — | (D)-1 [0.1] | (F)-1 [3] | (S)-1 [25] | (S)-2 [2700] |
| Comparative Example 17 | (A)-11 [100] | (B)-1 [10] | — | (D)-1 [0.1] | (F)-1 [3] | (S)-1 [25] | (S)-2 [2700] |
| Comparative Example 18 | (A)-12 [100] | (B)-1 [10] | (X)-8 [0.31] | (D)-1 [0.1] | (F)-1 [3] | (S)-1 [25] | (S)-2 [2700] |
| Comparative Example 19 | (A)-12 [100] | (B)-1 [10] | (X)-8 [0.025] | (D)-1 [0.1] | (F)-1 [3] | (S)-1 [25] | (S)-2 [2700] |
| Comparative Example 20 | (A)-12 [100] | (B)-1 [10] | (X)-8 [0.001] | (D)-1 [0.1] | (F)-1 [3] | (S)-1 [25] | (S)-2 [2700] |
| Comparative Example 21 | (A)-12 [100] | (B)-1 [10] | — | (D)-1 [0.1] | (F)-1 [3] | (S)-1 [25] | (S)-2 [2700] |

In Tables 10 to 13, the reference characters indicate the following. Further, the values in brackets [ ] indicate the amount (in terms of parts by weight) of the component added.

(A)-1 to (A)-12: Polymeric compounds 1 to 12
(B)-1: Compound (B)-1
(X)-1: Aniline (pKa: 4.61)
(X)-2: 2,6-lutidine (pKa: 6.67)
(X)-3: Pyridine (pKa: 5.25)
(X)-4: 2,6-Diisopropylaniline (pKa: 4.25)
(X)-5: Triazine (pKa: 2.07)
(X)-6: Pyrazine (pKa: 1.22)
(X)-7: Triethylamine (pKa: 10.75)
(X)-8: Tri-n-pentylamine (pKa: 10.00)
(D)-1: Tri-n-pentylamine
(F)-1: polymeric compound (F)-1 shown below (molar ratio: 1/m=77/23, Mw=23,100; Mw/Mn=1.78)
(S)-1: γ-butyrolactone
(S)-2: a mixed solvent of PGMEA/PGME/cyclohexanone=45/30/25 (weight ratio)

[Chemical Formula 58]

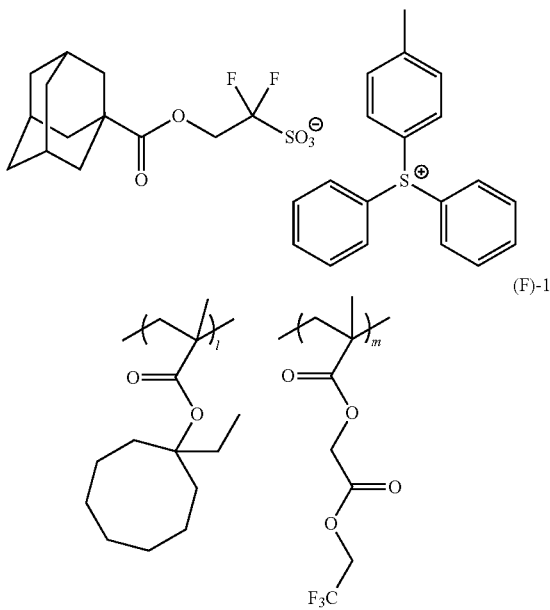

<Formation of Resist Pattern>

An organic anti-reflection film composition (product name: ARC29A, manufactured by Brewer Science Ltd.) was applied to an 12-inch silicon wafer using a spinner, and the composition was then baked at 205° C. for 60 seconds, thereby forming an organic anti-reflection film having a film thickness of 89 nm.

Each of the resist compositions of Examples 1 to 27 and Comparative Examples 1 to 21 was then applied to the organic anti-reflection film using a spinner, and was then prebaked (PAB) and dried on a hotplate at a temperature indicated in Tables 14 to 17 for 60 seconds, thus forming a resist film having a film thickness of 80 nm.

Subsequently, the resist film was selectively irradiated with an ArF excimer laser (193 nm) through a 6% halftone mask, using an ArF exposure apparatus NSR-S609B (manufactured by Nikon Corporation; NA (numerical aperture)=1.07; Crosspole).

Next, a post exposure bake (PEB) treatment was conducted at a temperature indicated in Tables 14 to 17 for 60 seconds, followed by alkali development for 10 seconds at 23° C. in a 2.38% by weight aqueous tetramethylammonium hydroxide (TMAH) solution. Then, the resist was washed for 15 seconds with pure water, followed by drying by shaking. Further, a post bake was conducted at 100° C. for 45 seconds.

As a result, in each of the examples, a line and space pattern (LS pattern) having a line width of 45 nm and a pitch of 100 nm was formed.

[Evaluation of Number of Defects]

With respect to the obtained LS pattern, the total number of defects within the wafer (total number of defects) was determined using a surface defect observation apparatus (product name: KLA2371; manufactured by KLA-TENCOR CORPORATION). For each example, 2 wafers were measured, and an average value of the measured values was determined as the number of defects.

The results are shown in Tables 14 to 17.

[Evaluation of Mask Error Factor (MEEF)]

In accordance with the same procedure as in the formation of the LS pattern, an LS pattern having a pitch of 98 nm was formed with the same exposure dose and using a mask pattern in which the target size of the line pattern was 45 to 54 nm (10 target sizes at intervals of 1 nm). The value of the mask error factor was determined as the gradient of a graph obtained by plotting the target size (nm) on the horizontal axis, and the actual size (nm) of the line pattern formed on the resist film using each mask pattern on the vertical axis. A MEEF value (gradient of the plotted line) closer to 1 indicates that a resist pattern faithful to the mask pattern was formed.

The results are shown in Tables 14 to 17.

[Evaluation of Line Width Roughness (LWR)]

With respect to each of the above LS patterns, the space width at 400 points in the lengthwise direction of the space were measured using a measuring scanning electron microscope (SEM) (product name: S-9380, manufactured by Hitachi High-Technologies Corporation; acceleration voltage: 300V). From the results, the value of 3 times the standard deviation s (i.e., 3s) was determined, and the average of the 3s values at 400 points was calculated as a yardstick of LWR. The results are shown in Tables 14 to 17.

The smaller this 3s value is, the lower the level of roughness of the line width, indicating that a LS pattern with a uniform width was obtained.

TABLE 14

|  | PAB/PEB (° C.) | MEEF | LWR | Number of Defects |
| --- | --- | --- | --- | --- |
| Example 1 | 110/95 | 3.7 | 5.2 | 21 |
| Example 2 | 110/95 | 3.6 | 5 | 18 |
| Example 3 | 110/95 | 3.9 | 5.3 | 26 |
| Example 4 | 110/95 | 3.9 | 5.1 | 19 |
| Example 5 | 110/95 | 3.5 | 5 | 20 |
| Example 6 | 110/95 | 3.7 | 5.4 | 29 |
| Example 7 | 110/100 | 3.8 | 5.3 | 18 |
| Example 8 | 110/100 | 3.7 | 5.2 | 20 |
| Example 9 | 110/100 | 3.9 | 5.5 | 24 |
| Example 10 | 95/85 | 3.8 | 5.2 | 21 |
| Example 11 | 95/85 | 3.6 | 5.5 | 17 |
| Example 12 | 95/85 | 3.8 | 5.6 | 24 |

TABLE 15

|  | PAB/PEB (° C.) | MEEF | LWR | Number of Defects |
| --- | --- | --- | --- | --- |
| Example 13 | 90/80 | 3.8 | 5.4 | 25 |
| Example 14 | 90/80 | 3.6 | 5.2 | 21 |
| Example 15 | 90/80 | 3.7 | 5.5 | 26 |
| Example 16 | 100/90 | 3.4 | 5.2 | 24 |
| Example 17 | 100/90 | 3.6 | 5.2 | 19 |
| Example 18 | 100/90 | 3.7 | 5.4 | 22 |
| Example 19 | 110/100 | 3.6 | 5.1 | 23 |
| Example 20 | 110/100 | 3.4 | 5 | 18 |
| Example 21 | 110/100 | 3.8 | 5.2 | 25 |
| Example 22 | 110/105 | 3.8 | 5.3 | 24 |
| Example 23 | 110/105 | 3.3 | 5 | 19 |
| Example 24 | 110/105 | 3.6 | 5.3 | 26 |
| Example 25 | 100/90 | 3.5 | 5.1 | 19 |
| Example 26 | 100/90 | 3.3 | 5 | 22 |
| Example 27 | 100/90 | 3.7 | 5.3 | 25 |

TABLE 16

|  | PAB/PEB (° C.) | MEEF | LWR | Number of Defects |
| --- | --- | --- | --- | --- |
| Comparative Example 1 | 110/95 | 4.5 | 6.2 | 56 |
| Comparative Example 2 | 110/95 | 4.2 | 6.5 | 54 |
| Comparative Example 3 | 110/100 | 5.8 | 6.3 | 59 |
| Comparative Example 4 | 95/85 | 4.3 | 6.3 | 56 |
| Comparative Example 5 | 90/80 | 4.6 | 6.4 | 56 |
| Comparative Example 6 | 100/90 | 4.9 | 6.3 | 53 |

TABLE 16-continued

|  | PAB/PEB (° C.) | MEEF | LWR | Number of Defects |
| --- | --- | --- | --- | --- |
| Comparative Example 7 | 110/95 | 4.5 | 6.8 | 54 |
| Comparative Example 8 | 110/95 | 4.6 | 6.3 | 59 |
| Comparative Example 9 | 110/95 | 4.8 | 6.4 | 54 |
| Comparative Example 10 | 110/95 | 4.5 | 6.2 | 65 |
| Comparative Example 11 | 90/80 | 4.6 | 6.4 | 56 |
| Comparative Example 12 | 90/80 | 4.6 | 6.3 | 52 |
| Comparative Example 13 | 90/80 | 4.8 | 6.7 | 55 |
| Comparative Example 14 | 90/80 | 4.7 | 6.7 | 53 |

TABLE 17

|  | PAB/PEB (° C.) | MEEF | LWR | Number of Defects |
| --- | --- | --- | --- | --- |
| Comparative Example 15 | 110/100 | 4.6 | 6.1 | 59 |
| Comparative Example 16 | 110/105 | 4.5 | 6.4 | 55 |
| Comparative Example 17 | 100/90 | 5.7 | 6.1 | 67 |
| Comparative Example 18 | 110/105 | 4.7 | 6.5 | 55 |
| Comparative Example 19 | 110/105 | 4.9 | 6.1 | 53 |
| Comparative Example 20 | 110/105 | 4.8 | 6.3 | 57 |
| Comparative Example 21 | 110/105 | 4.8 | 6.5 | 58 |

From the results shown above, it was confirmed that the resist composition of the present invention exhibited excellent MEEF and LWR, and the number of defects was small, as compared to the comparative examples.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A method of producing a copolymer, comprising:
    copolymerizing a monomer (am0) containing a partial structure represented by formula (am0-1) shown below, a monomer (am1) containing an acid decomposable group which exhibits increased polarity by the action of acid and a monomer (am5) containing an —$SO_2$— containing cyclic group in the presence of a nitrogen-containing compound (X) having a conjugated acid with an acid dissociation constant of less than 10:

123

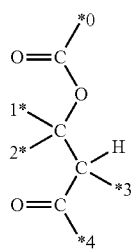

(am0-1)

wherein *0 to *4 each represents a valence bond.

2. The method according to claim 1, wherein the monomer (am0) is a monomer containing a partial structure represented by general formula (am0-2) shown below:

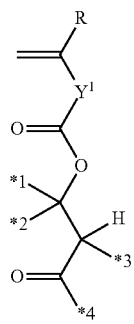

(am0-2)

wherein R represents a hydrogen atom, an alkyl group of 1 to 5 carbon atoms or a halogenated alkyl group of 1 to 5 carbon atoms; $Y^1$ represents a single bond or a divalent linking group; *1 to *4 each represents a valence bond.

3. The method according to claim 1, wherein the monomer (am0) is a monomer represented by general formula (am0-2-1) or (am0-2-2) shown below:

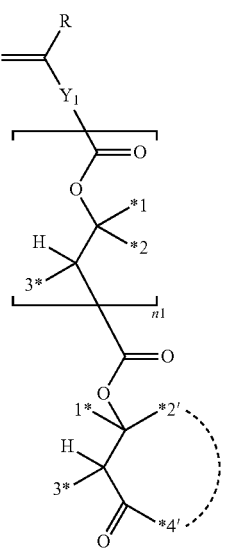

(am0-2-1)

124

-continued

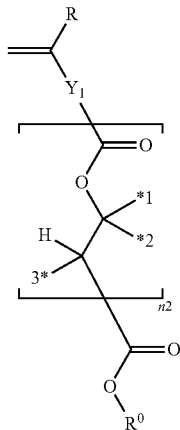

(am0-2-2)

wherein R represents a hydrogen atom, an alkyl group of 1 to 5 carbon atoms or a halogenated alkyl group of 1 to 5 carbon atoms; $Y^1$ represents a single bond or a divalent linking group; *2' and *4' represent valence bonds which are mutually bonded to form a ring; $R^0$ represents a hydrogen atom, an alkyl group, an acid dissociable group, a lactone-containing cyclic group, a carbonate-containing cyclic group, a polar group-containing aliphatic hydrocarbon group or an acid non-dissociable cyclic group; n1 represents 0 or 1; and n2 represents 1 or 2.

4. The method according to claim 3, wherein *2' and *4' represent valence bonds which are mutually bonded via an alkylene group which may have a substituent, so as to form a monocyclic group.

5. The method according to claim 4, wherein the monocyclic group has 4 to 8 atoms.

6. The method according to claim 4, wherein the substituent is an oxygen atom.

7. The method according to claim 1, wherein the nitrogen-containing compound (X) is at least one compound selected from the group consisting of a compound represented by general formula (X1) shown below and a compound represented by general formula (X2) shown below:

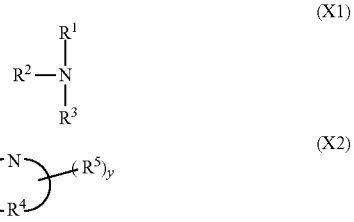

wherein $R^1$ to $R^3$ each independently represents a hydrogen atom, an alkyl group of 1 to 15 carbon atoms which may have a substituent, a fluorinated alkyl group which may have a substituent or an aryl group, provided that two of $R^1$ to $R^3$ may be mutually bonded to form a ring, and at least one of $R^1$ to $R^3$ represents a fluorinated alkyl group, an aryl group or an aryl group containing a fluorine atom; $R^4$ is a group which forms an aromatic ring with the nitrogen atom bonded to the $R^4$ group; $R^5$ represents an alkyl group of 1 to 15 carbon atoms which may have a substituent, a halogen atom or an aryl group; and y represents an integer of 0 to 5.

8. The method according to claim 7, wherein, in general formula (X1), at least one of $R^1$ to $R^3$ represents an aryl group or an aryl group containing a fluorine atom, and in general formula (X2), $R^4$ is a group which forms a pyridine ring, a pyrimidine ring, an azepine ring, a pyrazine ring, a quinoline ring, a benzoquinoline ring, an oxazole ring or an isooxazole ring with the nitrogen atom bonded to the $R^4$ group.

9. The method according to claim 2, wherein the nitrogen-containing compound (X) is at least one compound selected from the group consisting of a compound represented by general formula (X1) shown below and a compound represented by general formula (X2) shown below:

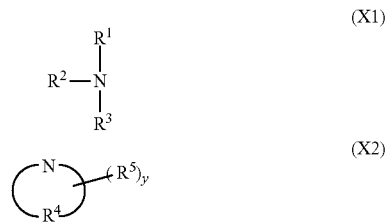

wherein $R^1$ to $R^3$ each independently represents a hydrogen atom, an alkyl group of 1 to 15 carbon atoms which may have a substituent, a fluorinated alkyl group which may have a substituent or an aryl group, provided that two of $R^1$ to $R^3$ may be mutually bonded to form a ring, and at least one of $R^1$ to $R^3$ represents a fluorinated alkyl group, an aryl group or an aryl group containing a fluorine atom; $R^4$ is a group which forms an aromatic ring with the nitrogen atom bonded to the $R^4$ group; $R^5$ represents an alkyl group of 1 to 15 carbon atoms which may have a substituent, a halogen atom or an aryl group; and y represents an integer of 0 to 5.

10. The method according to claim 9, wherein in general formula (X1), at least one of $R^1$ to $R^3$ represents an aryl group or an aryl group containing a fluorine atom, and in general formula (X2), $R^4$ is a group which forms a pyridine ring, a pyrimidine ring, an azepine ring, a pyrazine ring, a quinoline ring, a benzoquinoline ring, an oxazole ring or an isooxazole ring with the nitrogen atom bonded to the $R^4$ group.

11. The method according to claim 3, wherein the nitrogen-containing compound (X) is at least one compound selected from the group consisting of a compound represented by general formula (X1) shown below and a compound represented by general formula (X2) shown below:

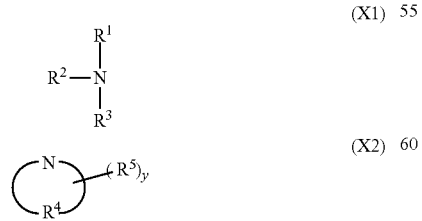

wherein $R^1$ to $R^3$ each independently represents a hydrogen atom, an alkyl group of 1 to 15 carbon atoms which may have a substituent, a fluorinated alkyl group which may have a substituent or an aryl group, provided that two of $R^1$ to $R^3$ may be mutually bonded to form a ring, and at least one of $R^1$ to $R^3$ represents a fluorinated alkyl group, an aryl group or an aryl group containing a fluorine atom; $R^4$ is a group which forms an aromatic ring with the nitrogen atom bonded to the $R^4$ group; $R^5$ represents an alkyl group of 1 to 15 carbon atoms which may have a substituent, a halogen atom or an aryl group; and y represents an integer of 0 to 5.

12. The method according to claim 11, wherein in general formula (X1), at least one of $R^1$ to $R^3$ represents an aryl group or an aryl group containing a fluorine atom, and in general formula (X2), $R^4$ is a group which forms a pyridine ring, a pyrimidine ring, an azepine ring, a pyrazine ring, a quinoline ring, a benzoquinoline ring, an oxazole ring or an isooxazole ring with the nitrogen atom bonded to the $R^4$ group.

13. The method according to claim 4, wherein the nitrogen-containing compound (X) is at least one compound selected from the group consisting of a compound represented by general formula (X1) shown below and a compound represented by general formula (X2) shown below:

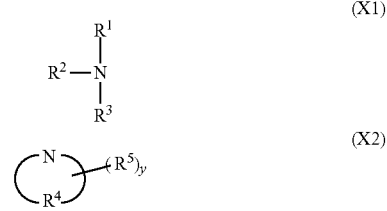

wherein $R^1$ to $R^3$ each independently represents a hydrogen atom, an alkyl group of 1 to 15 carbon atoms which may have a substituent, a fluorinated alkyl group which may have a substituent or an aryl group, provided that two of $R^1$ to $R^3$ may be mutually bonded to form a ring, and at least one of $R^1$ to $R^3$ represents a fluorinated alkyl group, an aryl group or an aryl group containing a fluorine atom; $R^4$ is a group which forms an aromatic ring with the nitrogen atom bonded to the $R^4$ group; $R^5$ represents an alkyl group of 1 to 15 carbon atoms which may have a substituent, a halogen atom or an aryl group; and y represents an integer of 0 to 5.

14. The method according to claim 13, wherein in general formula (X1), at least one of $R^1$ to $R^3$ represents an aryl group or an aryl group containing a fluorine atom, and in general formula (X2), $R^4$ is a group which forms a pyridine ring, a pyrimidine ring, an azepine ring, a pyrazine ring, a quinoline ring, a benzoquinoline ring, an oxazole ring or an isooxazole ring with the nitrogen atom bonded to the $R^4$ group.

15. The method according to claim 5, wherein the nitrogen-containing compound (X) is at least one compound selected from the group consisting of a compound represented by general formula (X1) shown below and a compound represented by general formula (X2) shown below:

-continued

(X2)

wherein $R^1$ to $R^3$ each independently represents a hydrogen atom, an alkyl group of 1 to 15 carbon atoms which may have a substituent, a fluorinated alkyl group which may have a substituent or an aryl group, provided that two of $R^1$ to $R^3$ may be mutually bonded to form a ring, and at least one of $R^1$ to $R^3$ represents a fluorinated alkyl group, an aryl group or an aryl group containing a fluorine atom; $R^4$ is a group which forms an aromatic ring with the nitrogen atom bonded to the $R^4$ group; $R^5$ represents an alkyl group of 1 to 15 carbon atoms which may have a substituent, a halogen atom or an aryl group; and y represents an integer of 0 to 5.

16. The method according to claim 15, wherein in general formula (X1), at least one of $R^1$ to $R^3$ represents an aryl group or an aryl group containing a fluorine atom, and in general formula (X2), $R^4$ is a group which forms a pyridine ring, a pyrimidine ring, an azepine ring, a pyrazine ring, a quinoline ring, a benzoquinoline ring, an oxazole ring or an isooxazole ring with the nitrogen atom bonded to the $R^4$ group.

17. The method according to claim 1, wherein the monomer (am5) containing an —$SO_2$— containing cyclic group is a monomer represented by general formula (am5-1) shown below:

(am5-1)

wherein R represents a hydrogen atom, an alkyl group of 1 to 5 carbon atoms or a halogenated alkyl group of 1 to 5 carbon atoms; $Ya^{51}$ represents a single bond or a divalent linking group; $La^{51}$ represents —O—, —COO—, —CON(R')—, —OCO—, —CONHCO— or —CONHCS—; R' represents a hydrogen atom or a methyl group; provided that, when $La^{51}$ represents —O—, $Ya^{51}$ does not represent —CO—; and $Ra^{51}$ represents an —$SO_2$— containing cyclic group.

* * * * *